(12) United States Patent
Yamazaki et al.

(10) Patent No.: US 10,153,346 B2
(45) Date of Patent: Dec. 11, 2018

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Setagaya (JP); Kengo Akimoto, Atsugi (JP); Yusuke Nonaka, Atsugi (JP); Hiroshi Kanemura, Tochigi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 15/079,156

(22) Filed: Mar. 24, 2016

(65) Prior Publication Data

US 2016/0204271 A1    Jul. 14, 2016

Related U.S. Application Data

(62) Division of application No. 13/710,867, filed on Dec. 11, 2012, now Pat. No. 9,331,156.

(30) Foreign Application Priority Data

Dec. 15, 2011   (JP) .................................. 2011-274919

(51) Int. Cl.
*H01L 29/24* (2006.01)
*H01L 29/04* (2006.01)
(Continued)

(52) U.S. Cl.
CPC ...... *H01L 29/247* (2013.01); *H01L 21/02422* (2013.01); *H01L 21/02554* (2013.01);
(Continued)

(58) Field of Classification Search
CPC ............. H01L 27/1214; H01L 27/1251; H01L 27/3244–27/3297; H01L 29/4908;
(Continued)

(56) References Cited

U.S. PATENT DOCUMENTS

| 5,731,856 A | 3/1998 | Kim et al. |
|---|---|---|
| 5,744,864 A | 4/1998 | Cillessen et al. |

(Continued)

FOREIGN PATENT DOCUMENTS

| CN | 101258607 A | 9/2008 |
|---|---|---|
| CN | 101309863 A | 11/2008 |

(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Cuong B Nguyen
(74) *Attorney, Agent, or Firm* — Robinson Intellectual Property Law Office; Eric J. Robinson

(57) ABSTRACT

To manufacture a highly reliable semiconductor device by giving stable electric characteristics to a transistor. An oxide semiconductor film is deposited by a sputtering method with the use of a polycrystalline sputtering target. In that case, partial pressure of water in a deposition chamber before or in the deposition is set to be lower than or equal to $10^{-3}$ Pa, preferably lower than or equal to $10^{-4}$ Pa, more preferably lower than or equal to $10^{-5}$ Pa. Thus, a dense oxide semiconductor film is obtained. The density of the oxide semiconductor film is higher than 6.0 g/cm³ and lower than 6.375 g/cm³.

18 Claims, 22 Drawing Sheets

(51) Int. Cl.
*H01L 29/786* (2006.01)
*H01L 21/02* (2006.01)
*H01L 27/12* (2006.01)

(52) U.S. Cl.
CPC .. *H01L 21/02565* (2013.01); *H01L 21/02631* (2013.01); *H01L 29/04* (2013.01); *H01L 29/045* (2013.01); *H01L 29/24* (2013.01); *H01L 29/7869* (2013.01); *H01L 29/78606* (2013.01); *H01L 29/78696* (2013.01); *H01L 27/1225* (2013.01)

(58) Field of Classification Search
CPC .. H01L 51/0508–51/0533; H01L 2924/13069; H01L 29/41733; H01L 29/42384; H01L 29/66265; H01L 29/66742–29/6675; H01L 29/7317; H01L 29/786; H01L 29/247
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,935,582 B2 | 5/2011 | Iwasaki |
| 7,956,361 B2 | 6/2011 | Iwasaki |
| 7,998,372 B2 | 8/2011 | Yano et al. |
| 8,154,017 B2 | 4/2012 | Yabuta et al. |
| 8,154,024 B2 | 4/2012 | Iwasaki |
| 8,164,256 B2 | 4/2012 | Sano et al. |
| 8,222,158 B2 | 7/2012 | Mochizuki et al. |
| 8,362,538 B2 | 1/2013 | Koyama et al. |
| 8,384,077 B2 | 2/2013 | Yano et al. |
| 8,421,069 B2 | 4/2013 | Yamazaki et al. |
| 8,518,755 B2 | 8/2013 | Yamazaki et al. |
| 8,618,586 B2 | 12/2013 | Koyama et al. |
| 8,642,402 B2 | 2/2014 | Yano et al. |
| 8,664,036 B2 | 3/2014 | Yamazaki et al. |
| 8,748,215 B2 | 6/2014 | Yamazaki |
| 8,809,850 B2 | 8/2014 | Yamazaki |
| 8,866,984 B2 | 10/2014 | Yamazaki |
| 8,901,559 B2 | 12/2014 | Yamazaki |
| 9,093,328 B2 | 7/2015 | Yamazaki et al. |
| 9,117,732 B2 | 8/2015 | Yamazaki |
| 9,269,571 B2 | 2/2016 | Yamazaki et al. |
| 9,407,269 B2 | 8/2016 | Koyama et al. |
| 9,673,337 B2 | 6/2017 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0115219 A1 | 5/2007 | Inoue |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134389 A1 | 5/2009 | Matsunaga |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0237000 A1 | 9/2009 | Inoue |
| 2009/0278122 A1 | 11/2009 | Hosono et al. |
| 2009/0280600 A1 | 11/2009 | Hosono et al. |
| 2010/0044703 A1 | 2/2010 | Yabuta et al. |
| 2010/0051949 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163860 A1 | 7/2010 | Yano et al. |
| 2010/0276689 A1 | 11/2010 | Iwasaki |
| 2010/0279462 A1 | 11/2010 | Iwasaki |
| 2010/0289020 A1 | 11/2010 | Yano et al. |
| 2011/0062436 A1 | 3/2011 | Yamazaki et al. |
| 2011/0215325 A1 | 9/2011 | Yamazaki et al. |
| 2011/0215331 A1 | 9/2011 | Yamazaki et al. |

(56) References Cited

U.S. PATENT DOCUMENTS

| | | | |
|---|---|---|---|
| 2011/0240998 A1* | 10/2011 | Morosawa | H01L 29/41733 257/57 |
| 2011/0284848 A1 | 11/2011 | Yamazaki | |
| 2012/0001167 A1* | 1/2012 | Morosawa | H01L 29/7869 257/43 |
| 2012/0103804 A1 | 5/2012 | Ikisawa et al. | |
| 2012/0146021 A1 | 6/2012 | Yabuta et al. | |
| 2012/0256179 A1 | 10/2012 | Yamazaki et al. | |
| 2013/0082218 A1 | 4/2013 | Ebata et al. | |
| 2013/0082253 A1 | 4/2013 | Yamazaki et al. | |
| 2013/0099231 A1 | 4/2013 | Tochibayashi et al. | |
| 2013/0140553 A1 | 6/2013 | Yamazaki et al. | |
| 2014/0099752 A1 | 4/2014 | Yamazaki et al. | |
| 2014/0332806 A1 | 11/2014 | Yamazaki | |
| 2014/0349443 A1 | 11/2014 | Yamazaki | |
| 2015/0333090 A1 | 11/2015 | Yamazaki et al. | |
| 2015/0364501 A1 | 12/2015 | Yamazaki | |
| 2017/0263777 A1 | 9/2017 | Yamazaki et al. | |
| 2017/0271377 A1 | 9/2017 | Yamazaki | |

FOREIGN PATENT DOCUMENTS

| | | |
|---|---|---|
| CN | 101669208 A | 3/2010 |
| CN | 101859711 A | 10/2010 |
| CN | 101897031 A | 11/2010 |
| CN | 102496577 A | 6/2012 |
| EP | 1737044 A | 12/2006 |
| EP | 2159845 A | 3/2010 |
| EP | 2226847 A | 9/2010 |
| EP | 2339639 A | 6/2011 |
| EP | 2544237 A | 1/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-103918 A | 4/2007 |
| JP | 2007-123861 A | 5/2007 |
| JP | 2007-142195 A | 6/2007 |
| JP | 2008-141119 A | 6/2008 |
| JP | 2008-277326 A | 11/2008 |
| JP | 2010-080952 A | 4/2010 |
| JP | 2010-103451 A | 5/2010 |
| JP | 2010-183108 A | 8/2010 |
| JP | 2010-222214 A | 10/2010 |
| JP | 2011-018777 A | 1/2011 |
| JP | 2011-086923 A | 4/2011 |
| JP | 2011-119714 A | 6/2011 |
| JP | 2011-135066 A | 7/2011 |
| JP | 2011-142314 A | 7/2011 |
| JP | 2011-146697 A | 7/2011 |
| JP | 2011-151796 A | 8/2011 |
| JP | 2011-181801 A | 9/2011 |
| JP | 2011-181802 A | 9/2011 |
| JP | 2011-181803 A | 9/2011 |
| JP | 2011-199273 A | 10/2011 |
| JP | 2011-205078 A | 10/2011 |
| JP | 2011-205081 A | 10/2011 |
| JP | 2011-249570 A | 12/2011 |
| KR | 2008-0053355 A | 6/2008 |
| KR | 2008-0069607 A | 7/2008 |
| KR | 2009-0128561 A | 12/2009 |
| KR | 2010-0094509 A | 8/2010 |
| KR | 2011-0100147 A | 9/2011 |
| TW | 200849605 | 12/2008 |
| TW | 200937638 | 9/2009 |
| TW | 201133854 | 10/2011 |
| TW | 201135853 | 10/2011 |
| TW | 201137480 | 11/2011 |
| WO | WO-2004/114391 | 12/2004 |
| WO | WO-2007/029844 | 3/2007 |
| WO | WO-2007/058231 | 5/2007 |
| WO | WO-2008/096768 | 8/2008 |
| WO | WO-2008/133220 | 11/2008 |
| WO | WO-2009/075281 | 6/2009 |
| WO | WO-2010/140548 | 12/2010 |
| WO | WO-2011/033936 | 3/2011 |
| WO | WO-2011/052385 | 5/2011 |
| WO | WO-2011/055631 | 5/2011 |
| WO | WO-2011/065216 | 6/2011 |
| WO | WO-2011/070928 | 6/2011 |
| WO | WO-2011/074409 | 6/2011 |
| WO | WO-2011/078373 | 6/2011 |
| WO | WO-2011/089844 | 7/2011 |
| WO | WO-2011/105268 | 9/2011 |
| WO | WO-2011/108381 | 9/2011 |
| WO | WO-2011/108382 | 9/2011 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—$ZnO$ system at 1350°C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—$ZnO$ System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(56) References Cited

OTHER PUBLICATIONS

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973. vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering": SID Digest '09 ; SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "Suftla Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission

(56) References Cited

OTHER PUBLICATIONS

AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155. No. 12, pp. H1009-H1014.

Ueno.K et al., "Field-Effect Transistor on SrTiO3 with Sputtered Al2O3 Gate Insulator", Appl. Phys. Lett. (Applied Physics Letters), Sep. 1, 2003, vol. 83, No. 9, pp. 1755-1757.

Nomura.K et al., "Diffusion of oxygen and hydrogen in amorphous oxide semiconductor a-In—Ga—Zn—O", Proceedings of 8th Thin Film Materials & Devices Meeting, Nov. 4, 2011, pp. 16-17.

Nomura.K et al., "Local coordination structure and electronic structure of the large electron mobility amorphous oxide semiconductor In—Ga—Zn—O: Experiment and ab initio calculations", Phys. Rev. B (Physical Review. B), Jan. 18, 2007, vol. 75, No. 3, pp. 035212-1-035212-5.

Ono.M et al., "Novel High Performance IGZO-TFT with High Mobility over 40 cm2/Vs and High Photostability Incorporated Oxygen Diffusion", IDW '11 : Proceedings of the 18th International Display Workshops, Dec. 7, 2011, pp. 1689-1690.

Kamiya.T et al., "Origins of High Mobility and Low Operation Voltage of Amorphous Oxide TFTs: Electronic Structure, Electron Transport, Defects and Doping", Journal of Display Technology, Jul. 1, 2009, vol. 5, No. 7, pp. 273-288.

International Search Report (Application No. PCT/JP2012/082123) Dated Feb. 26, 2013.

Written Opinion (Application No. PCT/JP2012/082123) Dated Feb. 26, 2013.

Taiwanese Office Action (Application No. 106129434) Dated Jan. 5, 2018.

\* cited by examiner

FIG. 5A
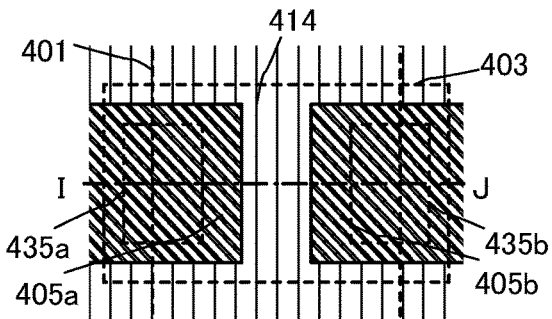
FIG. 5B
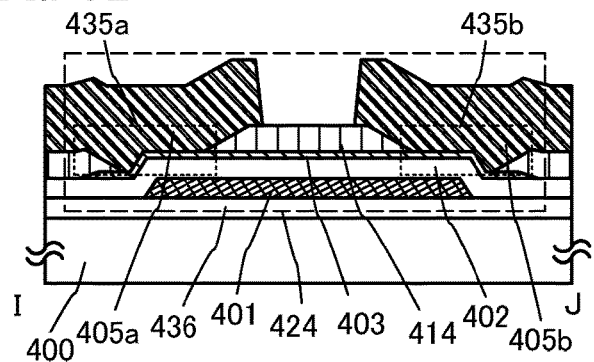
FIG. 5C
FIG. 5E
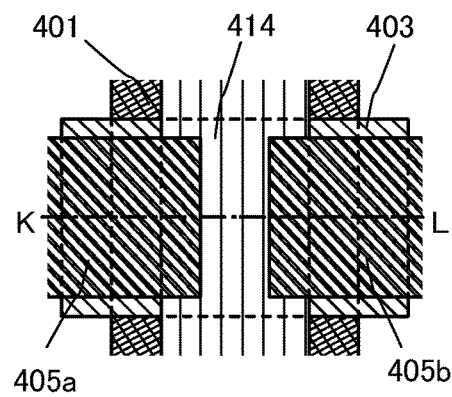
FIG. 5D
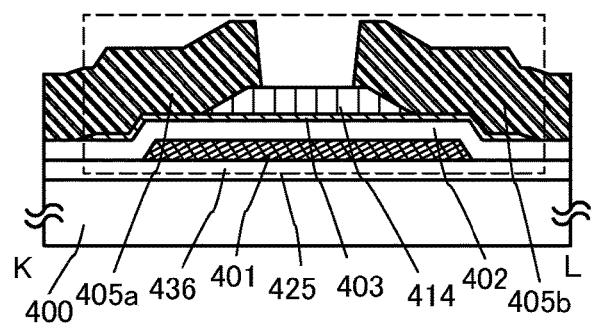

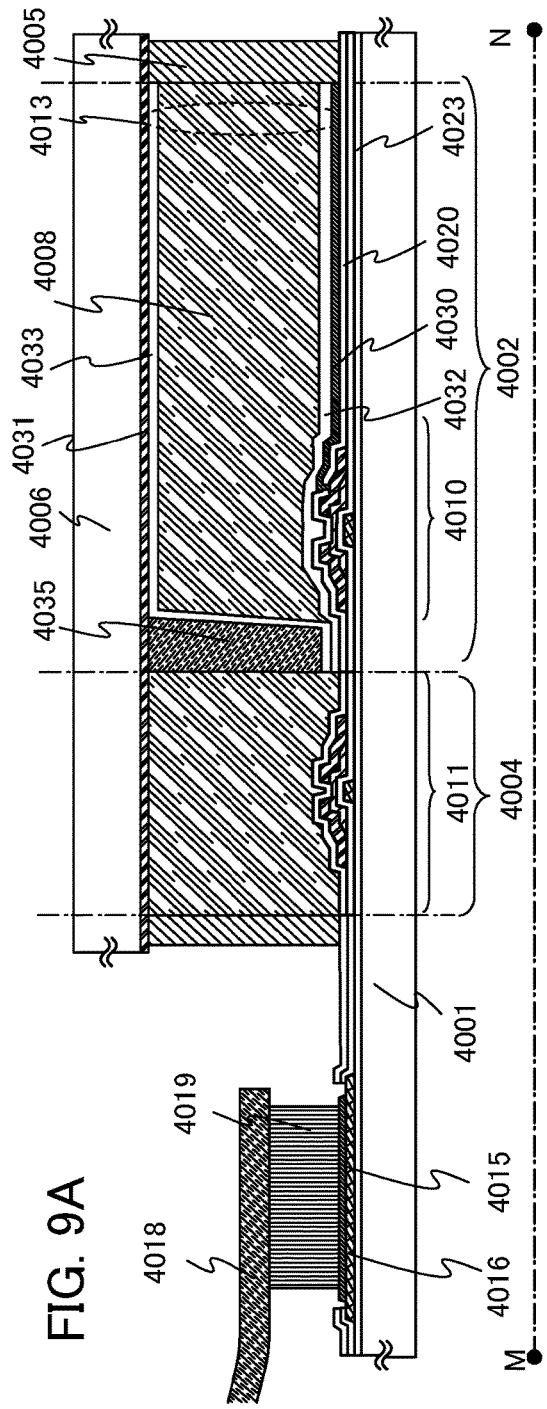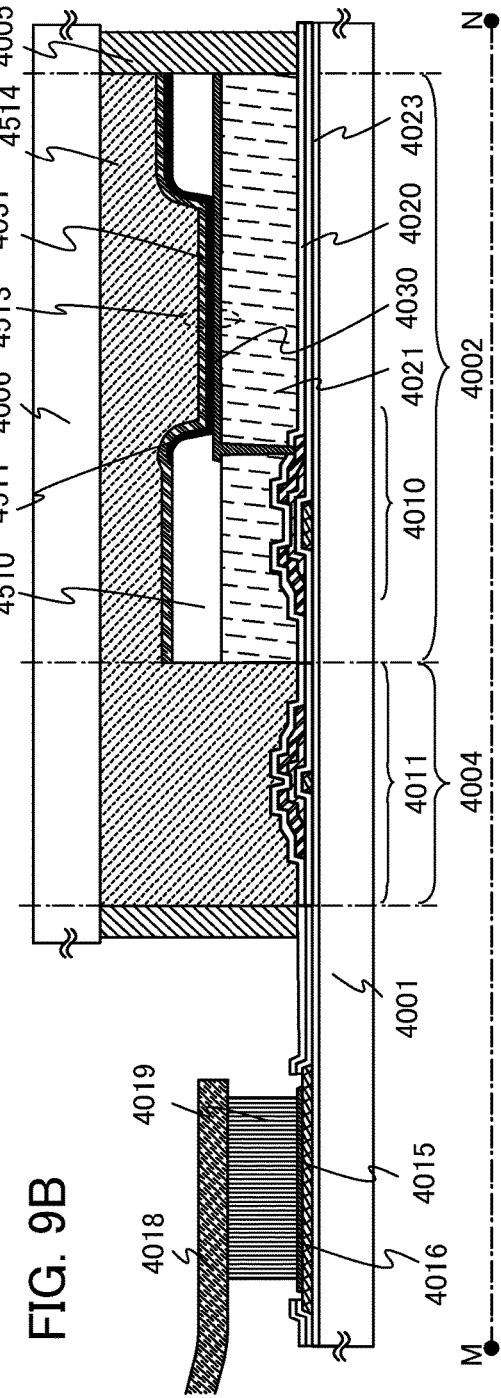
FIG. 9A
FIG. 9B

SEMICONDUCTOR DEVICE AND METHOD FOR MANUFACTURING THE SAME

TECHNICAL FIELD

The present invention relates to a semiconductor device including an oxide semiconductor and a manufacturing method thereof.

In this specification, a semiconductor device generally means a device which can function by utilizing semiconductor characteristics, and an electrooptic device, a semiconductor circuit, and electronic equipment are all semiconductor devices.

BACKGROUND ART

Many transistors formed over a glass substrate or the like are manufactured using amorphous silicon, polycrystalline silicon, or the like, as typically seen in liquid crystal display devices. Although transistors including amorphous silicon have low field effect mobility, they can be formed over a larger glass substrate. On the other hand, although transistors including polycrystalline silicon have high field effect mobility, they are not suitable for being formed over a larger glass substrate.

Other than a transistor formed using silicon, a technique in which a transistor is formed using an oxide semiconductor and applied to an electronic device or an optical device has attracted attention. For example, Patent Document 1 and Patent Document 2 disclose a technique in which a transistor is manufactured using zinc oxide or an In—Ga—Zn-based oxide semiconductor as an oxide semiconductor and such a transistor is used as a switching element or the like in a pixel of a display device.

In an oxide semiconductor, part of hydrogen serves as a donor to release electrons as carriers. When the carrier concentration in the oxide semiconductor becomes high, a channel is formed in the transistor without voltage application to a gate. That is, the threshold voltage of the transistor shifts to the negative direction; it becomes difficult to control the threshold voltage.

In Patent Document 3, it is disclosed that when hydrogen is added in an oxide semiconductor film, electrical conductivity of the oxide semiconductor is increased by four to five orders of magnitude approximately. Moreover, it is disclosed that hydrogen is diffused into the oxide semiconductor film from an insulating film which is in contact with the oxide semiconductor film.

Non-patent Document 1 discloses diffusion coefficients of oxygen and hydrogen in amorphous IGZO. Specifically, Non-patent Document 1 discloses that the diffusion coefficient of oxygen at a heat treatment temperature of 100° C. to 400° C. is $2 \times 10^{-17}$ cm$^2$ s$^{-1}$ to $4 \times 10^{-17}$ cm$^2$ s$^{-1}$, which is higher than that in ZnO or SiO$_2$. Non-patent Document 2 discloses diffusion of oxygen in amorphous IGZO at a heat treatment temperature of 300° C. to 450° C.

Non-patent Document 3 discloses that the density of amorphous IGZO is 5.9 g/cm$^3$.

REFERENCES

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2008-141119

Non-Patent Documents

Non-Patent Document 1
Kenji Nomura et al., "Diffusion of oxygen and hydrogen in a-In—Ga—Zn—O", THIN FILM MATERIALS & DEVICES MEETINGS, 4004, November 2011, pp. 16-17

Non-Patent Document 2
Masashi Ono et al., "Novel High Performance IGZO-TFT with High Mobility over 40 cm$^2$/Vs and high Photostability Incorporated Oxygen Diffusion", The 18th International Display Workshops 2011, pp. 1689-1690

Non-Patent Document 3
Kenji Nomura et al., "Local coordination structure and electronic structure of the large electron mobility amorphous oxide semiconductor In—Ga—Zn—O: Experiment and ab initio calculations", The American Physical Society 2007, PHYSICAL REVIEW B 75, 035212

DISCLOSURE OF INVENTION

One object of the present invention is to manufacture a highly reliable semiconductor device in which a transistor has stable electric characteristics.

In forming an oxide semiconductor film, the film quality of the oxide semiconductor film greatly varies depending on a deposition method or a deposition condition. The film quality of the oxide semiconductor film shortly after deposition might affect electric characteristics and reliability of a transistor when the oxide semiconductor film is used as a semiconductor layer of the transistor.

For example, if an oxide semiconductor film having low film density is formed, the film tends to have a large number of voids or a large amount of distortion, whereby interface reaction occurs easily. Further, in the film having low film density, a large amount of oxygen or hydrogen is diffused. Hydrogen (or water) in the voids of the film might lead to deterioration such as a progressive failure.

One embodiment of the present invention disclosed in this specification is a method for obtaining a dense film close to single crystal, and a semiconductor device including an oxide semiconductor film obtained by the method.

An oxide semiconductor film is deposited under the following conditions: a sputtering target which is polycrystalline and whose relative density (filling rate) is high is used; the sputtering target in deposition is sufficiently cooled to a room temperature; the temperature of a surface where the oxide semiconductor film is to be deposited of a substrate where the oxide semiconductor film is to be deposited (a deposition-target substrate) is increased to a room temperature or higher; and an atmosphere in a deposition chamber hardly contains moisture or hydrogen.

The higher the density of the sputtering target is, the more preferable. When the density of the sputtering target is increased, the density of a film to be deposited can also be increased. Specifically, the relative density (filling rate) of the sputtering target is set to be higher than or equal to 90% and lower than or equal to 100%, preferably higher than or equal to 95%, more preferably higher than or equal to 99.9%. Note that the relative density of the sputtering target refers to a ratio between the density of the sputtering target and the density of a material free of porosity having the same composition as the sputtering target.

Reduction of impurities remaining in the deposition chamber is also important for forming a dense film. The back pressure (ultimate vacuum: degree of vacuum before introducing a reaction gas) in a deposition chamber is set to be lower than or equal to $5\times10^{-3}$ Pa, preferably $6\times10^{-5}$ Pa, and pressure in deposition is set to be lower than 2 Pa, preferably lower than or equal to 0.4 Pa. When the back pressure is set to be low, impurities in the deposition chamber are reduced.

Reduction of impurities in a gas to be introduced in the deposition chamber, i.e., a gas to be used in deposition, is also important for forming a dense film. Further, it is important to increase the proportion of oxygen contained in a deposition gas and optimize power. By increasing the proportion of oxygen (the upper limit: 100% oxygen) contained in the deposition gas and optimizing the power, plasma damage in deposition can be alleviated. Thus, a dense film is easily formed.

Deposition of the oxide semiconductor film is preferably performed while a quadrupole mass analyzer (hereinafter also referred to as Q-mass) is operated continuously in order that the amount of moisture in the deposition chamber, or the like be monitored by the Q-mass before or in deposition.

One embodiment of the invention disclosed in this specification is a method for manufacturing a semiconductor device, which includes a step of depositing an oxide semiconductor film by a sputtering method using a polycrystalline sputtering target. In the deposition, partial pressure of water in a deposition chamber in deposition is set to be lower than or equal to $10^{-3}$ Pa.

In order to obtain a dense film which is close to single crystal, it is preferable that the partial pressure of water in the deposition chamber in deposition of the oxide semiconductor film be lower than or equal to $10^{-3}$ Pa, more preferably lower than or equal to $10^{-4}$ Pa, much more preferably lower than or equal to $10^{-5}$ Pa. Further, it is preferable that the partial pressure of hydrogen in the deposition chamber in deposition be lower than or equal to $10^{-1}$ Pa, more preferably lower than or equal to $10^{-2}$ Pa.

In order to obtain a dense film which is close to single crystal, the partial pressure of water in the deposition chamber before deposition of the oxide semiconductor film be lower than or equal to $10^{-3}$ Pa, more preferably lower than or equal to $10^{-4}$ Pa, much more preferably lower than or equal to $10^{-5}$ Pa.

Note that a deposition-target substrate is heated to a temperature at which water is not adsorbed, preferably, a temperature higher than or equal to 200° C. and lower than or equal to 500° C.; thus, a dense film is easily obtained.

A dense film obtained by the above-described method is also one embodiment of the present invention. One embodiment of the present invention is a semiconductor device including a non-single-crystal oxide semiconductor film as a channel formation region, and the oxide semiconductor film has a density of higher than 5.9 g/cm$^3$, preferably higher than 6.0 g/cm$^3$ and lower than 6.375 g/cm$^3$.

Note that a value of density of 6.375 g/cm$^3$ is a theoretical value of density of In—Ga—Zn-based oxide having composition where $In_2O_3:Ga_2O_3:ZnO=1:1:2$ [molar ratio] (In:Ga:Zn=1:1:1 [atomic ratio]). The composition of the oxide semiconductor film can be measured by X-ray photoelectron spectroscopy (XPS).

One embodiment of the present invention is a semiconductor device including a gate insulating layer over a gate electrode layer, and a non-single-crystal oxide semiconductor film over the gate insulating layer. In the semiconductor device, the oxide semiconductor film has a density of higher than 6.0 g/cm$^3$ and lower than 6.375 g/cm$^3$.

One embodiment of the present invention is a semiconductor device including a non-single-crystal oxide semiconductor film, a gate insulating layer over the oxide semiconductor film, and a gate electrode layer over the gate insulating layer. In the semiconductor device, the oxide semiconductor film has a density of higher than 6.0 g/cm$^3$ and lower than 6.375 g/cm$^3$.

A non-single-crystal oxide semiconductor film obtained by the above-described method is a dense film which is thin and close to single crystal, which results in improvement in reliability of a semiconductor device including a dense oxide semiconductor film.

The film density of the oxide semiconductor film can be measured by Rutherford backscattering spectrometry (RBS) or X-ray reflectivity (XRR).

When the temperature of a deposition-target substrate, which is an example of deposition conditions, is set to be higher than or equal to 200° C., a dense oxide semiconductor film including a crystal part, i.e., a c-axis aligned crystalline oxide semiconductor (CAAC-OS) film can be obtained. In the crystal part of the oxide semiconductor film, a c-axis is aligned in a direction parallel to a normal vector of a surface where the oxide semiconductor film is formed or a normal vector of a surface of the oxide semiconductor film. FIG. 21 is a high-resolution cross-sectional TEM image (a bright-field image) of CAAC-OS film (In—Ga—Zn-based oxide). In the cross-sectional TEM image, the horizontal direction is parallel to a surface of the CAAC-OS film. The TEM image is taken using H-9000NAR manufactured by Hitachi High-Technologies Corporation with an acceleration voltage of 300 kV at eight-million-fold magnification.

During deposition, fine sputtering particles fly from a target, and a film is formed so that the sputtering particles adhere onto the deposition-target substrate. When the temperature of the substrate is higher than or equal to 200° C., the sputtering particles are rearranged because the substrate is heated. Thus, a dense film is formed.

The phenomenon during deposition is described in detail. When ions collide with the surface of the sputtering target, the crystal region included in the sputtering target is cleaved along an a-b plane, and sputtered particles whose top and bottom surfaces are each aligned with a layer parallel to the a-b plane (flat-plate-like sputtered particle or pellet-like sputtered particle) are separated from the sputtering target. The flat-plate-like sputtered particles reach a substrate surface with their original crystal state maintained, whereby an oxide semiconductor film having a crystal region which is c-axis-aligned perpendicularly to the surface of the oxide semiconductor film can be easily obtained.

In a CAAC-OS film, about 2 to 20 indium atoms are aligned in a lateral direction to form a layer including indium atoms. Note that in some cases, 20 or more indium atoms are aligned; for example, 2 to 50 indium atoms, 2 to 100 indium atoms, or 2 to 500 indium atoms may be aligned in a lateral direction.

Layers including indium atoms overlap with each other. The number of layers is greater than or equal to 2 and less than or equal to 20, greater than or equal to 2 and less than or equal to 10, or greater than or equal to 2 and less than or equal to 4.

As described above, a stack of the layers including indium atoms often appears to be a cluster including several indium atoms in a lateral direction and several layers in a longitudinal direction. This is because each of the sputtering particles has a flat-plate-like shape.

By increasing the temperature of the deposition-target substrate, migration of sputtering particles is likely to occur on a substrate surface. With this effect, a flat-plate-like sputtered particle reaches the substrate surface, moves slightly, and then is attached to the substrate surface with a flat plane (a-b plane) of the sputtered particle facing toward the substrate surface. Therefore, an oxide semiconductor film having a crystal region which is c-axis-aligned perpendicularly to the surface of the oxide semiconductor film is easily formed.

Further, heat treatment at a temperature of higher than or equal to 200° C. may be performed after the deposition of the oxide semiconductor film, so that a denser film is obtained. However, in that case, oxygen vacancies might be generated when impurity elements (hydrogen, water, and the like) in the oxide semiconductor film are reduced. Therefore, before the heat treatment is performed, an insulating layer containing excess oxygen is preferably provided over or below the oxide semiconductor film, because even when oxygen vacancies are generated by heat treatment, oxygen can be supplied from the insulating layer containing excess oxygen to the oxide semiconductor film by heat treatment; thus, oxygen vacancies in the oxide semiconductor film can be reduced.

An oxide semiconductor film shortly after deposition is made dense. Thus, a dense film which is thin and close to single crystal can be obtained. Accordingly, a semiconductor device including a dense oxide semiconductor film can achieve improvement in reliability.

BRIEF DESCRIPTION OF DRAWINGS

FIGS. 5A to 5E are plan views and cross-sectional views which illustrate embodiments of the present invention.

FIGS. 9A and 9B are cross-sectional views illustrating one embodiment of a semiconductor device.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

[Embodiment 1]

In this embodiment, one embodiment of a semiconductor device and a method of manufacturing the semiconductor device will be described with reference to FIG. 3A.

Figure 3A:
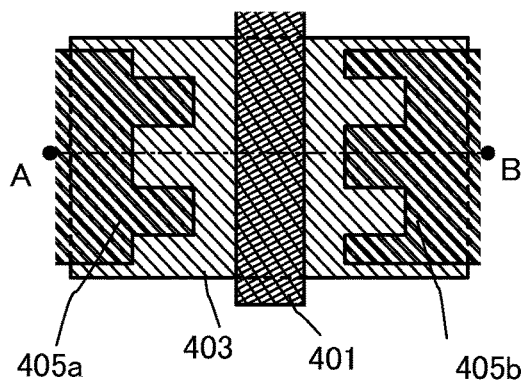
FIGS. 3A to 3D are plan views and cross-sectional views which illustrate embodiments of the present invention.
Figure 3B:
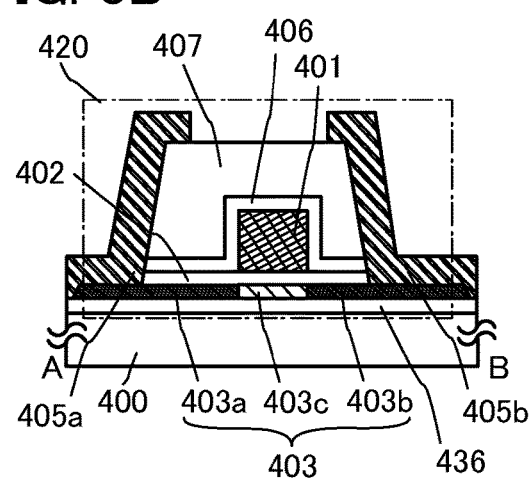

FIGS. 3A and 3B are a plan view and a cross-sectional view of a transistor 420 as one example of a semiconductor device. FIG. 3A is a plan view of the transistor 420 and FIG. 3B is a cross-sectional view taken along line A-B in FIG. 3A. Note that in FIG. 3A, part of components of the transistor 420 (e.g., an insulating layer 407) is omitted for simplicity.

The transistor 420 shown in FIGS. 3A and 3B includes a base insulating layer 436 provided over a substrate 400, an oxide semiconductor film 403 over the base insulating layer 436, a gate insulating layer 402 over the oxide semiconductor film 403, a gate electrode layer 401 provided over the oxide semiconductor film 403 with the gate insulating layer 402 provided therebetween, an insulating layer 406 and the insulating layer 407 which are provided over the gate electrode layer 401, and a source electrode layer 405a and a drain electrode layer 405b which are electrically connected to the oxide semiconductor film 403 through openings formed in the gate insulating layer 402, the insulating layer 406, and the insulating layer 407.

Further, in the transistor 420, the oxide semiconductor film 403 preferably includes a channel formation region 403c with which the gate electrode layer 401 overlaps, and low-resistance regions 403a and 403b which are provided with the channel formation region 403c positioned therebetween, have lower resistance than the channel formation region 403c, and include a dopant. The low-resistance regions 403a and 403b can be formed in a self-aligned manner by introducing an impurity element using the gate electrode layer 401 as a mask after the formation of the gate electrode layer 401. Note that portions in the low-resistance regions 403a and 403b, which the drain electrode layer 405b and the source electrode layer 405a are in contact with, and their vicinity may have lower resistivity than in other portions in the oxide semiconductor film 403, and these portions having lower resistivity may be called a drain region and a source region, respectively. Provision of the low-resistance regions 403a and 403b leads to relaxation of an electric field applied to the channel formation region 403c between the pair of low-resistance regions. Further, the structure in which the source electrode layer 405a and the drain electrode layer 405b are in contact with their respective low-resistance regions leads to a reduction in contact resistance between the oxide semiconductor film 403 and each of the source electrode layer 405a and the drain electrode layer 405b.

In this embodiment, the oxide semiconductor film 403 is deposited by a sputtering method using a sputtering target of In—Ga—Zn-based oxide which is polycrystalline and has a density of 6.3 g/cm$^3$ and an atomic ratio where In:Ga:Zn=1:1:1. Although illustrating an example of using the sputtering target of In—Ga—Zn-based oxide having an atomic ratio where In:Ga:Zn=1:1:1, this embodiment is not particularly limited thereto. For example, any of the following can be used: a sputtering target of In—Ga—Zn-based oxide having an atomic ratio where In:Ga:Zn=3:1:2; a sputtering target of In—Ga—Zn-based oxide having an atomic ratio where In:Ga:Zn=2:2:1; a sputtering target of In—Ga—Zn-based oxide having an atomic ratio where In:Ga:Zn=1:1:2; and a sputtering target of In—Ga—Zn-based oxide having an atomic ratio where In:Ga:Zn=2:1:4. Note that in the case where the composition of the target is changed, a theoretical value of density is changed; accordingly, the upper limit of the density of the film is also changed.

The back pressure of a deposition chamber is set to be lower than or equal to $5 \times 10^{-3}$ Pa, preferably $6 \times 10^{-5}$ Pa. Pressure in deposition is set to be lower than 2 Pa, preferably lower than or equal to 0.4 Pa.

In the deposition chamber before or during deposition, the partial pressure of water which is measured using Q-mass is lower than or equal to $10^{-3}$ Pa, preferably lower than or equal to $10^{-4}$ Pa, more preferably lower than or equal to $10^{-5}$ Pa. Further, the partial pressure of hydrogen is preferably lower than or equal to $10^{-1}$ Pa, more preferably lower than or equal to $10^{-2}$ Pa.

In this embodiment, Qulee CGM-051, a quadrupole mass analyzer manufactured by ULVAC, Inc., is used as Q-mass provided for the deposition chamber.

It is preferable that before the formation of the oxide semiconductor film 403, the substrate 400 be heated so that moisture and the like on the substrate or the like are removed. As the substrate 400, any of the following can be used: a single crystal semiconductor substrate or a polycrystalline semiconductor substrate of silicon, silicon carbide, or the like, a compound semiconductor substrate of silicon germanium or the like, an SOI substrate, a glass substrate, a ceramic substrate, a quartz substrate, a sapphire substrate, and the like. It is also preferable to perform heat treatment or the like to remove moisture and the like on a surface of the base insulating layer 436 after the formation of the base insulating layer 436.

As the heat treatment, heat treatment by heat conduction or heat radiation from a medium such as a heated gas (rapid thermal anneal (RTA)) may be performed. For example, as an example of the RTA, a gas rapid thermal anneal (GRTA), a lamp rapid thermal anneal (LRTA), or the like can be used. In the LRTA, an object is heated by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA, a heat treatment is performed with a high-temperature gas. An inert gas is used as the gas. The heat treatment by the RTA for a short time enables the substrate not to strain even at a temperature higher than or equal to the strain point of the substrate, which allows an efficient dehydration or dehydrogenation treatment.

A resistance heating method may also be used; for example, the substrate temperature is higher than or equal to 500° C. and lower than or equal to 650° C. and the process time is longer than or equal to 1 minute and shorter than or equal to 10 minutes. The heat treatment is performed at a temperature higher than or equal to 300° C. and lower than the strain point of the substrate, preferably higher than or equal to 400° C. and lower than or equal to 650° C. in an inert atmosphere, a reduced-pressure atmosphere, or a dry air atmosphere. The inert atmosphere refers to an atmosphere containing an inert gas (such as nitrogen or a rare gas (e.g., helium, neon, argon, krypton, or xenon)) as its main component, and preferably contains no hydrogen. For example, the purity of the inert gas to be introduced is 8N (99.999999%) or more, preferably 9N (99.9999999%) or more. Alternatively, the inert atmosphere refers to an atmosphere that contains an inert gas as its main component and in which the concentration of a reactive gas is less than 0.1 ppm. The reactive gas is a gas that reacts with a semiconductor, metal, or the like. The reduced-pressure atmosphere refers to a pressure of 10 Pa or less. The dry air atmosphere is an atmosphere at a dew point lower than or equal to −40° C., preferably lower than or equal to −50° C.

The oxide semiconductor film 403 of this embodiment is preferably a highly purified oxide semiconductor film which hardly contains impurities such as copper, aluminum, or chlorine. In the process for manufacturing the transistor, steps in which these impurities are not mixed or attached to the surface of the oxide semiconductor film are preferably selected as appropriate. In the case where the impurities are attached to the surface of the oxide semiconductor layer, the impurities on the surface of the oxide semiconductor film are preferably removed by exposure to oxalic acid or dilute hydrofluoric acid or plasma treatment (such as $N_2O$ plasma treatment). Specifically, the concentration of copper in the oxide semiconductor film is lower than or equal to $1 \times 10^{18}$ atoms/cm$^3$, preferably lower than or equal to $1 \times 10^{17}$ atoms/cm$^3$. Further, the concentration of aluminum in the oxide semiconductor film is lower than or equal to $1 \times 10^{18}$ atoms/cm$^3$. Furthermore, the concentration of chlorine in the oxide semiconductor film is lower than or equal to $2 \times 10^{18}$ atoms/cm$^3$.

In addition, the oxide semiconductor film shortly after deposition is preferably in a supersaturated state in which oxygen which exceeds the stoichiometric composition is contained. Therefore, the deposition is preferably performed in the state where the proportion of oxygen in a sputtering gas is high, and more preferably, the deposition is performed in an oxygen atmosphere (an oxygen gas: 100%). When a film is deposited under the condition that the proportion of oxygen in the sputtering gas is high, particularly in an atmosphere containing an oxygen gas at 100%, release of Zn from the film can be reduced even at a substrate temperature of higher than or equal to 300° C. in deposition by sputtering. Thus, a dense film is obtained.

Further, the temperature of a deposition-target substrate, which is an example of deposition conditions, may be set to be higher than or equal to 200° C.; thus, a dense oxide semiconductor film including a crystal part can be obtained. Further, after the deposition of the oxide semiconductor film, heat treatment may be performed at a temperature of higher than or equal to 200° C.; thus, a dense oxide semiconductor film including a crystal part can be obtained.

In this embodiment, a material for the oxide semiconductor film 403 can be a material including at least indium and gallium; for example, In—Ga-based oxide, In—Ga—Zn-based oxide (also referred to as IGZO) which is a three-component metal oxide, or In—Sn—Ga—Zn-based oxide, In—Hf—Ga—Zn-based oxide, or In—Al—Ga—Zn-based oxide which is a four-component metal oxide can be used. Further, a material represented by $InM_{1X}M_{2(1-X)}Zn_YO_Z$ ($0<X<1$, $In>Zn$, and $Z>1$) may be used for the oxide semiconductor. Specifically, a sputtering target where In:Ti:Ga:Zn=3:0.05:0.95:2 (i.e., $M_1$ represents Ga, $M_2$ represents Ti, and X=0.05) may be used to form an InTiGaZnO film by a sputtering method as the oxide semiconductor film 403. As other materials for the oxide semiconductor film 403, any of the following can be used: two-component metal oxide such as In—Zn-based oxide, Sn—Zn-based oxide, Al—Zn-based oxide, Zn—Mg-based oxide, Sn—Mg-based oxide, or In—Mg-based oxide; three-component metal oxide such as In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, or In—Lu—Zn-based oxide; four-component metal oxide such as In—Sn—Al—Zn-based oxide, In—Sn—Hf—Zn-based oxide, or In—Hf—Al—Zn-based oxide.

In this embodiment, the oxide semiconductor film 403 is a CAAC-OS film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

Further, for sufficient supply of oxygen to make the film in a supersaturated state, an insulating layer (e.g., $SiO_x$) containing excess oxygen is preferably provided to be in contact with and covers the oxide semiconductor film. An insulating layer containing excess oxygen (e.g., $SiO_x$) is used for each of the base insulating layer 436 and the gate insulating layer 402 which are in contact with the oxide semiconductor film 403.

Moreover, the concentration of hydrogen in the insulating layer containing excess oxygen is also important because the hydrogen concentration affects the characteristics of the transistor.

Further, in the case where the hydrogen concentration in the insulating layer containing excess oxygen is higher than or equal to $7.2\times10^{20}$ atoms/cm$^3$, variation in initial characteristics of the transistor is increased, a channel length dependence of electric characteristics of the transistor is increased, and the transistor significantly deteriorates in the BT stress test; therefore, the hydrogen concentration in the insulating layer containing excess oxygen is preferably lower than $7.2\times10^{20}$ atoms/cm$^3$. In other words, the hydrogen concentration in the oxide semiconductor film is preferably lower than or equal to $5\times10^{19}$ atoms/cm$^3$, and the hydrogen concentration in the insulating layer containing excess oxygen is preferably lower than $7.2\times10^{20}$ atoms/cm$^3$.

A blocking layer (e.g., $AlO_x$) for suppressing release of oxygen from the oxide semiconductor film is preferably formed so as to be positioned outside the insulating layer containing excess oxygen. The insulating layer 406 serves as the blocking layer.

The insulating layer containing excess oxygen and the blocking layer are provided over and below the oxide semiconductor film, whereby the oxide semiconductor film can contain oxygen in a proportion which is substantially the same as that in the stoichiometric composition or can be in a supersaturated state in which oxygen which exceeds the stoichiometric composition is contained. For example, in the case where the oxide semiconductor film has a stoichiometric composition where In:Ga:Zn:O=1:1:1:4, the ratio of oxygen atoms in the oxide semiconductor film (IGZO film) is larger than 4.

By the deposition under the above-described condition or heat treatment after the deposition, the density of the oxide semiconductor film 403 can be higher than 6.0 g/cm$^3$ and lower than 6.375 g/cm$^3$. When such a dense oxide semiconductor film which is close to single crystal is included, a semiconductor device can achieve improvement in reliability.

An experiment in which oxide semiconductor films having different film qualities are formed under different deposition conditions and the film qualities of the oxide semiconductor films are measured by XRR is conducted.

Sample 1 is obtained in such a manner that, after a 100-nm-thick silicon oxide ($SiO_x$) film is formed over a glass substrate by a sputtering method, a 100-nm-thick IGZO film is formed under a condition that a substrate temperature in deposition by sputtering is set to room temperature. Other deposition conditions are as follows: a DC sputtering method is performed with the use of a sputtering target of In—Ga—Zn-based oxide having a density of 6.3 g/cm$^3$ and an atomic ratio where In:Ga:Zn=1:1:1; back pressure is set to 6×10$^{-5}$ Pa; pressure in deposition is set to 0.4 Pa; the flow rate of an argon gas is set to 30 sccm; the flow rate of an oxygen gas is set to 15 sccm; power is set to 0.5 kW; and a target-substrate distance is set to 60 mm.

Sample 2 is obtained under the same deposition conditions as Sample 1 except that the substrate temperature in deposition by sputtering is set to 300° C. Sample 3 is obtained under the same deposition conditions as Sample 1 except that the substrate temperature in deposition by sputtering is set to 400° C.

Figure 1A:
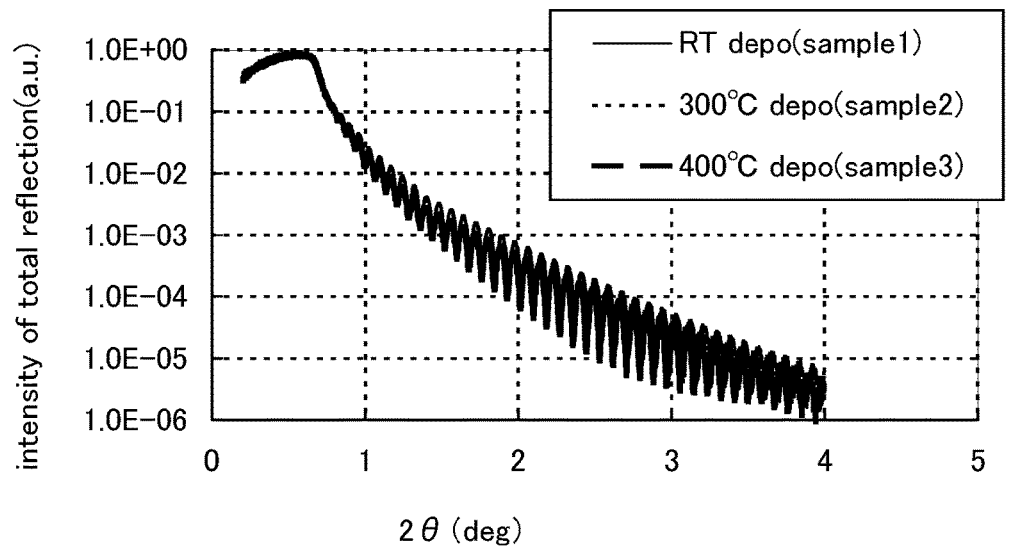
FIGS. 1A and 1B show XRR measurement results illustrating one embodiment of the present invention.
Figure 1B:
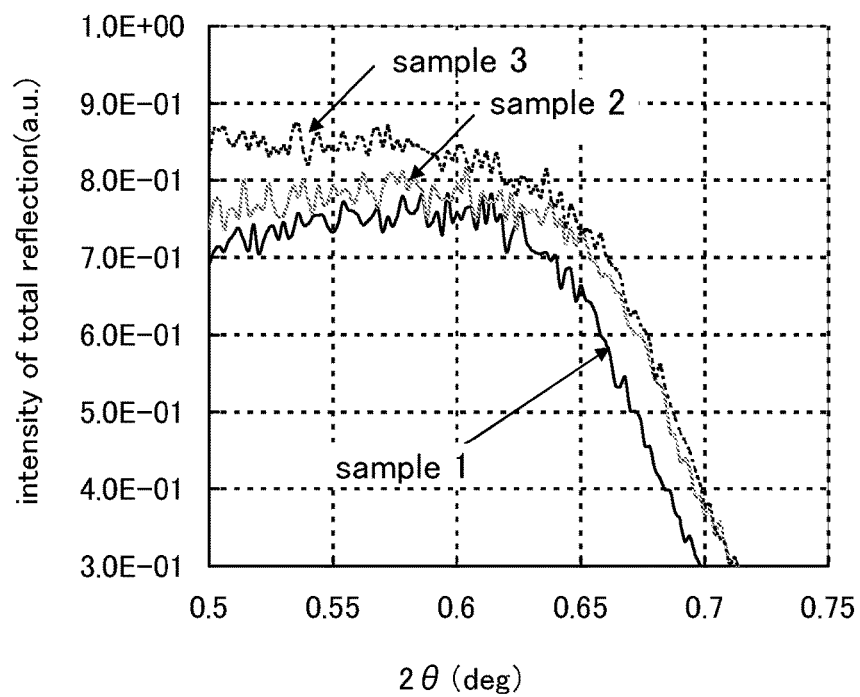

FIG. 1A shows an X-ray reflectivity profile (also called XRR measurement curve) of each sample. FIG. 1B is an enlarged graph of FIG. 1A at a critical total reflection angle and vicinity thereof. The vertical axis represents the intensity of total reflection, and the horizontal axis represents 2θ. Film density is determined from a critical total reflection angle for X-ray. Film thickness is determined from interference fringe spacing. Roughness, which is defined as density distribution, is determined by fitting.

Film densities are calculated using these values. The film density of a film in Sample 1 is 6.0 g/cm$^3$, the film density of a film in Sample 2 is 6.2 g/cm$^3$, and the density of a film in Sample 3 is 6.3 g/cm$^3$. The states of the IGZO films obtained are observed by TEM. The observation results show that the IGZO film of Sample 1 is amorphous, and that the IGZO film in each of Sample 2 and Sample 3, in which crystal parts can be seen, is a CAAC-OS film. A dense film is obtained in each of Sample 1, Sample 2, and Sample 3.

Figure 2A:
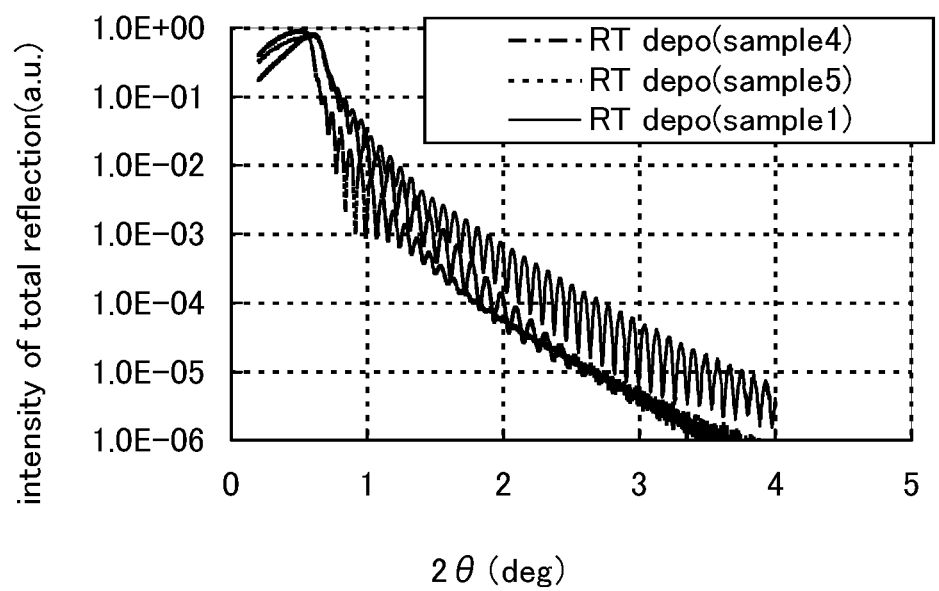
FIGS. 2A and 2B show XRR measurement results illustrating one embodiment of the present invention.
Figure 2B:
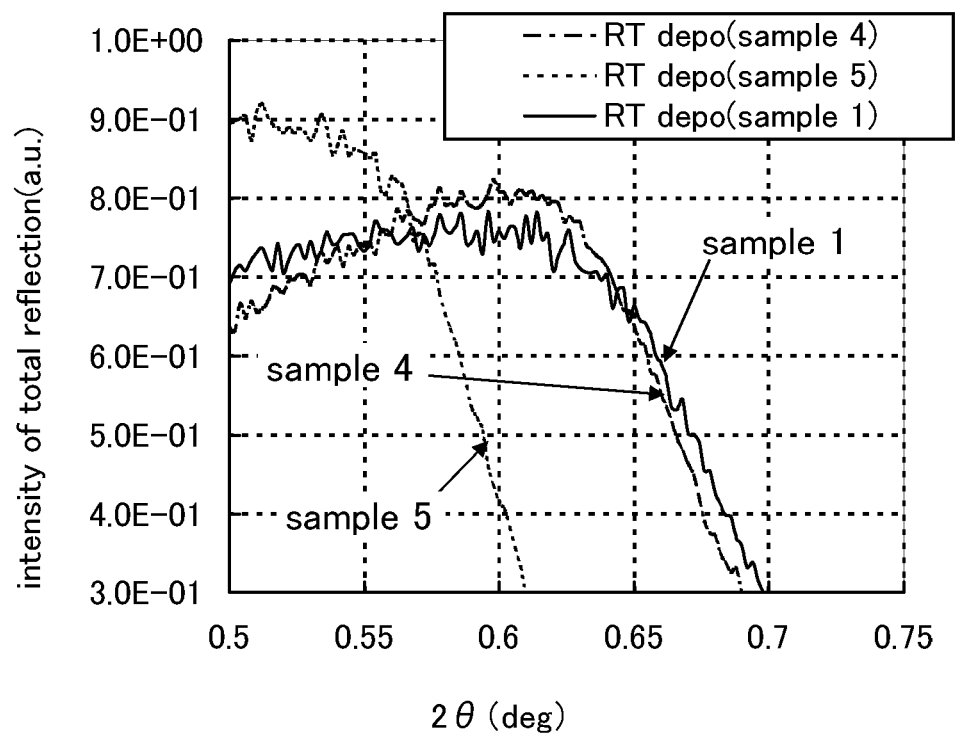

For comparison, an oxide semiconductor film containing hydrogen is formed. FIG. 2A similarly shows an X-ray reflectivity profile of the film. FIG. 2B is an enlarged graph of FIG. 2A at a critical total reflection angle and vicinity thereof.

Note that in this specification, "hydrogen" refers to a hydrogen atom, and, for example, includes hydrogen contained in a hydrogen molecule, hydrocarbon, hydroxyl, water, and the like in the expression "including hydrogen".

Sample 4 is obtained under the following conditions: a DC sputtering method is performed with the use of a sputtering target of In—Ga—Zn-based oxide having a density of 6.3 g/cm$^3$ and an atomic ratio where In:Ga:Zn=1:1:1; back pressure is set to 5×10$^{-3}$ Pa; pressure in deposition is set to 0.4 Pa; the proportion of an oxygen gas in a mixture gas of argon and oxygen is set to 30%; power is set to 0.1 kW; a substrate temperature in deposition by sputtering is set to room temperature; and a target-substrate distance is set to 110 mm.

Sample 5 is obtained under the same deposition conditions as Sample 4 except that the pressure in deposition is set to 2 Pa.

Film densities are calculated using these values. The film density of a film in Sample 4 is 5.9 g/cm$^3$, and the film density of a film in Sample 5 is 4.7 g/cm$^3$. The states of the IGZO films obtained are observed by TEM. The observation results show that the IGZO film in each of Sample 4 and Sample 5 is amorphous.

Figure 16A:
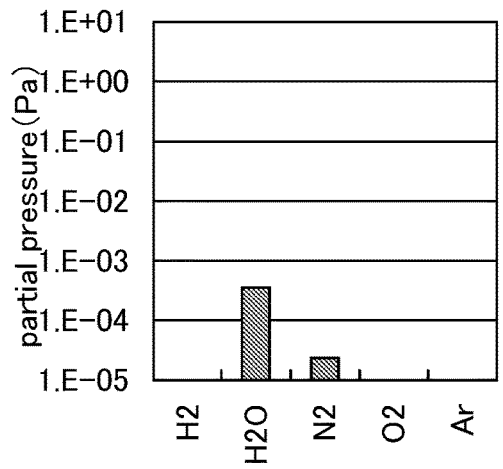
FIGS. 16A to 16D are graphs showing partial pressures of elements before or in deposition.

FIG. 16A shows the partial pressure of water, the partial pressure of hydrogen, the partial pressure of nitrogen, the partial pressure of oxygen, and the partial pressure of argon in the deposition chamber before deposition of the IGZO film of Sample 4 (film density: 5.9 g/cm$^3$) which are measured using Q-mass. FIG. 16B shows the partial pressure of water, the partial pressure of hydrogen, the partial pressure of nitrogen, the partial pressure of oxygen, and the partial pressure of argon in deposition of the IGZO film of Sample 4 (film density: 5.9 g/cm$^3$) which are measured using Q-mass.

Figure 16C:
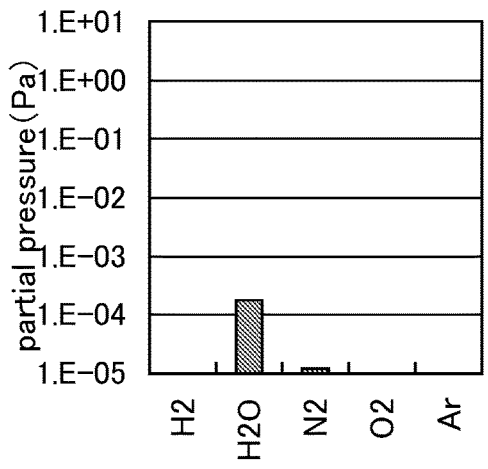
Figure 16B:
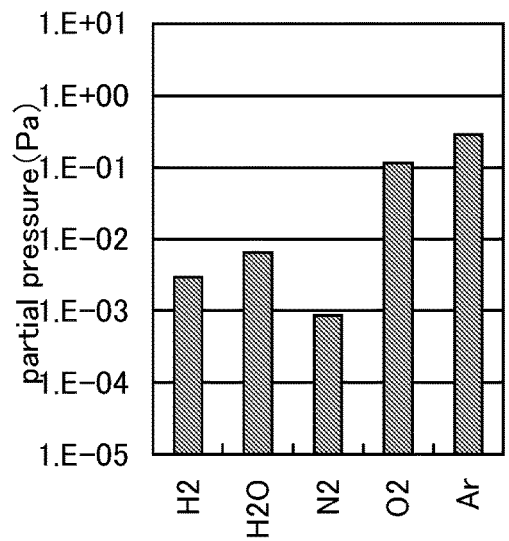
Figure 16D:
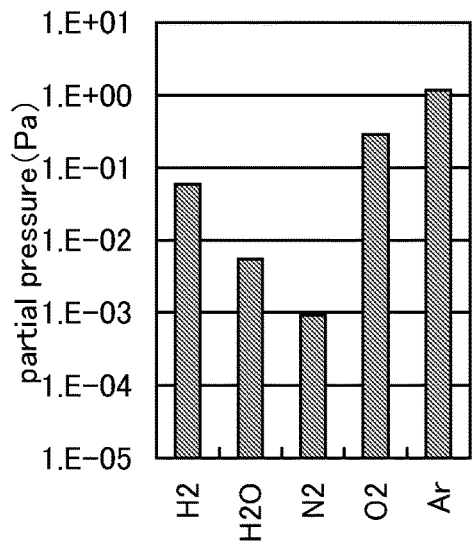

FIG. 16C shows the partial pressure of water, the partial pressure of hydrogen, the partial pressure of nitrogen, the partial pressure of oxygen, and the partial pressure of argon in the deposition chamber before deposition of the IGZO film of Sample 5 (film density: 4.7 g/cm$^3$) which are measured using Q-mass. FIG. 16D shows the partial pressure of water, the partial pressure of hydrogen, the partial pressure of nitrogen, the partial pressure of oxygen, and the partial pressure of argon in deposition of the IGZO film of Sample 5 (film density: 4.7 g/cm$^3$) which are measured using Q-mass.

Figure 17A:
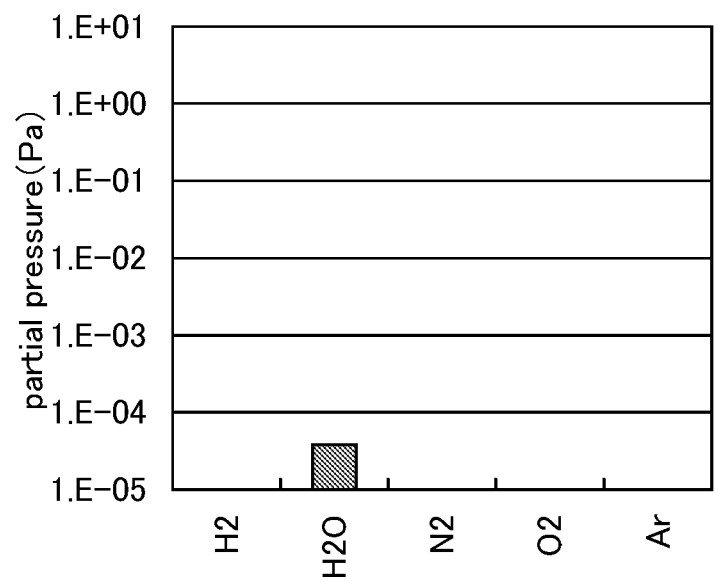
FIGS. 17A and 17B are graphs showing partial pressures of elements before or in deposition.
Figure 17B:
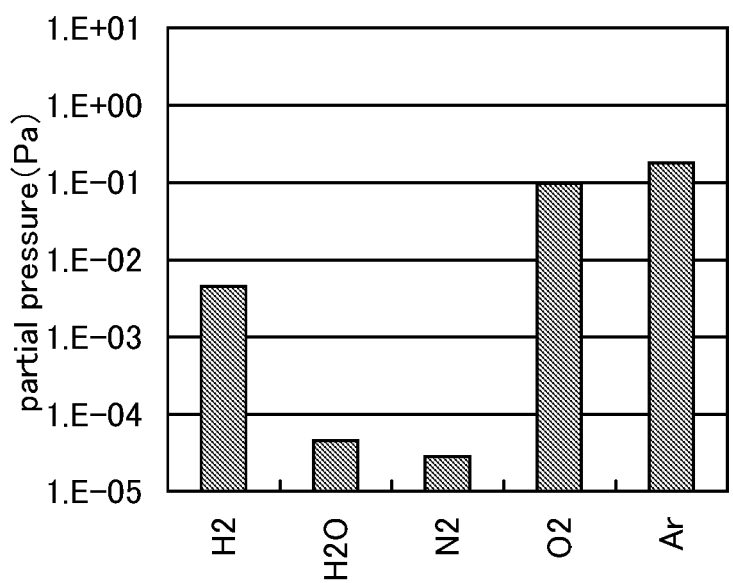

FIG. 17A shows the partial pressure of water, the partial pressure of hydrogen, the partial pressure of nitrogen, the partial pressure of oxygen, and the partial pressure of argon in the deposition chamber before deposition of the IGZO film (film density: 6.2 g/cm$^3$) of Sample 2 which are measured using Q-mass. FIG. 17B shows the partial pressure of water, the partial pressure of hydrogen, the partial pressure of nitrogen, the partial pressure of oxygen, and the partial pressure of argon in deposition (the values are obtained at a substrate temperature of 200° C.).

These results show that the films (in Sample 4 and Sample 5) with low density of less than or equal to 6.0 g/cm$^3$ are formed under the conditions that the partial pressure of water before deposition is higher than 10$^{-4}$ Pa and the partial pressure of water in deposition is higher than 10$^{-3}$ Pa. Accordingly, it can be said that when the partial pressure of water before or in deposition is high, the resulting film tends to have low film density. Further, there is a high possibility that moisture is included in a low-density film, particularly in the film of Sample 5 having a film density of 4.7 g/cm$^3$, in deposition. To examine this, the amount of water released from Sample 5 is measured by thermal desorption spectroscopy (TDS). The result of this measurement shows that the amount of water released from Sample 5 is 10 or more times the amount of water released from Sample 2 including a dense film. Therefore, in the case where a film deposited under the same conditions as Sample 5 is subjected to some sort of heat treatment or change over time, moisture or the like might be diffused in the film or release and entry of moisture might occur, for example. Thus, characteristics might be varied.

Further, in a low-density film, particularly in the film of Sample 5 having a film density of 4.7 g/cm$^3$, film quality in a film thickness direction might be non-uniform or composition in a film thickness direction might be varied. Therefore, a transistor including a low-density oxide semiconductor film might be greatly varied in electric characteristics.

An oxide semiconductor film having a film density higher than 6.0 g/cm$^3$ can be formed over a large-area glass substrate. The film quality of a dense film in a film thickness direction is more uniform than that of a low-density film. Therefore, a transistor including a dense oxide semiconductor film is less varied in electric characteristics, which is an advantage when mass production is conducted using large-area glass substrates. In order to form a large-area dense film, it is preferable that a substrate temperature in deposition by sputtering be set to be higher than or equal to 200°

C. so that a dense oxide semiconductor film is obtained shortly after deposition. When the substrate temperature is in the above-described range, the shrinkage of the substrate is suppressed. It is also preferable that a glass substrate which does not shrink much be used. Such a substrate is preferably a substrate having a thermal expansion coefficient of greater than or equal to $25 \times 10^{-7}/°$ C. and less than or equal to $50 \times 10^{-7}/°$ C. (more preferably, greater than or equal to $30 \times 10^{-7}/°$ C. and less than or equal to $40 \times 10^{-7}/°$ C.) and a strain point of higher than or equal to 650° C. and lower than or equal to 750° C. (more preferably, higher than or equal to 700° C. and lower than or equal to 740° C.). In the case of using a large-sized glass substrate having the size of the fifth generation (1000 mm×1200 mm or 1300 mm×1500 mm), the sixth generation (1500 mm×1800 mm), the seventh generation (1870 mm×2200 mm), the eighth generation (2200 mm×2500 mm), the ninth generation (2400 mm×2800 mm), the tenth generation (2880 mm×3130 mm), or the like, minute processing might become difficult owing to shrinkage of the substrate caused by heat treatment or the like in the manufacturing process of a semiconductor device. Therefore, in the case where the above-described large-sized glass substrate is used as the substrate, a substrate which does not shrink much is preferably used. For example, the substrate can be a large-sized glass substrate in which, after heat treatment which is performed for one hour at preferably 450° C., more preferably 500° C., the amount of shrinkage is less than or equal to 20 ppm, preferably less than or equal to 10 ppm, more preferably less than or equal to 5 ppm.

An experiment is performed as described below to obtain a diffusion profile. In the experiment, the behavior of oxygen and hydrogen in an amorphous IGZO film and a CAAC-OS film is examined with the use of isotopes ($^{18}O$ and deuterium (D)) as tracers.

Figure 21:
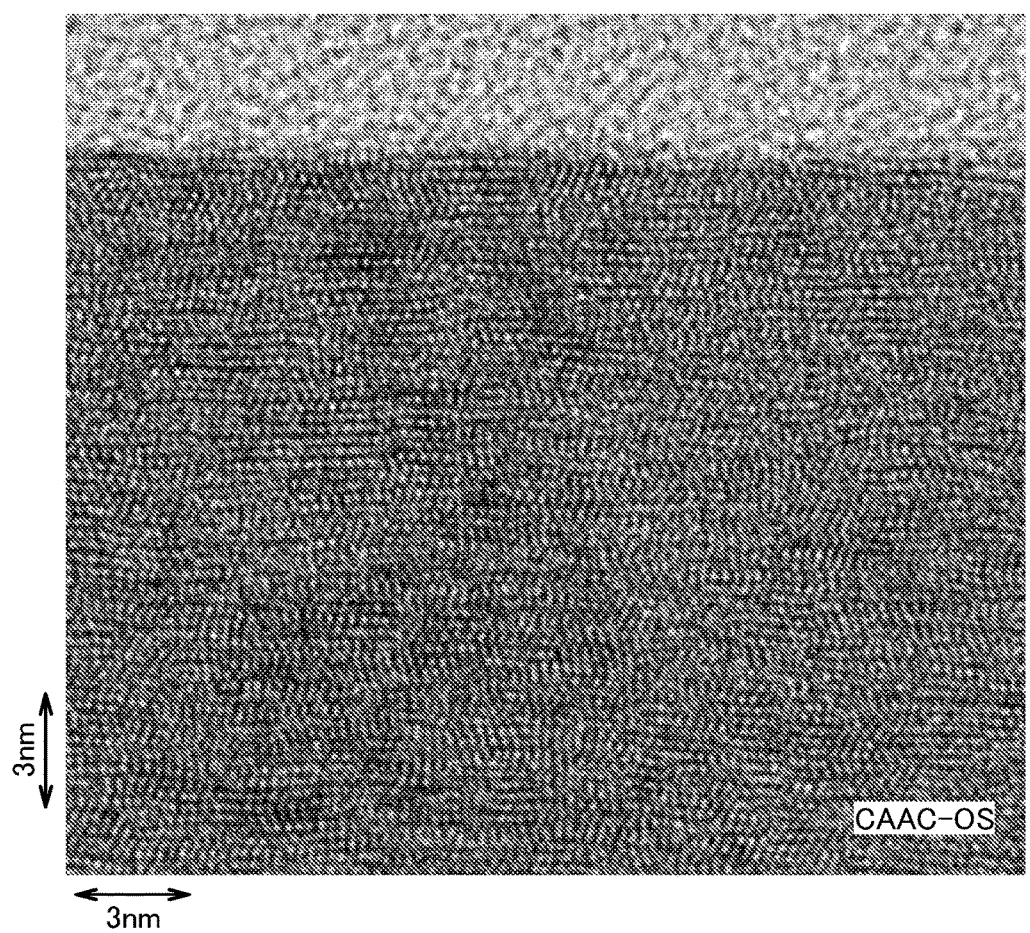
FIG. 21 is a cross-sectional TEM image of a surface of a CAAC-OS film in Sample B and vicinity thereof.

Sample A, Sample B, Sample C, and Sample D are each formed in such a manner that a 100-nm-thick thermal oxide film is deposited over a single crystal silicon substrate (thickness: 0.7 mm) having 5 inches on each side, and then, a 100-nm-thick IGZO film is deposited. Sample A and Sample C each include an amorphous IGZO film deposited under the same condition (a substrate temperature in deposition by sputtering is room temperature) as that of Sample 1. Therefore, the film density of the IGZO film in each of Sample A and Sample C can be regarded as being the same or substantially the same as that in Sample 1. Sample B and Sample D each include a CAAC-OS film deposited under the same condition (a substrate temperature in deposition by sputtering is 400° C.) as that of Sample 3. FIG. 21 is a cross-sectional TEM image of a surface of the CAAC-OS film in Sample B and vicinity thereof. The film density of the IGZO film in each of Sample B and Sample D can be regarded as being the same or substantially the same as that in Sample 3. Note that the substrate temperature in deposition by sputtering of Sample 3 is slightly different from that of Sample B and Sample D. This is because a glass substrate is used in Sample 3 while a single crystal silicon substrate is used in each of Sample B and Sample D.

Figure 18A:
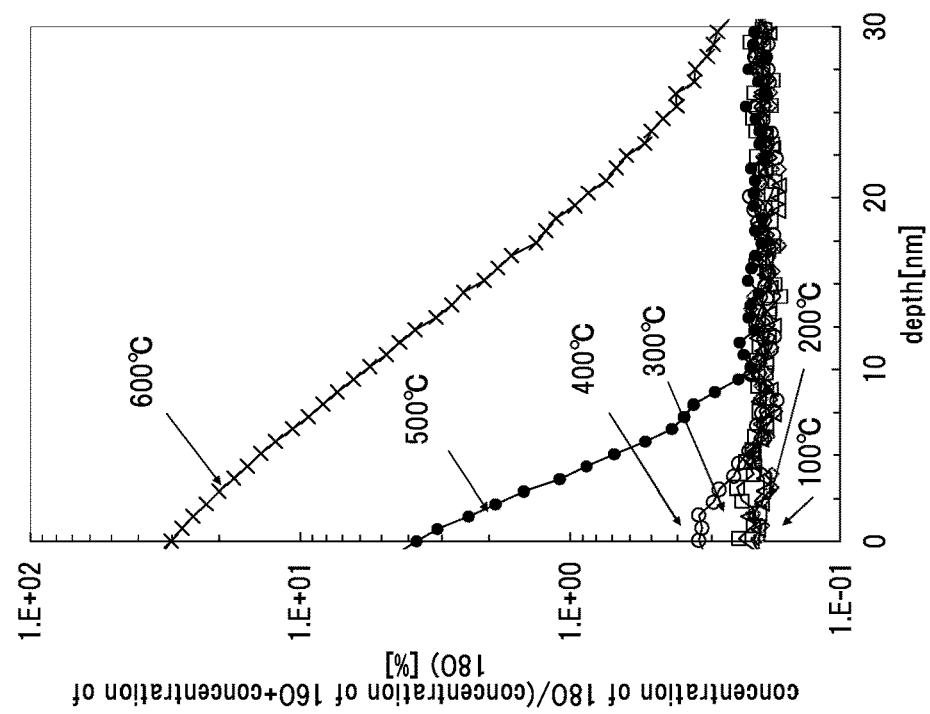
FIG. 18A shows a diffusion profile of $^{18}O$ in Sample A.
Figure 18B:
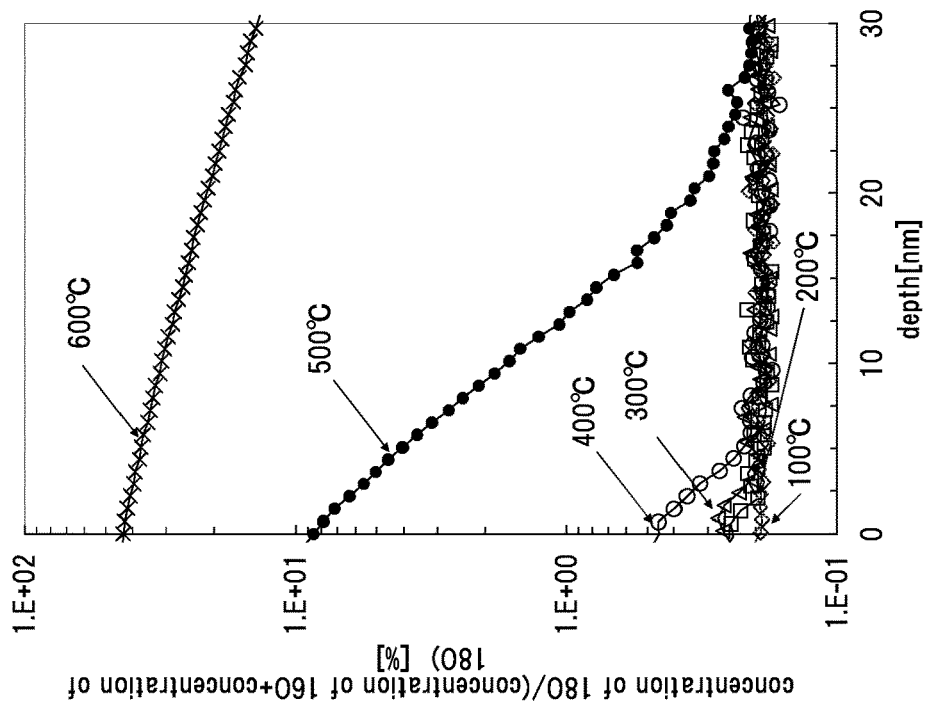
FIG. 18B shows a diffusion profile of $^{18}O$ in Sample B.

Sample A is placed on a hot plate for a microscope and subjected to heat treatment at heat treatment temperatures of 100° C., 200° C., 300° C., 400° C., 500° C., and 600° C. (heat treatment time: one hour) under an atmosphere gas of $^{18}O$, so that $^{18}O$ is diffused into the IGZO film. Then, the diffusion profile of $^{18}O$ is measured by SSDP-SIMS (measurement from a backside). FIG. 18A shows the measurement result. Similarly, the diffusion profile of $^{18}O$ in Sample B is also measured. FIG. 18B shows the measurement result.

Figure 19A:
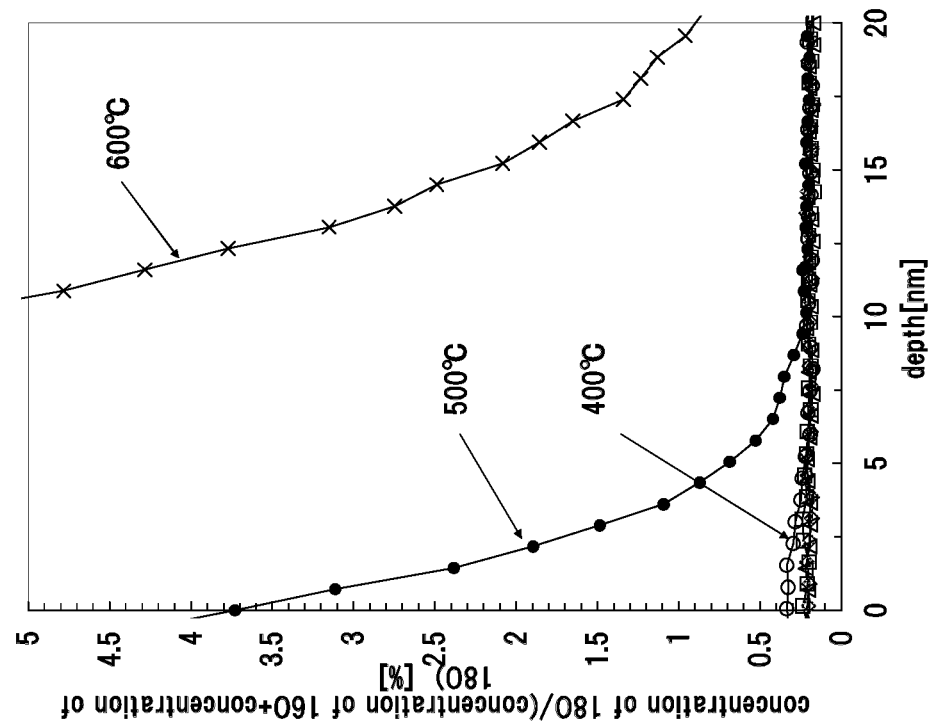
FIG. 19A shows the profile in FIG. 18A with a different scale of the vertical axis.
Figure 19B:
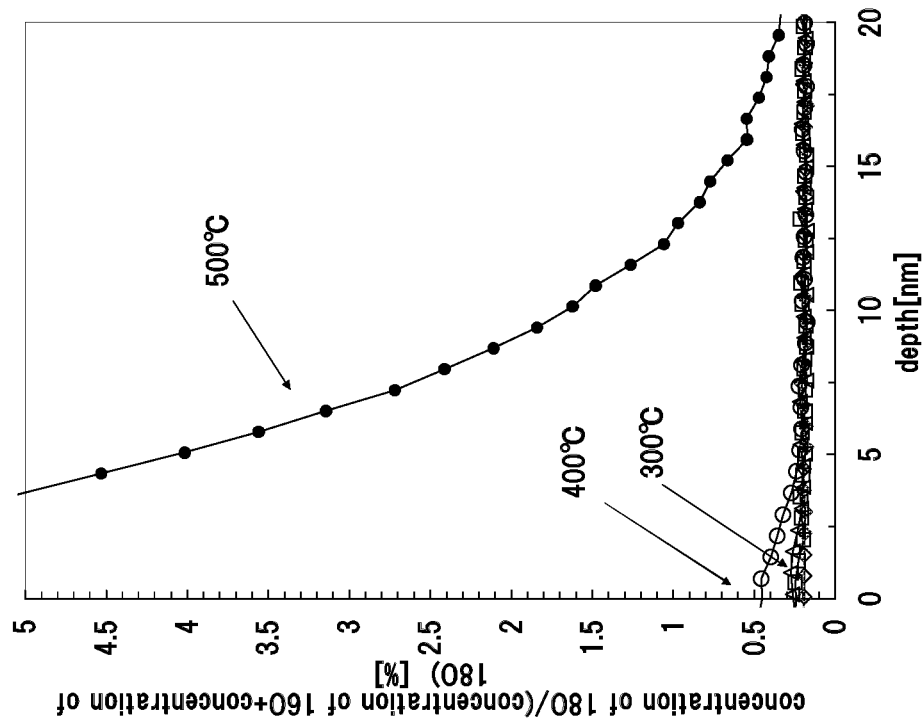
FIG. 19B shows the profile in FIG. 18B with a different scale of the vertical axis.

FIG. 19A shows the profile in FIG. 18A with a different scale of the vertical axis. FIG. 19B shows the profile in FIG. 18B with a different scale of the vertical axis.

FIGS. 18A and 19A show that, in Sample A, the diffusion length of $^{18}O$ at a heat treatment temperature of 400° C. is 6 nm, and the diffusion length of $^{18}O$ at a heat treatment temperature of 500° C. is 30 nm. Further, in Sample A, the concentration of $^{18}O$ in the vicinity of the surface at a heat treatment temperature of 400° C. is 0.5%, and the diffusion parameter $D_0$ is calculated to be $6 \times 10^{-6}$ cm²/s.

FIGS. 18B and 19B show that, in Sample B, the diffusion length of $^{18}O$ at a heat treatment temperature of 400° C. is 5 nm, and the diffusion length of $^{18}O$ at a heat treatment temperature of 500° C. is 10 nm. Further, in Sample B, the concentration of $^{18}O$ in the vicinity of the surface at a heat treatment temperature of 400° C. is 0.3%, and the diffusion parameter $D_0$ is calculated to be $1 \times 10^{-13}$ cm²/s.

Figure 20A:
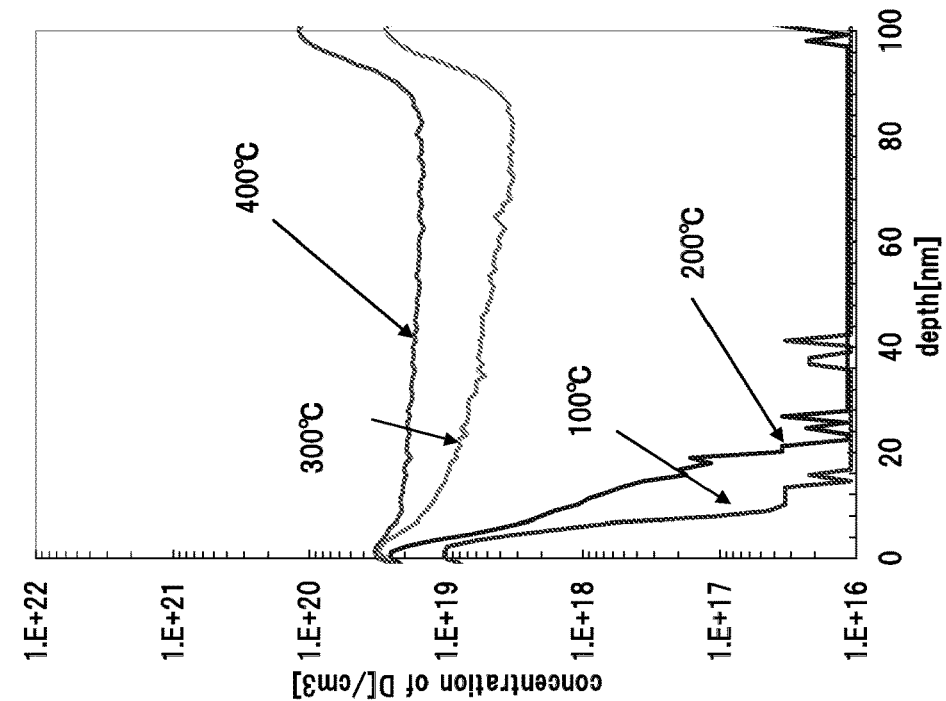
FIG. 20A shows a diffusion profile of deuterium in Sample C.

The diffusion profile of deuterium in Sample C and Sample D is measured in a manner similar to the measurement of the diffusion profile of $^{18}O$, except that a mixture gas of deuterium (5 wt. %) and an argon gas is used as an atmosphere gas. Heat treatment is performed at heat treatment temperatures of 100° C., 200° C., 300° C., and 400° C. (heat treatment time: one hour), so that deuterium is diffused into the IGZO film. Then, the diffusion profile of deuterium is measured by SSDP-SIMS. FIG. 20A shows the diffusion profile of deuterium in Sample C, and FIG. 20B shows the diffusion profile of deuterium in Sample D.

FIG. 20A shows that, in Sample C, the diffusion length of deuterium at a heat treatment temperature of 200° C. is 30 nm. Further, in Sample C, the concentration of D (1/cm³) in the vicinity of the surface at a heat treatment temperature of 200° C. is $2 \times 10^{-19}$, and the diffusion parameter $D_0$ is calculated to be $3 \times 10^{-12}$ cm²/s.

Figure 20B:
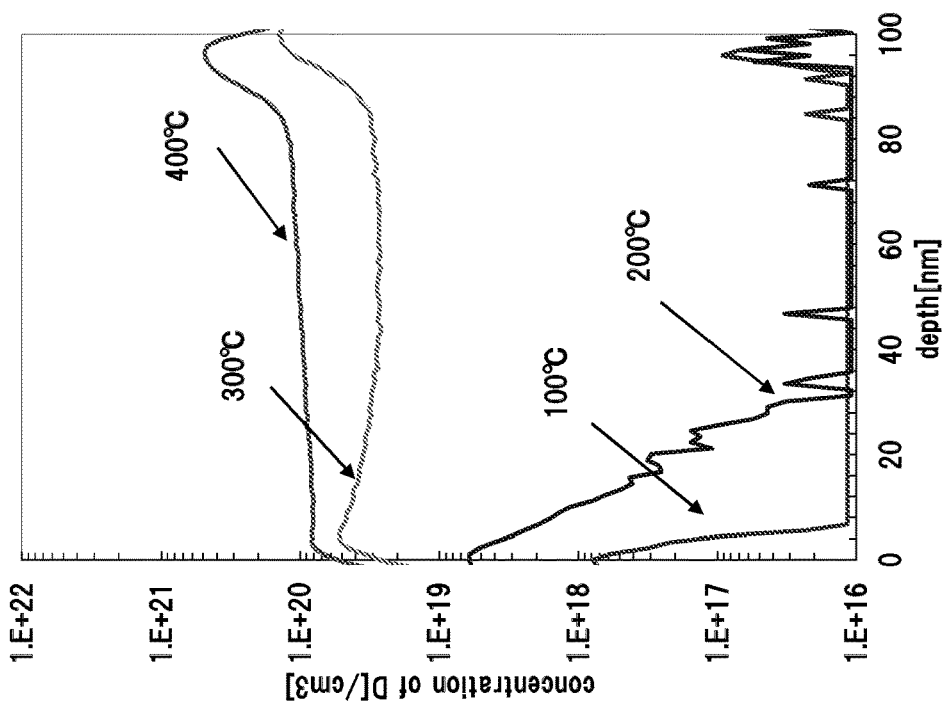
FIG. 20B shows a diffusion profile of deuterium in Sample D.

FIG. 20B shows that, in Sample D, the diffusion length of deuterium at a heat treatment temperature of 200° C. is 20 nm. Further, in Sample D, the concentration of D (1/cm³) in the vicinity of the surface at a heat treatment temperature of 200° C. is $6 \times 10^{-18}$, and the diffusion parameter $D_0$ is calculated to be $6 \times 10^{-15}$ cm²/s.

These results show that, in the CAAC-OS film (Sample B) which is denser than the amorphous IGZO film (Sample A), the mixture amount and the diffusion length of $^{18}O$ are suppressed. Similarly, in Sample D including a film denser than that of Sample C, the mixture amount and the diffusion length of deuterium are more suppressed than those in Sample C.

Therefore, the dense film can remain stable as compared to a low-density film. Accordingly, a semiconductor device including a dense oxide semiconductor film can achieve improvement in reliability.

It is effective to use a dense oxide semiconductor film in which the diffusion length is short and the mixture amount of impurity is suppressed for a transistor whose channel length is 30 nm or less or a transistor including an oxide semiconductor film with a film thickness of 30 nm or less. In such a dense oxide semiconductor film, voids are hardly included; even if voids are included, hydrogen or water does not enter the voids. Thus, a highly reliable semiconductor device can be obtained.

Figure 22:
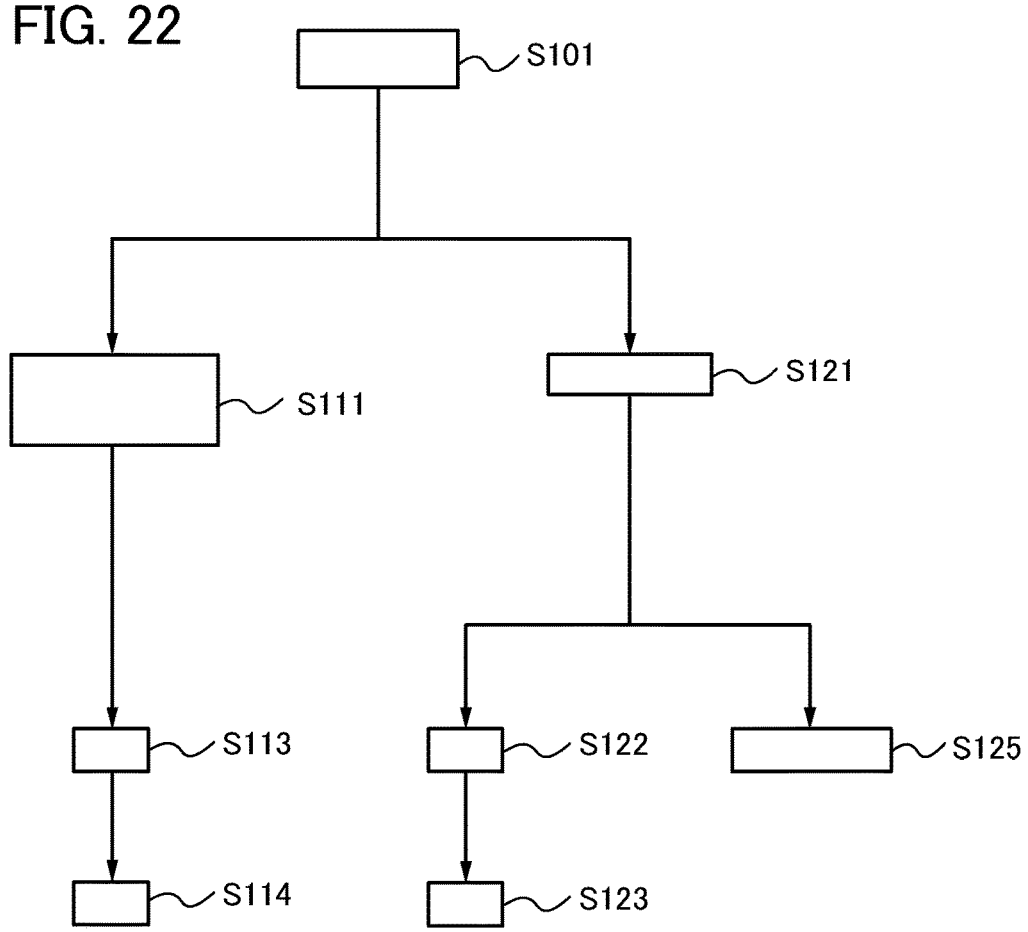
FIG. 22 is a flow chart showing a process for manufacturing a sputtering target of the present invention.

Here, a method for forming a sputtering target including an oxide semiconductor having a crystal region in which the direction of the c-axis is parallel to a normal vector of the surface of an oxide semiconductor will be described (see FIG. 22).

First, raw materials for the sputtering target are weighted (step S101).

Here, an $InO_X$ raw material (a raw material of In), a $GaO_Y$ raw material (a raw material of Ga), and a $ZnO_Z$ raw material (a raw material of Zn) are prepared as raw materials for the sputtering target. Note that X, Y, and Z are each a given positive number; for example, X, Y, and Z are 1.5, 1.5, and 1, respectively. It is needless to say that the above raw materials are an example, and raw materials can be selected as appropriate in order to obtain a desired compound. For example, a $MO_Y$ raw material may be used instead of the $GaO_Y$ raw material. Note that Sn, Hf, or Al can be used as M Alternatively, the following lanthanoid may be used as M La, Ce, Pr, Nd, Sm, Eu, Gd, Tb, Dy, Ho, Er, Tm, Yb, or Lu. Although the case where three kinds of raw materials are used is shown as an example in this embodiment, one embodiment of the present invention is not limited thereto. For example, this embodiment may be applied to the case where four or more kinds of raw materials are used or the case where one or two kinds of raw materials are used.

Next, the $InO_X$ raw material, the $GaO_Y$ raw material, and the $ZnO_Z$ raw material are mixed in a predetermined ratio.

For example, the predetermined ratio of the $InO_X$ raw material, the $GaO_Y$ raw material, and the $ZnO_Z$ raw material is 2:2:1, 8:4:3, 3:1:1, 1:1:1, 4:2:3, 1:1:2, 3:1:4, or 3:1:2 in a molar ratio. With the use of a mixed material having such a ratio, a sputtering target including an oxide semiconductor having a crystal region in which the direction of the c-axis is parallel to a normal vector of the surface of the oxide semiconductor can be easily obtained.

More specifically, in the case of forming a sputtering target of In—Ga—Zn-based oxide including In, Ga, and Zn at a composition ratio of 1:1:1 [atomic ratio], the raw materials are weighed so that $In_2O_3:Ga_2O_3:ZnO=1:1:2$ [molar ratio].

Note that also in the case where the $MO_Y$ raw material is used instead of the $GaO_Y$ raw material, the ratio of the $InO_X$ raw material, the $MO_Y$ raw material, and the $ZnO_Z$ raw material is 2:2:1, 8:4:3, 3:1:1, 1:1:1, 4:2:3, 1:1:2, 3:1:4, or 3:1:2 in a molar ratio.

A method for forming the sputtering target using a wet method is described. The raw materials for the sputtering target are weighed, and then, the raw materials are ground and mixed with a ball mill or the like to obtain compound powder. Ion-exchange water, an organic additive, and the like are further mixed into the compound powder to form slurry (step S111).

Then, the slurry is poured into a mold provided with a moisture-permeable filter, so that moisture is removed. The mold may be formed using a metal or an oxide and the upper shape thereof is rectangular or rounded. The mold can be provided with one or more holes at the bottom. With the plural holes, moisture of the slurry can be removed rapidly. A porous resin, cloth, or the like may be used for the filter.

Moisture is removed from the slurry in such a manner that water is removed under reduced pressure through the hole provided at the bottom of the mold into which the slurry is poured. Next, the slurry from which moisture has been removed under reduced pressure is naturally dried. Thus, the slurry from which moisture has been removed is molded into the internal shape of the mold (step S113).

Then, the molded body is baked in an oxygen ($O_2$) atmosphere at a temperature of 1400° C. (step S114). Through the above-described steps, the sputtering target can be obtained using a wet method.

Next, a method for forming the sputtering target using a dry method will be described. The raw materials for the sputtering target are weighed, and then, the raw materials are ground and mixed with a ball mill or the like to obtain compound powder (step S121).

The compound powder obtained is spread over a mold, and pressure is applied thereto with a pressing machine, whereby the compound powder is molded to obtain a molded body (step S122).

The molded body is placed in a heating apparatus such as an electric furnace and baked in an oxygen ($O_2$) atmosphere at a temperature of 1400° C. (step S123). Note that in this embodiment, a method in which a molding step and a baking step are separated as in step S122 and step S123 is referred to as a cold press method. As a comparison example of a cold press method, a hot press method in which a molding step and a baking step are concurrently performed will be described below.

First, the above-described steps up to step S121 are performed. The compound powder obtained is spread over the mold, and pressure is applied with a pressing machine to the compound powder provided on the inner side of the mold while the mold is heated in an argon (Ar) atmosphere at a temperature of 1000° C. In this manner, pressure is applied to the compound powder with the compound powder baked, whereby the compound powder can be molded to obtain a molded body (step S125).

When a wet method is selected from the above-described methods to form a sputtering target for deposition, an oxide semiconductor film having a crystal region in which the direction of the c-axis is parallel to a normal vector of the surface is easily obtained as compared to the case using a cold press method or a hot press method. It is needless to say that a cold press method may be employed to form a sputtering target; also in that case, an oxide semiconductor film having a crystal region in which the direction of the c-axis is parallel to a normal vector of the surface can be obtained with the use of such a sputtering target depending on a deposition condition.

[Embodiment 2]

Figure 3C:
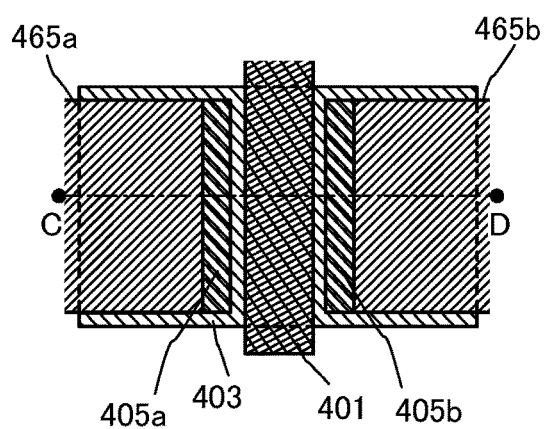
Figure 3D:
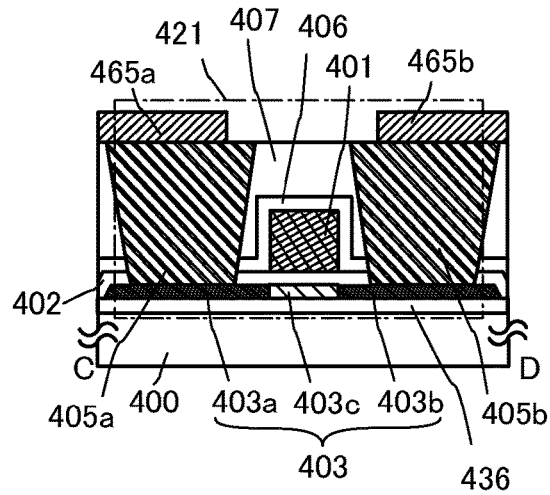

In this embodiment, an example of a structure which is different from Embodiment 1 is described using FIGS. 3C and 3D. Portions which are the same as those in Embodiment 1 are denoted by the same reference numerals, and detail description thereof is skipped for simplicity.

FIG. 3C is a plan view of a transistor 421, and FIG. 3D is a cross-sectional view taken along line C-D in FIG. 3C. The transistor 421 illustrated in FIG. 3C includes a base insulating layer 436 provided over a substrate 400, an oxide semiconductor film 403 over the base insulating layer 436, a gate insulating layer 402 over the oxide semiconductor film 403, a gate electrode layer 401 provided over the oxide semiconductor film 403 with the gate insulating layer 402 provided therebetween, an insulating layer 406 and an insulating layer 407 which are provided over the gate electrode layer 401, a source electrode layer 405a and a drain electrode layer 405b which are electrically connected to the oxide semiconductor film 403 through openings formed in the gate insulating layer 402, the insulating layer 406, and the insulating layer 407, and a source wiring layer 465a and a drain wiring layer 465b which are provided on and in contact with the source electrode layer 405a and the drain electrode layer 405b, respectively.

In the transistor 421, the source electrode layer 405a and the drain electrode layer 405b are formed to fill the openings formed in the gate insulating layer 402 and the insulating layers 406 and 407 to be in contact with the oxide semiconductor film 403. These electrode layers are formed as follows: a conductive film is formed over the insulating layer 407 to fill the openings which reach the oxide semiconductor film 403 and are formed in the gate insulating layer 402 and the insulating layers 406 and 407; a polishing treatment is performed on the conductive film to remove a part of the conductive film (a region which is overlapped with at least the gate electrode layer 401) just above the insulating layer 407, so that the conductive film is divided.

In the transistor 421, the distance between the source electrode layer 405a and the drain electrode layer 405b in the channel length direction is shorter than the distance between the source wiring layer 465a and the drain wiring layer 465b in the channel length direction. Further, the distance between the source electrode layer 405a and the drain electrode layer 405b in the channel length direction is shorter in the transistor 421 than in the transistor 420 described in Embodiment 1; thus, the transistor 421 is smaller than the transistor 420.

Further, for the gate electrode layer 401, the source electrode layer 405a, the drain electrode layer 405b, the source wiring layer 465a, and the drain wiring layer 465b, a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like can be used.

In this embodiment, the oxide semiconductor film 403 is deposited by a sputtering method using a sputtering target of In—Ga—Zn-based oxide which is polycrystalline and has a density of 6.3 g/cm$^3$ and an atomic ratio where In:Ga:Zn=1:1:1. The back pressure of a deposition chamber is set to be lower than or equal to $5 \times 10^{-3}$ Pa, preferably $6 \times 10^{-5}$ Pa. Pressure in deposition is set to be lower than 2 Pa, preferably lower than or equal to 0.4 Pa. In the deposition chamber before or during deposition, the partial pressure of water which is measured using Q-mass is lower than or equal to $10^{-3}$ Pa, preferably lower than or equal to $10^{-4}$ Pa, more preferably lower than or equal to $10^{-5}$ Pa. The temperature of the substrate in deposition by sputtering is set to 400° C. The thusly obtained oxide semiconductor film having a film density of 6.3 g/cm$^3$ and a crystal part is used as the oxide semiconductor film 403.

When such a dense oxide semiconductor film which is close to single crystal is used as the oxide semiconductor film 403, a semiconductor device can achieve improvement in reliability.

This embodiment can be freely combined with Embodiment 1.

[Embodiment 3]

Figure 4A:
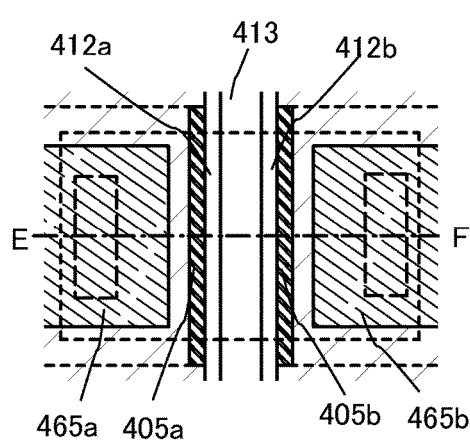
FIGS. 4A to 4D are plan views and cross-sectional views which illustrate embodiments of the present invention.
Figure 4B:
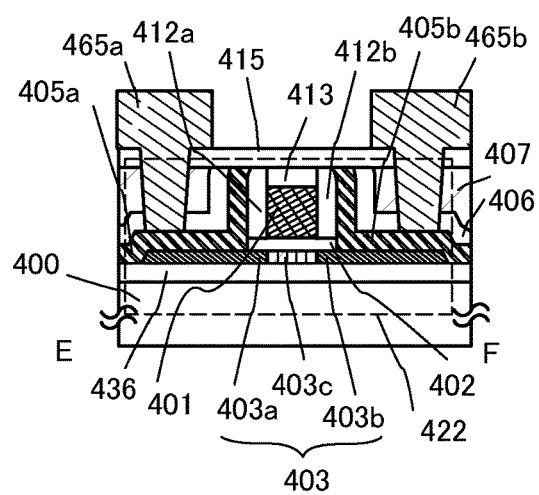

In this embodiment, an example of a structure which is different from Embodiment 1 is described using FIGS. 4A and 4B. Portions which are the same as those in Embodiment 1 are denoted by the same reference numerals, and detail description thereof is skipped for simplicity.

FIG. 4A is a plan view of a transistor 422, and FIG. 4B is a cross-sectional view taken along line E-F in FIG. 4A.

As illustrated in FIG. 4B that is the cross-sectional view in the channel length direction, the transistor 422 includes over a substrate 400 provided with a base insulating layer 436, an oxide semiconductor film 403 including a channel formation region 403c and low-resistance regions 403a and 403b, a source electrode layer 405a, a drain electrode layer 405b, a gate insulating layer 402, a gate electrode layer 401, sidewall insulating layers 412a and 412b provided on sides of the gate electrode layer 401, an insulating layer 413 provided over the gate electrode layer 401, an insulating layer 406 and an insulating layer 407 which are provided over the source electrode layer 405a and the drain electrode layer 405b, and an insulating layer 415 covering the transistor 422. Respective openings reaching the source electrode layer 405a and the drain electrode layer 405b are formed in the insulating layers 406, 407, and 415, and a source wiring layer 465a and a drain wiring layer 465b are provided over the insulating layer 415.

The source electrode layer 405a and the drain electrode layer 405b are formed as follows: a conductive film is formed over the insulating layer 413 to cover the sidewall insulating layers 412a and 412b; and a polishing treatment is performed on the conductive film to remove part of the conductive film (a region which is overlapped with at least the gate electrode layer 401) just above the insulating layer 413, so that the conductive film is divided.

The source electrode layer 405a and the drain electrode layer 405b are in contact with the sidewall insulating layer 412a and the sidewall insulating layer 412b, respectively, and an exposed portion of a top surface of the oxide semiconductor film 403. Therefore, the distance between the gate electrode layer 401 and a region (contact region) in which the oxide semiconductor film 403 is in contact with the source electrode layer 405a or the drain electrode layer 405b corresponds to a width of the sidewall insulating layer 412a or 412b in the channel length direction, which enables miniaturization of the transistor and less variation in electric characteristics of the transistor caused by the manufacturing process.

The reduction in the distance between the gate electrode layer 401 and the region (contact region) in which the oxide semiconductor film 403 is in contact with the source electrode layer 405a or the drain electrode layer 405b leads to a reduction in the resistance between the gate electrode layer 401 and the region (contact region) in which the oxide semiconductor film 403 is in contact with the source electrode layer 405a or the drain electrode layer 405b, whereby the on-state characteristics of the transistor 422 can be increased.

The gate insulating layer 402 can be formed using a silicon oxide, a gallium oxide, an aluminum oxide, a silicon nitride, a silicon oxynitride, an aluminum oxynitride, a silicon nitride oxide, or the like. It is preferable that the gate insulating layer 402 include oxygen in a portion which is in contact with the oxide semiconductor film 403. In particular, it is preferable that the oxygen content of the gate insulating layer 402 in (a bulk of) the film be in excess of that in the stoichiometric composition; for example, in the case where a silicon oxide film is used as the gate insulating layer 402, the composition formula thereof is preferably $SiO_{2+\alpha}$ ($\alpha > 0$). In this embodiment, a silicon oxide film of $SiO_{2+\alpha}$ ($\alpha > 0$) is used as the gate insulating layer 402. By using this silicon oxide film as the gate insulating layer 402, oxygen can be supplied to the oxide semiconductor film 403, leading to favorable characteristics. Further, the gate insulating layer 402 is preferably formed in consideration of the size of a transistor to be formed and the step coverage with the gate insulating layer 402.

The use of a high-k material such as a hafnium oxide, an yttrium oxide, a hafnium silicate ($HfSi_xO_y$ (X>0, Y>0)), a hafnium silicate to which nitrogen is added, a hafnium aluminate ($HfAl_xO_y$ (x>0, y>0)), or a lanthanum oxide for the gate insulating layer 402 enables a gate leakage current to be less. Further, the gate insulating layer 402 has either a single-layer structure or a stacked-layer structure.

Further, for the base insulating layer 436, the insulating layer 413, the sidewall insulating layers 412a and 412b, and the insulating layers 406, 407, and 415, materials appropriately selected from the above-described materials for the gate insulating layer can be used. Any of the insulating layers 407 and 415 can also be formed using an organic material such as polyimide resin, an acrylic resin, or a benzocyclobutene-based resin as well as the above-described materials.

In this embodiment, the oxide semiconductor film 403 is deposited by a sputtering method using a sputtering target of In—Ga—Zn-based oxide which is polycrystalline and has a density of 6.3 g/cm$^3$ and an atomic ratio where In:Ga:Zn=1:1:1. The back pressure of a deposition chamber is set to be lower than or equal to $5\times10^{-3}$ Pa, preferably $6\times10^{-5}$ Pa. Pressure in deposition is set to be lower than 2 Pa, preferably lower than or equal to 0.4 Pa. In the deposition chamber before or during deposition, the partial pressure of water which is measured using Q-mass is lower than or equal to $10^{-3}$ Pa, preferably lower than or equal to $10^{-4}$ Pa, more preferably lower than or equal to $10^{-5}$ Pa. The temperature of the substrate in deposition by sputtering is set to 300° C. The thusly obtained oxide semiconductor film having a film density of 6.2 g/cm$^3$ and a crystal part is used as the oxide semiconductor film 403.

When such a dense oxide semiconductor film is used as the oxide semiconductor film 403, a semiconductor device can achieve improvement in reliability.

This embodiment can be freely combined with Embodiment 1 or Embodiment 2.

[Embodiment 4]

Figure 4C:
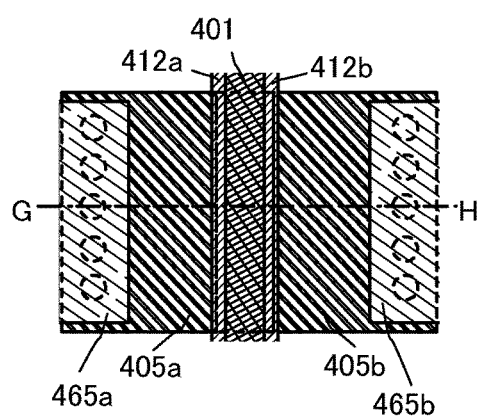
Figure 4D:
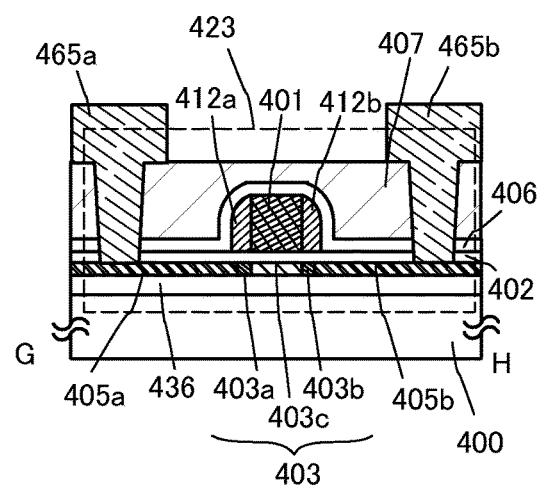

In this embodiment, an example of a structure which is different from Embodiment 2 is described using FIGS. 4C and 4D. Portions which are the same as those in Embodiment 2 are denoted by the same reference numerals, and detail description thereof is skipped for simplicity.

FIG. 4C is a plan view of a transistor 423, and FIG. 4D is a cross-sectional view taken along line G-H in FIG. 4C.

The transistor 423 illustrated in FIGS. 4C and 4D includes a base insulating layer 436 provided over a substrate 400, a source electrode layer 405a and a drain electrode layer 405b, an oxide semiconductor film 403 including a channel formation region 403c and low-resistance regions 403a and 403b which are sandwiched between the source electrode layer 405a and the drain electrode layer 405b, a gate insulating layer 402 which is in contact with respective top surfaces of the oxide semiconductor film 403 and the source electrode layer 405a and the drain electrode layer 405b, a gate electrode layer 401 which is provided over the oxide semiconductor film 403 with the gate insulating layer 402 provided therebetween, a sidewall insulating layer 412a which is in contact with one side of the gate electrode layer 401 in the channel length direction, a sidewall insulating layer 412b which is in contact with the other side of the gate electrode layer 401 in the channel length direction, insulating layers 406 and 407 which cover the gate electrode layer 401, and a source wiring layer 465a and a drain wiring layer 465b which are provided over the insulating layer 407 and be in contact with the source electrode layer 405a and the drain electrode layer 405b, respectively.

The low-resistance regions 403a and 403b are not necessarily provided in the oxide semiconductor film 403. In that case, one side surface of the channel formation region 403c in the channel length direction is in contact with the source electrode layer 405a, and the other side surface of the channel formation region 403c in the channel length direction is in contact with the drain electrode layer 405b.

The level of the top surface of the oxide semiconductor film 403 is substantially equal to that of each of the top surfaces of the drain electrode layer 405b and the source electrode layer 405a. A conductive film for forming the source electrode layer and the drain electrode layer (including a wiring formed of the same layer) is formed over an island-shaped oxide semiconductor film, and a polishing (cutting or grinding) treatment is performed thereon to remove part of the conductive film to expose the top surface of the oxide semiconductor film 403.

In this embodiment, the oxide semiconductor film 403 is deposited by a sputtering method using a sputtering target of In—Ga—Zn-based oxide which is polycrystalline and has a density of 6.3 g/cm$^3$ and an atomic ratio where In:Ga:Zn=1:1:1. The back pressure of a deposition chamber is set to be lower than or equal to $5\times10^{-3}$ Pa, preferably $6\times10^{-5}$ Pa. Pressure in deposition is set to be lower than 2 Pa, preferably lower than or equal to 0.4 Pa. In the deposition chamber before or during deposition, the partial pressure of water which is measured using Q-mass is lower than or equal to $10^{-3}$ Pa, preferably lower than or equal to $10^{-4}$ Pa, more preferably lower than or equal to $10^{-5}$ Pa. The temperature of the substrate in deposition by sputtering is set to 300° C. The thusly obtained oxide semiconductor film having a film density of 6.2 g/cm$^3$ and a crystal part is used as the oxide semiconductor film 403.

When such a dense oxide semiconductor film is used as the oxide semiconductor film 403, a semiconductor device can achieve improvement in reliability.

This embodiment can be freely combined with Embodiment 1, Embodiment 2, or Embodiment 3.

[Embodiment 5]

Examples of a top-gate structure are described in Embodiments 1 to 4. In this embodiment, an example of a bottom-gate structure (also referred to as a channel stop structure) is described.

FIG. 5A is a plan view of a transistor 424, and FIG. 5B is a cross-sectional view taken along line I-J in FIG. 5A.

As illustrated in FIG. 5B that is the cross-sectional view in the channel length direction, the transistor 424 includes, over a substrate 400 provided with a base insulating layer 436, a gate electrode layer 401, a gate insulating layer 402, an oxide semiconductor film 403, an insulating layer 414, a source electrode layer 405a, and a drain electrode layer 405b.

As the substrate 400, it is possible to use any of a variety of glass substrates that are used in the electronics industry such as aluminosilicate glass, barium borosilicate glass, and aluminoborosilicate glass. Note that as the substrate, a substrate having a strain point of higher than or equal to 650° C. and lower than or equal to 750° C. is preferably used.

The insulating layer 414 in contact with the oxide semiconductor film 403 is provided over a channel formation region of the oxide semiconductor film 403, which overlaps with the gate electrode layer 401, and functions as a channel protective film. The insulating layer 414 has an opening 435a and an opening 435b which reach the oxide semiconductor film 403 and whose inner walls are covered with the source electrode layer 405a and the drain electrode layer 405b, respectively. Accordingly, the insulating layer 414 covers the periphery of the oxide semiconductor film 403, and thus functions also as an interlayer insulating film. Not only the gate insulating film 402 but also the insulating layer 414 functioning as an interlayer insulating film is provided at the intersection of a gate wiring and a source wiring, whereby parasitic capacitance can be reduced.

The insulating layer 414 can be formed using a silicon oxide, a gallium oxide, an aluminum oxide, a silicon nitride, a silicon oxynitride, an aluminum oxynitride, a silicon nitride oxide, or the like.

Further, the insulating layer 414 is either a single layer or a stacked layer. In the case of the stacked layer, the pattern shape may be changed by a plurality of etching steps, so that an end portion of a lower layer is not aligned with an end portion of an upper layer, i.e., the end portion of the lower layer protrudes out of the end portion of the upper layer in the cross-sectional structure.

In this embodiment, the oxide semiconductor film 403 is deposited by a sputtering method using a sputtering target of In—Ga—Zn-based oxide which is polycrystalline and has a density of 6.3 g/cm$^3$ and an atomic ratio where In:Ga:Zn=1:1:1. The back pressure of a deposition chamber is set to be lower than or equal to $5\times10^{-3}$ Pa, preferably $6\times10^{-5}$ Pa. Pressure in deposition is set to be lower than 2 Pa, preferably lower than or equal to 0.4 Pa. In the deposition chamber before or during deposition, the partial pressure of water which is measured using Q-mass is lower than or equal to $10^{-3}$ Pa, preferably lower than or equal to $10^{-4}$ Pa, more preferably lower than or equal to $10^{-5}$ Pa. The temperature of the substrate in deposition by sputtering is set to 300° C. The thusly obtained oxide semiconductor film having a film density of 6.2 g/cm$^3$ and a crystal part is used as the oxide semiconductor film 403.

When such a dense oxide semiconductor film is used as the oxide semiconductor film 403, a semiconductor device can achieve improvement in reliability.

When a dense oxide semiconductor film is used as a channel formation region of a transistor serving as a switching element of a display device, the electric characteristics of the display device can be less varied.

This embodiment can be freely combined with any one of Embodiments 1 to 4.

[Embodiment 6]

In this embodiment, an example of a structure which is partly different from Embodiment 5 is described using FIGS. 5C and 5D.

FIG. 5C is a plan view of a transistor 425, and FIG. 5D is a cross-sectional view taken along line K-L in FIG. 5C.

As illustrated in FIG. 5D that is the cross-sectional view in the channel length direction, the transistor 425 includes, over a substrate 400 provided with a base insulating layer 436, a gate electrode layer 401, a gate insulating layer 402, an oxide semiconductor film 403, an insulating layer 414, a source electrode layer 405a, and a drain electrode layer 405b.

The insulating layer 414 in contact with the oxide semiconductor film 403 is provided over a channel formation region of the oxide semiconductor film 403, which overlaps with the gate electrode layer 401, and functions as a channel protective film.

In the plan view of FIG. 5C, the source electrode layer 405a and the drain electrode layer 405b are provided to cover a periphery of the oxide semiconductor film 403. However, embodiments of the present invention are not limited thereto; for example, as illustrated in a plan view of FIG. 5E, the source electrode layer 405a and the drain electrode layer 405b may be provided to expose the periphery of the oxide semiconductor film 403, in the case of which the exposed portion of the oxide semiconductor film 403 may be contaminated by an etching gas or the like in an etching for formation of the source electrode layer 405a and the drain electrode layer 405b. In that case, after the etching for the formation of the source electrode layer 405a and the drain electrode layer 405b, a plasma treatment (with an N$_2$O gas or an O$_2$ gas) or cleaning (with water, oxalic acid, or diluted hydrofluoric acid (1% dilute hydrofluoric acid is diluted 100-fold)) is preferably performed on the exposed portion of the oxide semiconductor film 403. The structure illustrated in FIG. 5E is the same as that illustrated in FIG. 5C except the pattern shape of the oxide semiconductor film 403.

In this embodiment, the oxide semiconductor film 403 is deposited by a sputtering method using a sputtering target of In—Ga—Zn-based oxide which is polycrystalline and has a density of 6.3 g/cm$^3$ and an atomic ratio where In:Ga:Zn=1:1:1. The back pressure of a deposition chamber is set to be lower than or equal to $5\times10^{-3}$ Pa, preferably $6\times10^{-5}$ Pa. Pressure in deposition is set to be lower than 2 Pa, preferably lower than or equal to 0.4 Pa. In the deposition chamber before or during deposition, the partial pressure of water which is measured using Q-mass is lower than or equal to $10^{-3}$ Pa, preferably lower than or equal to $10^{-4}$ Pa, more preferably lower than or equal to $10^{-5}$ Pa. The temperature of the substrate in deposition by sputtering is set to 400° C. The thusly obtained oxide semiconductor film having a film density of 6.3 g/cm$^3$ and a crystal part is used as the oxide semiconductor film 403.

When such a dense oxide semiconductor film is used as the oxide semiconductor film 403, a semiconductor device can achieve improvement in reliability.

When a dense oxide semiconductor film is used as a channel formation region of a transistor serving as a switching element of a display device, the electric characteristics of the display device can be less varied.

This embodiment can be freely combined with any one of Embodiments 1 to 5.

[Embodiment 7]

Figure 6A:
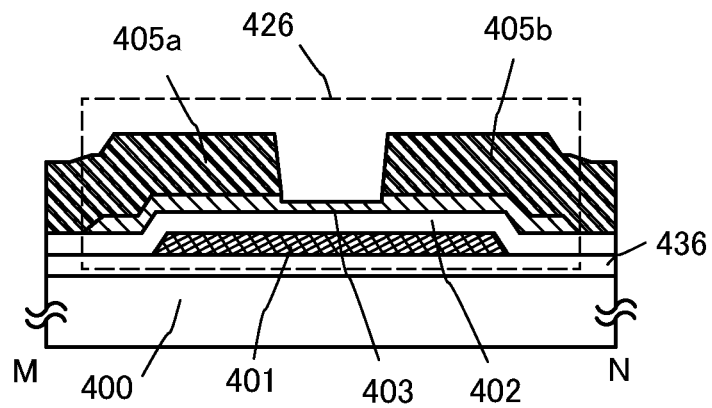
FIGS. 6A to 6C are plan views and a cross-sectional view which illustrate one embodiment of the present invention.
Figure 6B:
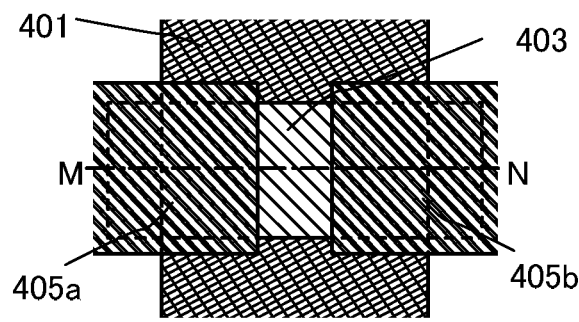

In this embodiment, an example of a structure which is partly different from Embodiment 5 is described using FIGS. 6A and 6B.

In this embodiment, an example of a bottom-gate structure (also referred to as a channel etch structure) is described.

FIG. 6B is a plan view of a transistor 426, and FIG. 6A is a cross-sectional view taken along line M-N in FIG. 6B.

As illustrated in FIG. 6A that is the cross-sectional view in the channel length direction, the transistor 426 includes, over a substrate 400 provided with a base insulating layer 436, a gate electrode layer 401, a gate insulating layer 402, an oxide semiconductor film 403, a source electrode layer 405a, and a drain electrode layer 405b.

Figure 6C:
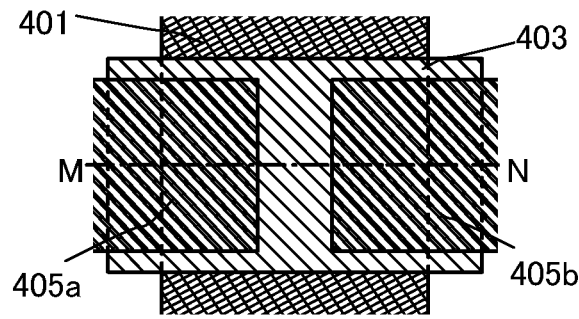

In the plan view of FIG. 6B, the source electrode layer 405a and the drain electrode layer 405b are provided to cover a periphery of the oxide semiconductor film 403. However, embodiments of the present invention are not limited thereto; for example, as illustrated in a plan view of FIG. 6C, the source electrode layer 405a and the drain electrode layer 405b may be provided to expose the periphery of the oxide semiconductor film 403, in the case of which the exposed portion of the oxide semiconductor film 403 may be contaminated by an etching gas or the like in an etching for formation of the source electrode layer 405a and the drain electrode layer 405b. In that case, after the etching for the formation of the source electrode layer 405a and the drain electrode layer 405b, a plasma treatment (with an N$_2$O gas or an O$_2$ gas) or cleaning (with water, oxalic acid, or diluted hydrofluoric acid (1% dilute hydrofluoric acid is diluted 100-fold)) is preferably performed on the exposed portion of the oxide semiconductor film 403. The structure illustrated in FIG. 6C is the same as that illustrated in FIG. 6B except the pattern shape of the oxide semiconductor film 403.

In this embodiment, the oxide semiconductor film 403 is deposited by a sputtering method using a sputtering target of In—Ga—Zn-based oxide which is polycrystalline and has a density of 6.3 g/cm$^3$ and an atomic ratio where In:Ga:Zn=1: 1:1. The back pressure of a deposition chamber is set to be lower than or equal to 5×10$^{-3}$ Pa, preferably 6×10$^{-5}$ Pa. Pressure in deposition is set to be lower than 2 Pa, preferably lower than or equal to 0.4 Pa. In the deposition chamber before or during deposition, the partial pressure of water which is measured using Q-mass is lower than or equal to 10$^{-3}$ Pa, preferably lower than or equal to 10$^{-4}$ Pa, more preferably lower than or equal to 10$^{-5}$ Pa. The temperature of the substrate in deposition by sputtering is set to 400° C. The thusly obtained oxide semiconductor film having a film density of 6.3 g/cm$^3$ and a crystal part is used as the oxide semiconductor film 403.

When such a dense oxide semiconductor film is used as the oxide semiconductor film 403, a semiconductor device can achieve improvement in reliability.

When a dense oxide semiconductor film is used as a channel formation region of a transistor serving as a switching element of a display device, the electric characteristics of the display device can be less varied.

This embodiment can be freely combined with any one of Embodiments 1 to 6.

[Embodiment 8]

A semiconductor device having a display function (also referred to as a display device) can be manufactured using the transistor described in Embodiment 5, 6, or 7. Further, part or all of the driver circuitry which includes the transistor can be formed over a substrate where a pixel portion is formed, whereby a system-on-panel can be formed.

Figure 7A:
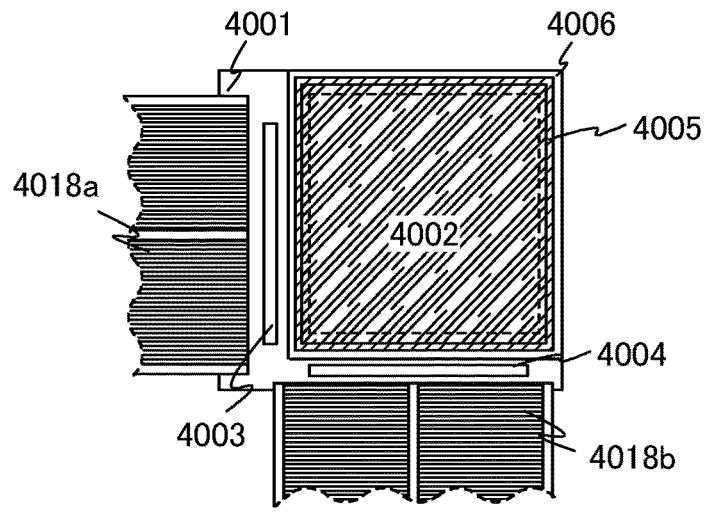
FIGS. 7A to 7C are plan views illustrating one embodiment of a semiconductor device.

In FIG. 7A, a sealant 4005 is provided so as to surround a pixel portion 4002 provided over a first substrate 4001, and the pixel portion 4002 is sealed with a second substrate 4006. In FIG. 7A, a scan line driver circuit 4004 and a signal line driver circuit 4003 which are each formed using a single crystal semiconductor film or a polycrystalline semiconductor film over a substrate separately prepared are mounted in a region that is different from the region surrounded by the sealant 4005 over the first substrate 4001. A variety of signals and potentials are supplied to the signal line driver circuit 4003 and the scan line driver circuit 4004 or the pixel portion 4002 from a flexible printed circuit (FPCs) 4018a, 4018b.

Figure 7B:
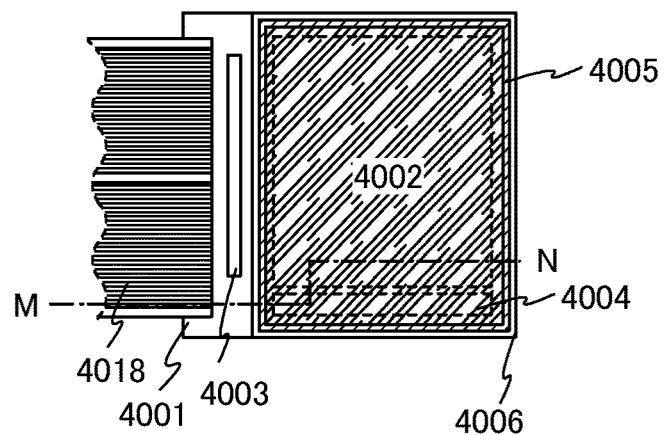
Figure 7C:
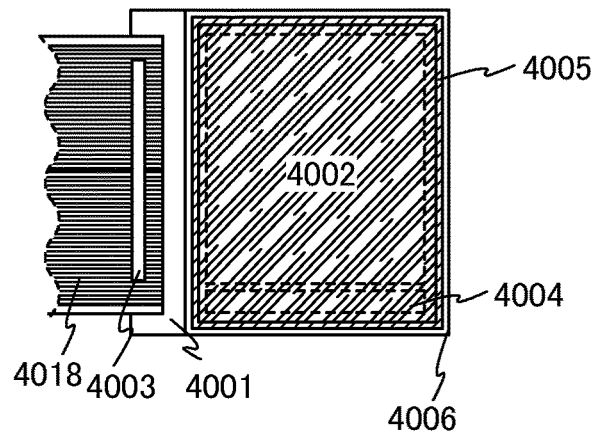

In FIGS. 7B and 7C, a sealant 4005 is provided so as to surround a pixel portion 4002 and a scan line driver circuit 4004 which are provided over a first substrate 4001. A second substrate 4006 is provided over the pixel portion 4002 and the scan line driver circuit 4004. Consequently, the pixel portion 4002 and the scan line driver circuit 4004 are sealed together with a display element by the first substrate 4001, the sealant 4005, and the second substrate 4006. In FIGS. 7B and 7C, a signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 7B and 7C, a variety of signals and potentials are supplied to the signal line driver circuit 4003, the scan line driver circuit 4004, and the pixel portion 4002 from an FPC 4018.

Although FIGS. 7B and 7C each illustrate an example in which the signal line driver circuit 4003 is formed separately and mounted on the first substrate 4001, embodiments of the present invention are not limited to this structure. The scan line driver circuit may be formed separately and then mounted, or only part of the signal line driver circuit or part of the scan line driver circuit may be formed separately and then mounted.

There is no particular limitation on the connection method of a separately formed driver circuit; a chip on glass (COG) method, a wire bonding method, a tape automated bonding (TAB) method, or the like can be used. FIG. 7A illustrates an example in which the signal line driver circuit 4003 and the scan line driver circuit 4004 are mounted by a COG method. FIG. 7B illustrates an example in which the signal line driver circuit 4003 is mounted by a COG method. FIG. 7C illustrates an example in which the signal line driver circuit 4003 is mounted by a TAB method.

The display device includes, in its category, a panel in which a display element is sealed, and a module in which an IC including a controller or the like is mounted on the panel.

The "display device" in this specification means an image display device, a display device, or a light source (including a lighting device). Further, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit provided over the first substrate include a plurality of transistors, and the transistor described in Embodiment 5, 6, or 7 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Further, a display medium whose contrast is changed by an electric effect, such as electronic ink, can be used.

One embodiment of the semiconductor device is described with reference to FIGS. 7A to 7C, FIGS. 8A and 8B, and FIGS. 9A and 9B. FIGS. 9A and 9B correspond to cross-sectional views taken along line M-N in FIG. 7B.

As illustrated in FIGS. 7A to 7C and FIGS. 9A and 9B, the semiconductor device includes a connection terminal electrode 4015 and a terminal electrode 4016. The connection terminal electrode 4015 and the terminal electrode 4016 are electrically connected to a terminal included in the FPC 4018, 4018a, 4018b through an anisotropic conductive film 4019.

The connection terminal electrode 4015 is formed of the same conductive film as a first electrode layer 4030, and the terminal electrode 4016 is formed of the same conductive film as gate electrode layers of transistors 4010 and 4011.

The pixel portion 4002 and the scan line driver circuit 4004 which are provided over the first substrate 4001 include a plurality of transistors; in FIGS. 7A to 7C and FIGS. 9A and 9B, the transistor 4010 included in the pixel portion 4002 and the transistor 4011 included in the scan line driver circuit 4004 are shown. In FIG. 9A, an insulating film 4020 is provided over the transistors 4010 and 4011, and in FIG. 9B, an insulating film 4021 is further provided. An insulating film 4023 is an insulating film serving as a base film.

The transistor described in Embodiment 5, 6, or 7 can be applied to the transistor 4010 and the transistor 4011. In this embodiment, an example in which a transistor having a structure similar to that of the transistor 426 described in Embodiment 7 is applied is described. The transistors 4010 and 4011 are bottom-gate transistors.

In each of the transistors 4010 and 4011 having a structure similar to the transistor 426 described in Embodiment 7, the oxide semiconductor film is deposited by a sputtering method using a sputtering target of In—Ga—Zn-based oxide which is polycrystalline and has a density of 6.3 g/cm$^3$ and an atomic ratio where In:Ga:Zn=1:1:1. The back pressure of a deposition chamber is set to be lower than or equal to $5\times10^{-3}$ Pa, preferably $6\times10^{-5}$ Pa. Pressure in deposition is set to be lower than 2 Pa, preferably lower than or equal to 0.4 Pa. In the deposition chamber before or during deposition, the partial pressure of water which is measured using Q-mass is lower than or equal to $10^{-3}$ Pa, preferably lower than or equal to $10^{-4}$ Pa, more preferably lower than or equal to $10^{-5}$ Pa. The temperature of the substrate in deposition by sputtering is set to 400° C. The thusly obtained oxide semiconductor film having a film density of 6.3 g/cm$^3$ and a crystal part is used as the oxide semiconductor film.

When such a dense oxide semiconductor film is used for a channel formation region of the transistor 4011, a semiconductor device can achieve improvement in reliability.

When a dense oxide semiconductor film is used as a channel formation region of the transistor 4010 serving as a switching element of the pixel portion 4002, a plurality of transistors which are less varied in electric characteristics can be arranged in the pixel portion 4002; thus, it is possible to obtain a display device which displays an image with less unevenness.

Alternatively, a structure similar to that of the transistor 425 described in Embodiment 6 may be applied to the transistors 4010 and 4011.

A conductive layer may be further provided so as to overlap with the channel formation region in the oxide semiconductor film of the transistor 4011 for the driver circuit. By providing the conductive layer so as to overlap with the channel formation region in the oxide semiconductor film, a change in the threshold voltage of the transistor 4011 between before and after a bias-temperature stress test (BT test) can be further reduced. The potential of the conductive layer is either the same as or different from that of the gate electrode layer of the transistor 4011, and can function as a second gate electrode layer. The potential of the conductive layer may be GND or 0 V, or the conductive layer may be in a floating state.

The conductive layer also has a function of blocking an external electric field, that is, a function of preventing an external electric field (particularly, a function of preventing static electricity) from affecting the inside (circuit portion including a transistor). The blocking function of the conductive layer can prevent fluctuation in the electrical characteristics of the transistor due to an influence of an external electric field such as static electricity.

The transistor 4010 included in the pixel portion 4002 is electrically connected to a display element in a display panel. There is no particular limitation on the kind of display element as long as display can be performed; any kind of display element can be used.

An example of a liquid crystal display device using a liquid crystal element as a display element is illustrated in FIG. 9A. In FIG. 9A, a liquid crystal element 4013 which is a display element includes the first electrode layer 4030, a second electrode layer 4031, and a liquid crystal layer 4008. Insulating films 4032 and 4033 serving as alignment films are provided so that the liquid crystal layer 4008 is sandwiched therebetween. The second electrode layer 4031 is provided on the second substrate 4006 side, and the first electrode layer 4030 and the second electrode layer 4031 are stacked with the liquid crystal layer 4008 provided therebetween.

A spacer 4035 is a columnar spacer which is obtained by selective etching of an insulating film, and is provided in order to control the thickness of the liquid crystal layer 4008 (cell gap). A spherical spacer may alternatively be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase may be used for the liquid crystal layer 4008. In that case, the liquid crystal layer 4008 is in contact with the first electrode layer 4030 and the second electrode layer 4031. A blue phase is one of liquid crystal phases, which is generated just before a cholesteric phase changes into an isotropic phase while the temperature of a cholesteric liquid crystal is increased. The blue phase can be exhibited using a liquid crystal composition which is a mixture of a liquid crystal and a chiral agent. To increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, productivity of the liquid crystal display device can be improved. A transistor using an oxide semiconductor film has a possibility that the electric characteristics of the transistor may fluctuate significantly by the influence of static electricity and deviate from the designed range. Thus, it is more effective to use a liquid crystal composition exhibiting a blue phase for the liquid crystal display device including the transistor using an oxide semiconductor film.

The specific resistivity of the liquid crystal material is higher than or equal to $1\times10^9$ Ω·cm, preferably higher than or equal to $1\times10^{11}$ Ω·cm, further preferably higher than or equal to $1\times10^{12}$ Ω·cm. The specific resistivity in this specification is measured at 20° C.

The size of a storage capacitor in the liquid crystal display device is set considering the leakage current of the transistor provided in the pixel portion or the like so that charge can be held for a predetermined period. The size of the storage capacitor may be set considering the off-state current of the transistor or the like.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. This embodiment can also be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied to the display device. It is also possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be provided by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel for color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. The sizes of display regions may differ between respective dots of color elements. Embodiments of the present invention disclosed herein are not limited to the application to a display device for color display; one embodiment of the present invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. In this embodiment, an example in which an organic EL element is used as a light-emitting element is described.

To extract light from the light-emitting element, at least one of the pair of electrodes has a light-transmitting property. A transistor and the light-emitting element are formed over a substrate. The light-emitting element can have any of the following structures: a top emission structure in which light emission is extracted through a surface opposite to the substrate; a bottom emission structure in which light emission is extracted through a surface on the substrate side; and a dual emission structure in which light emission is extracted through the surface opposite to the substrate and the surface on the substrate side.

Figure 8A:
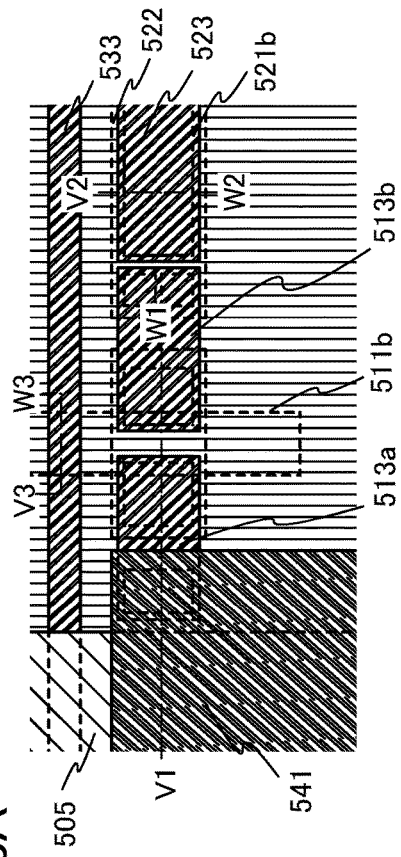
FIGS. 8A and 8B are a plan view and a cross-sectional view which illustrate one embodiment of a semiconductor device.
Figure 8B:
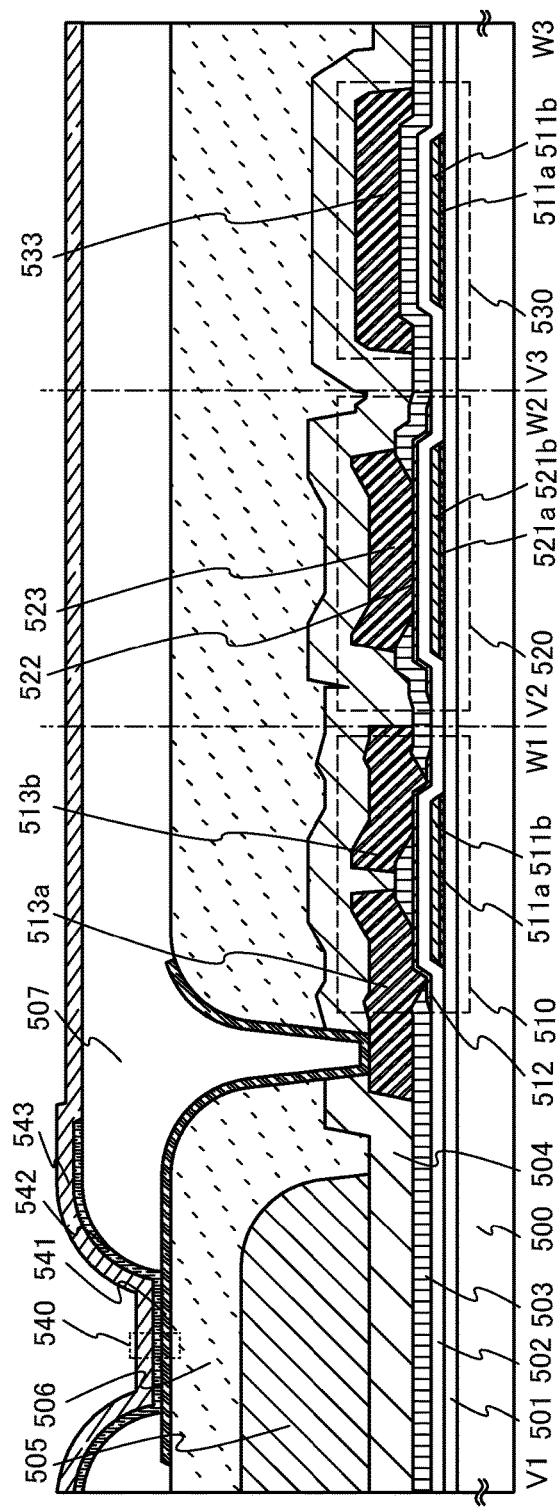

FIGS. 8A and 8B and FIG. 9B illustrate examples of a light-emitting device using a light-emitting element as a display element.

FIG. 8A is a plan view of a light-emitting device and FIG. 8B is a cross-sectional view taken along dashed-dotted lines V1-W1, V2-W2, and V3-W3 in FIG. 8A. An electroluminescent layer 542 and a second electrode layer 543 are not illustrated in the plan view in FIG. 8A.

The light-emitting device illustrated in FIGS. 8A and 8B includes, over a substrate 500 provided with an insulating film 501 functioning as a base film, a transistor 510, a capacitor 520, and an intersection 530 of wiring layers. The transistor 510 is electrically connected to a light-emitting element 540. FIGS. 8A and 8B illustrate a bottom-emission light-emitting device in which light from the light-emitting element 540 is extracted through the substrate 500.

The transistor described in Embodiment 5, 6, or 7 can be applied to the transistor 510. In this embodiment, an example in which a transistor having a structure similar to that of the transistor 424 described in Embodiment 5 is used is described. The transistor 510 is an inversed staggered transistor with a bottom-gate structure, in which an insulating layer functioning as a channel protective film is provided over an oxide semiconductor film.

The transistor 510 includes gate electrode layers 511a and 511b, a gate insulating film 502, an oxide semiconductor film 512, an insulating layer 503, and conductive layers 513a and 513b functioning as a source electrode layer and a drain electrode layer.

In the transistor 510 having a structure similar to that of the transistor 424 described in Embodiment 5, the insulating layer 503 functioning as a channel protective film is provided over the oxide semiconductor film 512 including at least a channel formation region, which overlaps with the gate electrode layers 511a and 511b, and has an opening which reaches the oxide semiconductor film 512 and whose inner wall is covered with the conductive layer 513a or 513b functioning as a source electrode layer or a drain electrode layer.

Alternatively, a structure similar to that of the transistor 425 described in Embodiment 6 may be applied to the transistor 510.

Thus, a highly reliable semiconductor device can be provided as the semiconductor device, illustrated in FIGS. 8A and 8B, which includes the transistor 510 of this embodiment using the oxide semiconductor film 512 and having stable electric characteristics. Further, such a highly reliable semiconductor device can be manufactured with a high yield, so that high productivity can be achieved.

The capacitor 520 includes conductive layers 521a and 521b, the gate insulating film 502, an oxide semiconductor film 522, and a conductive layer 523. The gate insulating film 502 and the oxide semiconductor film 522 are sandwiched between the conductive layer 523 and the conductive layers 521a and 521b, whereby the capacitor is formed.

The intersection 530 of wiring layers is an intersection of a conductive layer 533 and the gate electrode layers 511a and 511b. The conductive layer 533 and the gate electrode layers 511a and 511b intersect with each other with the gate insulating film 502 and the insulating layer 503 provided therebetween. In the structure described in this embodiment, not only the gate insulating film 502 but also the insulating layer 503 can be provided between the conductive layer 533 and the gate electrode layers 511a and 511b at the intersection 530 of wiring layers; thus, parasitic capacitance between the conductive layer 533 and the gate electrode layers 511a and 511b can be reduced.

In this embodiment, a 30-nm-thick titanium film is used as each of the gate electrode layer 511a and the conductive layer 521a, and a 200-nm-thick copper thin film is used as each of the gate electrode layer 511b and the conductive layer 521b. Thus, the gate electrode layer has a stacked-layer structure of a titanium film and a copper thin film.

The oxide semiconductor films 512 and 522 are deposited by a sputtering method using a sputtering target of In—Ga—Zn-based oxide which is polycrystalline and has a density of 6.3 g/cm$^3$ and an atomic ratio where In:Ga:Zn=1:1:1. The back pressure of a deposition chamber is set to be lower than or equal to $5 \times 10^{-3}$ Pa, preferably $6 \times 10^{-5}$ Pa. Pressure in deposition is set to be lower than 2 Pa, preferably lower than or equal to 0.4 Pa. In the deposition chamber before or during deposition, the partial pressure of water which is measured using Q-mass is lower than or equal to $10^{-3}$ Pa, preferably lower than or equal to $10^{-4}$ Pa, more preferably lower than or equal to $10^{-5}$ Pa. The temperature of the substrate in deposition by sputtering is set to 400° C. The thusly obtained oxide semiconductor film having a film density of 6.3 g/cm$^3$ and a crystal part is used for the oxide semiconductor films 512 and 522. The film thickness is set to 25 nm.

An interlayer insulating film 504 is formed over the transistor 510, the capacitor 520, and the intersection 530 of wiring layers. Over the interlayer insulating film 504, a color filter layer 505 is provided in a region overlapping with the light-emitting element 540. An insulating film 506 functioning as a planarization insulating film is provided over the interlayer insulating film 504 and the color filter layer 505.

The light-emitting element 540 having a stacked-layer structure in which a first electrode layer 541, the electroluminescent layer 542, and the second electrode layer 543 are stacked in that order is provided over the insulating film 506. The first electrode layer 541 is in contact with the conductive layer 513a in an opening formed in the insulating film 506 and the interlayer insulating film 504, which reaches the conductive layer 513a, whereby the light-emitting element 540 is electrically connected to the transistor 510. A bank 507 is provided so as to cover part of the first electrode layer 541 and the opening.

As the interlayer insulating film 504, a silicon oxynitride film having a thickness greater than or equal to 200 nm and less than or equal to 600 nm, which is formed by a plasma-enhanced CVD method can be used. Further, a photosensitive acrylic film having a thickness of 1500 nm and a photosensitive polyimide film having a thickness of 1500 nm can be used as the insulating film 506 and the bank 507, respectively.

As the color filter layer 505, for example, a chromatic light-transmitting resin can be used. As such a chromatic light-transmitting resin, a photosensitive organic resin or a nonphotosensitive organic resin can be used. A photosensitive organic resin layer is preferably used, because the number of resist masks can be reduced, leading to simplification of a process.

Chromatic colors are colors except achromatic colors such as black, gray, and white. The color filter layer is formed using a material which transmits only light of the chromatic color. As the chromatic color, red, green, blue, or the like can be used. Cyan, magenta, yellow, or the like may also be used. Meaning of "which transmits only light of the chromatic color" is that the light transmitted through the color filter layer has a peak at a wavelength of light of the chromatic color. The thickness of the color filter layer may be controlled to be optimal as appropriate in consideration of the relationship between the concentration of a coloring material to be contained and the transmittance of light. For example, the color filter layer 505 may have a thickness greater than or equal to 1500 nm and less than or equal to 2000 nm.

In the light-emitting device illustrated in FIG. 9B, a light-emitting element 4513 which is a display element is electrically connected to the transistor 4010 provided in the pixel portion 4002. A structure of the light-emitting element 4513 is not limited to the shown stacked-layer structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A bank 4510 and the bank 507 can be formed using an organic insulating material or an inorganic insulating material. It is particularly preferable that the first electrode layer 4030, 541 be formed using a photosensitive resin material to have an opening over the first electrode layer 4030, 541 such that the sidewall of the opening is a tilted surface with continuous curvature.

The electroluminescent layer 4511, 542 is formed of either a single layer or a plurality of layers stacked.

A protective film may be formed over the second electrode layer 4031, 543 and the bank 4510, 507 in order to prevent entry of oxygen, hydrogen, moisture, carbon dioxide, or the like into the light-emitting element 4513, 540. As the protective film, a silicon nitride film, a silicon nitride oxide film, a DLC film, or the like can be formed.

Further, the light-emitting element 4513, 540 may be covered with a layer containing an organic compound deposited by an evaporation method in order to prevent entry of oxygen, hydrogen, moisture, carbon dioxide, or the like into the light-emitting element 4513, 540.

In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used as the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and/or depressions on the surface so as to reduce the glare can be performed.

In FIGS. 7A to 7C, FIGS. 8A and 8B, and FIGS. 9A and 9B, a flexible substrate as well as a glass substrate can be used as any of the first substrates 4001 and 500 and the second substrate 4006. For example, a plastic substrate having a light-transmitting property or the like can be used. As the plastic, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is sandwiched between PVF films or polyester films can be used.

In this embodiment, an aluminum oxide film is used as the insulating film 4020. The insulating film 4020 can be formed by a sputtering method or a plasma-enhanced CVD method.

The aluminum oxide film provided as the insulating film 4020 over the oxide semiconductor film has a high shielding effect (blocking effect) of preventing penetration of both oxygen and impurities such as hydrogen and moisture.

Therefore, in and after the manufacturing process, the aluminum oxide film functions as a protective film for preventing entry of impurities such as hydrogen and moisture, which cause a change in characteristics, into the oxide semiconductor film and release of oxygen, which is a main component material of the oxide semiconductor, from the oxide semiconductor film.

The insulating film 4021, 506 serving as a planarization insulating film can be formed using an organic material having heat resistance, such as an acrylic-resin, polyimide-resin, or benzocyclobutene-based resin, polyamide resin, or epoxy resin. Other than such organic materials, it is also possible to use a low-dielectric constant material (low-k material), a siloxane-based resin, phosphosilicate glass (PSG), borophosphosilicate glass (BPSG), or the like. The insulating film may be formed by stacking a plurality of insulating films formed using any of these materials.

There is no particular limitation on the method of forming the insulating film 4021, 506; the following method can be used depending on the material: a sputtering method, an SOG method, spin coating, dipping, spray coating, a droplet discharge method (an inkjet method or the like), screen printing, offset printing, or the like.

The display device displays an image with light transmitted from a light source or a display element. Thus, the substrate and the thin films such as the insulating film and the conductive film provided for the pixel portion where light is transmitted have light-transmitting properties with respect to light in the visible light wavelength range.

The first electrode layer and the second electrode layer (also referred to as a pixel electrode layer, a common electrode layer, a counter electrode layer, or the like) for applying voltage to the display element is provided with light-transmitting properties or light-reflecting properties, which depends on the direction in which light is extracted, the position where the electrode layer is provided, and the pattern structure of the electrode layer.

The first electrode layer 4030, 541 and the second electrode layer 4031, 543 can be formed using a light-transmitting conductive material such as an indium oxide containing a tungsten oxide, an indium zinc oxide containing a tungsten oxide, an indium oxide containing a titanium oxide, an indium tin oxide containing a titanium oxide, an indium tin oxide (hereinafter referred to as ITO), an indium zinc oxide, an indium tin oxide to which a silicon oxide is added, or graphene.

The first electrode layer 4030, 541 and the second electrode layer 4031, 543 can be formed using one or plural kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy thereof; and a nitride thereof.

In this embodiment, since the light-emitting device illustrated in FIGS. 8A and 8B is the bottom-emission type, the first electrode layer 541 has a light-transmitting property and the second electrode layer 543 has a light-reflecting property. Accordingly, in the case of using a metal film as the first electrode layer 541, the film is preferably thin enough to keep the light-transmitting property; on the other hand, in the case of using a light-transmissive conductive film as the second electrode layer 543, a conductive film having a light-reflecting property is preferably stacked thereon.

A conductive composition containing a conductive high molecule (also referred to as a conductive polymer) can be used for the first electrode layer 4030, 541 and the second electrode layer 4031, 543. As the conductive high molecule, a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken by static electricity or the like, a protection circuit for protecting the driver circuit is preferably provided. The protection circuit is preferably formed using a nonlinear element.

As described above, by using the transistor described in Embodiment 5, 6, or 7, a semiconductor device having a variety of functions can be provided.

The structures, methods, and the like described in this embodiment can be combined as appropriate with any of the structures, methods, and the like described in the other embodiments.

[Embodiment 9]

In this embodiment, one embodiment of a semiconductor device, which is different from any of the above embodiments, will be described with reference to FIGS. 10A and 10B. Description of the same portion as or a portion having a function similar to that in the above embodiments is not repeated.

Figure 10A:
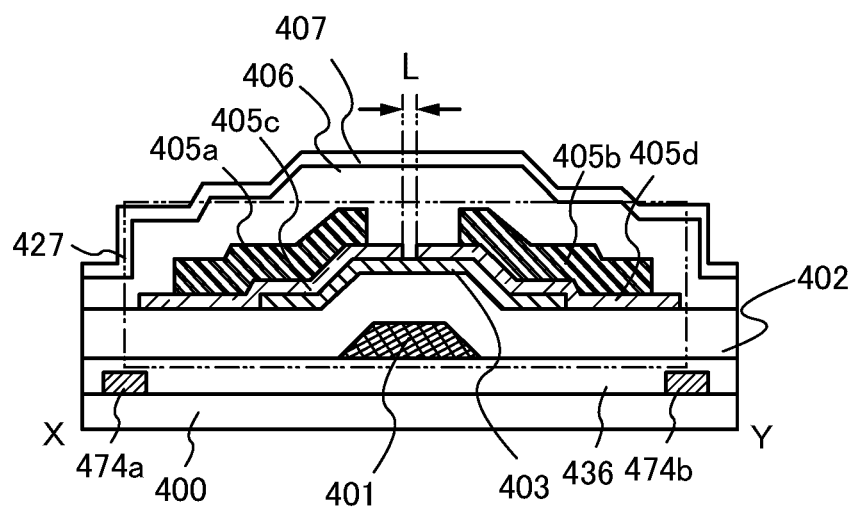
FIGS. 10A and 10B are a cross-sectional view and a top view which illustrate one embodiment of the present invention.
Figure 10B:
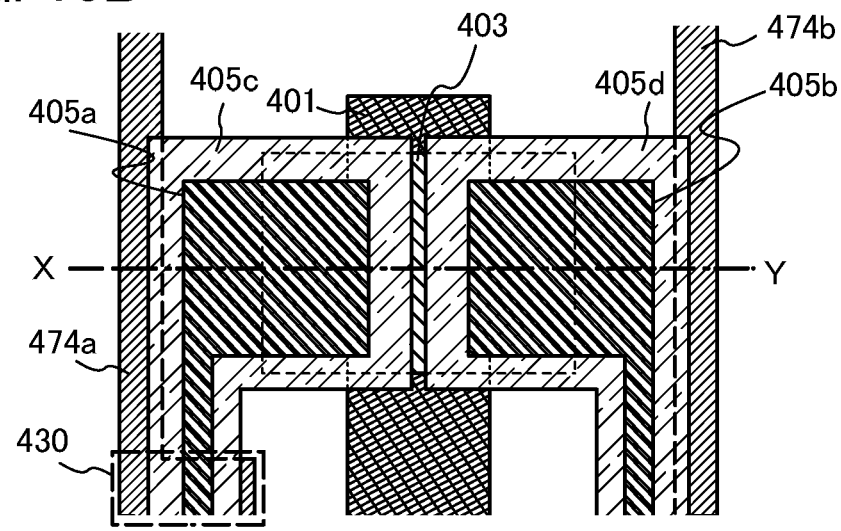

FIG. 10B is a top view of a transistor 427, and FIG. 10A is a cross-sectional view taken along X-Y in FIG. 10B.

The transistor 427 illustrated in FIGS. 10A and 10B includes a base insulating layer 436 over a substrate 400, a gate electrode layer 401 over the base insulating layer 436, a gate insulating layer 402 over the gate electrode layer 401, an oxide semiconductor film 403 over the gate electrode layer 401 with the gate insulating layer 402 provided therebetween, a drain electrode layer and a source electrode layer, and an insulating layer 406 and an insulating layer 407 over the oxide semiconductor film 403.

In the transistor 427, the drain electrode layer includes a stack of a first barrier layer 405c and a first low-resistance material layer 405a, and the source electrode layer includes a stack of a second barrier layer 405d and a second low-resistance material layer 405b.

In FIG. 10A, in the base insulating layer 436, a wiring 474a and a wiring 474b are buried, and the wiring 474a and the drain electrode layer (the first barrier layer 405c and the first low-resistance material layer 405a) form a capacitor 430.

A region where the first barrier layer 405c and the second barrier layer 405d overlap with the first low-resistance material layer 405a and the second low-resistance material layer 405b is thicker than a region where they do not.

In this embodiment, the drain electrode layer includes the first barrier layer 405c and the first low-resistance material layer 405a over the first barrier layer 405c. The first low-resistance material layer 405a is formed using aluminum or the like, and the first barrier layer 405c is formed using titanium, tungsten, molybdenum, titanium nitride, tantalum nitride, or the like. The first barrier layer 405c prevents the first low-resistance material layer 405a from being oxidized by being in contact with the oxide semiconductor film 403.

Further, in this embodiment, the source electrode layer includes the second barrier layer 405d and the second low-resistance material layer 405b over the second barrier layer 405d. The second low-resistance material layer 405b is formed using aluminum or the like, and the second barrier layer 405d is formed using titanium, tungsten, molybdenum, titanium nitride, tantalum nitride, or the like. The second barrier layer 405d prevents the second low-resistance material layer 405b from being oxidized by being in contact with the oxide semiconductor film 403.

The channel length L of the transistor 427 is determined by the gap between the first barrier layer 405c and the second barrier layer 405d, and the gap between the first barrier layer 405c and the second barrier layer 405d is determined by etching with a resist mask obtained by performing exposure to an electron beam. Precise exposure and development using an electron beam can provide a precise pattern; thus, the gap between the first barrier layer 405c and the second barrier layer 405d, i.e., the channel length L, can be less than 50 nm, e.g., 20 nm or 30 nm.

At a higher acceleration voltage, an electron beam can provide a more precise pattern. Here, in an electron beam writing apparatus capable of electron beam irradiation, the acceleration voltage is preferably in the range from 5 kV to 50 kV, for example. The current intensity is preferably in the range from $5 \times 10^{-12}$ A to $1 \times 10^{-11}$ A. The minimum beam size is preferably 2 nm or less. The minimum possible pattern line width is preferably 8 nm or less. Under the above conditions, a pattern with a width of 30 nm or less, preferably 20 nm or less, more preferably 8 nm or less, can be obtained, for example.

The use of multiple electron beams can shorten the process time per substrate. Note that the first barrier layer 405c and the second barrier layer 405d may be formed by etching with a photomask, except in the region which determines the channel length L. Note that the first barrier layer 405c and the second barrier layer 405d have a thickness of 5 nm to 30 nm, preferably 10 nm or less.

As a resist material, a siloxane-based resist, a polystyrene-based resist, or the like can be used, for example. Note that it is preferable to use a positive resist rather than a negative resist because a pattern with a small width is to be formed. For example, in the case where the width of the pattern is 30 nm, the thickness of the resist can be 30 nm.

In this embodiment, the oxide semiconductor film 403 is deposited by a sputtering method using a sputtering target of In—Ga—Zn-based oxide which is polycrystalline and has a density of 6.3 g/cm³ and an atomic ratio where In:Ga:Zn=1:1:1. The back pressure of a deposition chamber is set to be lower than or equal to $5 \times 10^{-3}$ Pa, preferably $6 \times 10^{-5}$ Pa. Pressure in deposition is set to be lower than 2 Pa, preferably lower than or equal to 0.4 Pa. In the deposition chamber before or during deposition, the partial pressure of water which is measured using Q-mass is lower than or equal to $10^{-3}$ Pa, preferably lower than or equal to $10^{-4}$ Pa, more preferably lower than or equal to $10^{-5}$ Pa. The temperature of the substrate in deposition by sputtering is set to 400° C. The thusly obtained oxide semiconductor film having a film density of 6.3 g/cm³ and a crystal part is used as the oxide semiconductor film 403.

When such a dense oxide semiconductor film is used as the oxide semiconductor film 403, a semiconductor device can achieve improvement in reliability.

In this embodiment, the insulating layer 406 preferably contains excess oxygen, and a $SiO_x$ or silicon oxynitride film containing much oxygen as a result of film formation under the conditions which are set as appropriate for a PECVD method or a sputtering method is used. In order to make the insulating layer contain much more excess oxygen, oxygen may be added as appropriate by an ion implantation method, an ion doping method, or plasma treatment.

In this embodiment, the insulating layer 407 is a blocking layer (such as an $AlO_x$ layer) for preventing oxygen from being released from the oxide semiconductor film. The aluminum oxide film ($AlO_x$) has a high shielding effect (blocking effect) of preventing penetration of both oxygen and impurities such as hydrogen and moisture. Therefore, in and after the manufacturing process, the aluminum oxide film functions as a protective film for preventing entry of an impurity such as hydrogen or moisture, which causes a change in characteristics, into the oxide semiconductor film and release of oxygen, which is a main component material of the oxide semiconductor, from the oxide semiconductor film.

The channel length of the transistor described in this embodiment is determined by the gap between the first barrier layer 405c and the second barrier layer 405d, and the gap between the first barrier layer 405c and the second barrier layer 405d is determined by etching with a resist mask obtained by exposure to an electron beam. Precise exposure and development using an electron beam can provide a precise pattern; thus, a minute transistor with a channel length L of less than 50 nm can be manufactured.

The structures, methods, and the like described in this embodiment can be combined as appropriate with any of the structures, methods, and the like described in the other embodiments.

[Embodiment 10]

In this embodiment, an example of a semiconductor device (memory device) which includes the transistor described in this specification, which can hold stored data even when not powered, and which has an unlimited number of write cycles will be described with reference to drawings.

Figure 11A:
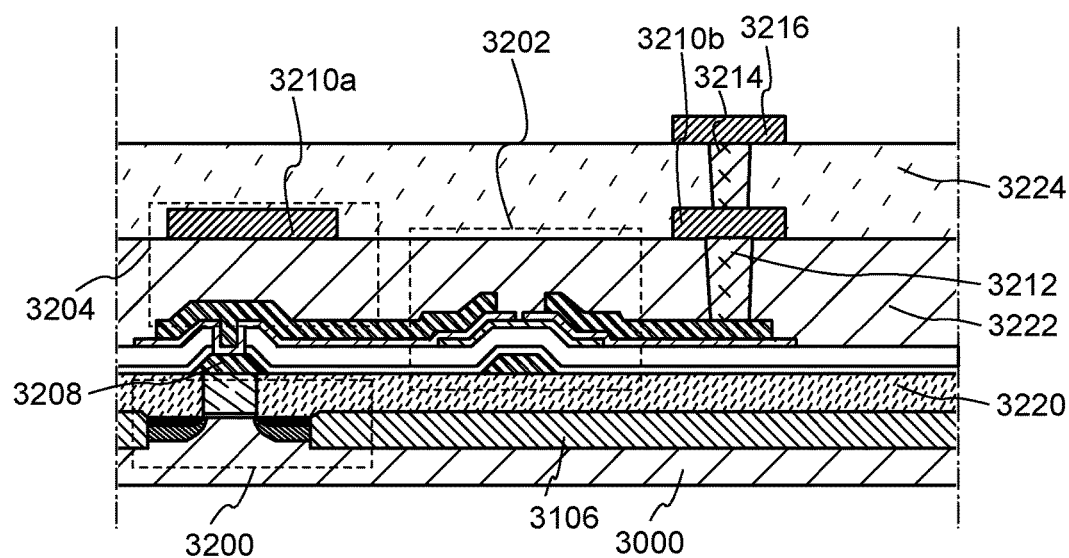
FIGS. 11A and 11B are a cross-sectional view and a circuit diagram which illustrate one embodiment of a semiconductor device.
Figure 11B:
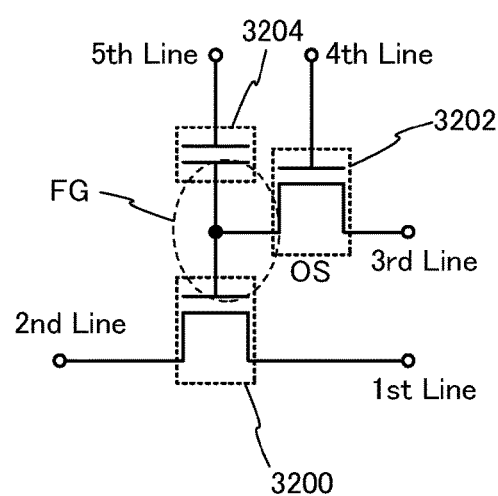

FIGS. 11A and 11B illustrate an example of a configuration of the semiconductor device. FIG. 11A is a cross-sectional view of the semiconductor device, and FIG. 11B is a circuit diagram of the semiconductor device.

The semiconductor device illustrated in FIGS. 11A and 11B includes a transistor 3200 including a first semiconductor material in a lower portion, and a transistor 3202 including a second semiconductor material in an upper portion. The structure of the transistor 427 described in Embodiment 9 is applied to the transistor 3202.

Here, the first semiconductor material and the second semiconductor material are preferably materials having different band gaps. For example, the first semiconductor material can be a semiconductor material (such as silicon) other than an oxide semiconductor, and the second semiconductor material can be an oxide semiconductor. A transistor including a material other than an oxide semiconductor can operate at high speed easily. On the other hand, a transistor including an oxide semiconductor enables charge to be held for a long time owing to its characteristics.

Although both of the above transistors are n-channel transistors in the following description, it is needless to say that p-channel transistors can be used. The specific structure of the semiconductor device, such as the material used for the semiconductor device and the structure of the semiconductor device, is not necessarily limited to those described here except for the use of the transistor described in any of the above embodiments, which is formed using an oxide semiconductor for holding data.

The transistor 3200 in FIG. 11A includes a channel formation region provided in a substrate 3000 including a semiconductor material (such as silicon), impurity regions provided such that the channel formation region is sandwiched therebetween, intermetallic compound regions provided in contact with the impurity regions, a gate insulating film provided over the channel formation region, and a gate electrode layer provided over the gate insulating film. Note that a transistor whose source electrode layer and drain electrode layer are not illustrated in a drawing may also be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" may include a source region.

Further, an element isolation insulating layer 3106 is formed on the substrate 3000 so as to surround the transistor 3200, and an insulating layer 3220 is formed so as to cover the transistor 3200.

The transistor 3200 formed using a single crystal semiconductor substrate can operate at high speed. Thus, when the transistor is used as a reading transistor, data can be read at high speed. As treatment prior to formation of the transistor 3202 and a capacitor 3204, CMP treatment is performed on the insulating layer 3220 covering the transistor 3200, whereby the insulating layer 3220 is planarized and, at the same time, an upper surface of the gate electrode layer of the transistor 3200 is exposed.

The transistor 3202 shown in FIG. 11A is a bottom-gate transistor including an oxide semiconductor in the channel formation region. Here, an oxide semiconductor film included in the transistor 3202 is preferably highly purified. By using a purified oxide semiconductor, the transistor 3202 which has extremely favorable off-state characteristics can be obtained.

Since the off-state current of the transistor 3202 is small, stored data can be held for a long time owing to such a transistor. In other words, refresh operation becomes unnecessary or the frequency of the refresh operation can be extremely lowered, which leads to a sufficient reduction in power consumption.

One of source and drain electrode layers of the transistor 3202 is electrically connected to an electrode 3208 through an opening provided in a gate insulating layer and is electrically connected to the gate electrode layer of the transistor 3200 via the electrode 3208. The electrode 3208 can be formed through a process similar to that for a gate electrode layer of the transistor 3202.

An insulating layer 3222 having a single-layer structure or a stacked-layer structure is provided over the transistor 3202. In addition, a conductive layer 3210a is provided in a region overlapping with the one of the source and drain electrode layers of the transistor 3202 with the insulating layer 3222 provided therebetween, and the one of the source and drain electrode layers of the transistor 3202, the insulating layer 3222, and the conductive layer 3210a form the capacitor 3204. That is, the one of the source and drain electrode layers of the transistor 3202 functions as one electrode of the capacitor 3204, and the conductive layer 3210a functions as the other electrode of the capacitor 3204. Note that in the case where no capacitor is needed, a structure in which the capacitor 3204 is not provided is also possible. Alternatively, the capacitor 3204 may be separately provided above the transistor 3202.

An insulating layer 3224 is provided over the capacitor 3204. In addition, a wiring 3216 for connecting the transistor 3202 to another transistor is provided over the insulating layer 3224. The wiring 3216 is electrically connected to the other of the source and drain electrode layers of the transistor 3202 through an electrode 3214 provided in an opening formed in the insulating layer 3224, a conductive layer 3210b formed using the same layer as the conductive layer 3210a, and an electrode 3212 provided in an opening formed in the insulating layer 3222.

In FIGS. 11A and 11B, the transistors 3200 and 3202 are provided so as to at least partly overlap each other, and the source region or the drain region of the transistor 3200 is preferably provided to partly overlap with the oxide semiconductor film included in the transistor 3202. In addition, the transistor 3202 and the capacitor 3204 are provided so as to overlap with at least part of the transistor 3200. For example, the conductive layer 3210a of the capacitor 3204 is provided so as to at least partly overlap with the gate electrode layer of the transistor 3200. When such a planar layout is employed, the area occupied by the semiconductor device can be reduced; thus, the degree of integration can be increased.

Next, an example of a circuit configuration corresponding to FIG. 11A is illustrated in FIG. 11B.

In FIG. 11B, a first wiring (1st Line) is electrically connected to a source electrode layer of the transistor 3200. A second wiring (2nd Line) is electrically connected to a drain electrode layer of the transistor 3200. A third wiring (3rd Line) is electrically connected to one of the source and drain electrode layers of the transistor 3202, and a fourth wiring (4th Line) is electrically connected to the gate electrode layer of the transistor 3202. The gate electrode layer of the transistor 3200 and the one of the source and drain electrode layers of the transistor 3202 are electrically connected to one electrode of the capacitor 3204. A fifth wiring (5th Line) is electrically connected to the other electrode of the capacitor 3204.

The semiconductor device in FIG. 11B utilizes a characteristic in which the potential of the gate electrode layer of the transistor 3200 can be held, and thus enables data writing, holding, and reading as follows.

Writing and holding of data will be described. First, the potential of the fourth wiring is set to a potential at which the transistor 3202 is turned on, so that the transistor 3202 is turned on. Accordingly, the potential of the third wiring is supplied to the gate electrode layer of the transistor 3200 and to the capacitor 3204. That is, predetermined charge is supplied to the gate electrode layer of the transistor 3200 (writing). Here, one of two kinds of charges providing different potential levels (hereinafter referred to as a low-level charge and a high-level charge) is supplied. After that, the potential of the fourth wiring is set to a potential at which the transistor 3202 is turned off, so that the transistor 3202 is turned off. Thus, the charge supplied to the gate electrode layer of the transistor 3200 is held (holding).

Since the off-state current of the transistor 3202 is significantly small, the charge of the gate electrode layer of the transistor 3200 is held for a long time.

Next, reading of data will be described. By supplying an appropriate potential (a reading potential) to the fifth wiring while supplying a predetermined potential (a constant potential) to the first wiring, the potential of the second wiring varies depending on the amount of charge held at the gate electrode layer of the transistor 3200. This is because in general, when the transistor 3200 is an n-channel transistor, an apparent threshold voltage $V_{th\_H}$ in the case where the high-level charge is given to the gate electrode layer of the transistor 3200 is lower than an apparent threshold voltage $V_{th\_L}$ in the case where the low-level charge is given to the gate electrode layer of the transistor 3200. Here, an apparent threshold voltage refers to the potential of the fifth wiring which is needed to turn on the transistor 3200. Thus, the potential of the fifth wiring is set to a potential $V_0$ which is between $V_{th\_H}$ and $V_{th\_L}$, whereby charge supplied to the gate electrode layer of the transistor 3200 can be determined. For example, in the case where the high-level charge is supplied in writing, when the potential of the fifth wiring is $V_0$ (>$V_{th\_H}$), the transistor 3200 is turned on. In the case where the low-level charge is supplied in writing, even when the potential of the fifth wiring is $V_0$ (<$V_{th\_L}$), the transistor 3200 remains off. Therefore, the data held can be read by measuring the potential of the second wiring.

Note that in the case where memory cells are arrayed, it is necessary that data of only a desired memory cell can be read. In that case, the fifth wirings of memory cells from which data is not read may be supplied with a potential at which the transistor 3200 is turned off regardless of the state of the gate electrode layer, that is, a potential lower than $V_{th\_H}$. Alternatively, the fifth wirings may be supplied with a potential at which the transistor 3200 is turned on regardless of the state of the gate electrode layer, that is, a potential higher than $V_{th\_L}$.

When including a transistor having a channel formation region formed using an oxide semiconductor and having extremely small off-state current, the semiconductor device described in this embodiment can store data for an extremely long period. In other words, refresh operation becomes unnecessary or the frequency of the refresh operation can be extremely lowered, which leads to a sufficient reduction in power consumption. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. That is, the semiconductor device according to the disclosed invention does not have a limitation on the number of times data can be rewritten, which is a problem of a conventional nonvolatile memory, and the reliability thereof is drastically improved. Furthermore, since data are written by turning on or off the transistors, high-speed operation can be easily achieved.

As described above, a miniaturized and highly integrated semiconductor device having favorable electrical characteristics and a method for manufacturing the semiconductor device can be provided.

The configuration, method, and the like described above in this embodiment can be combined as appropriate with any of the configurations, methods, and the like described in the other embodiments.

[Embodiment 11]

In this embodiment, one embodiment of a structure of a memory device which is different from that in Embodiment 10 will be described.

Figure 12:
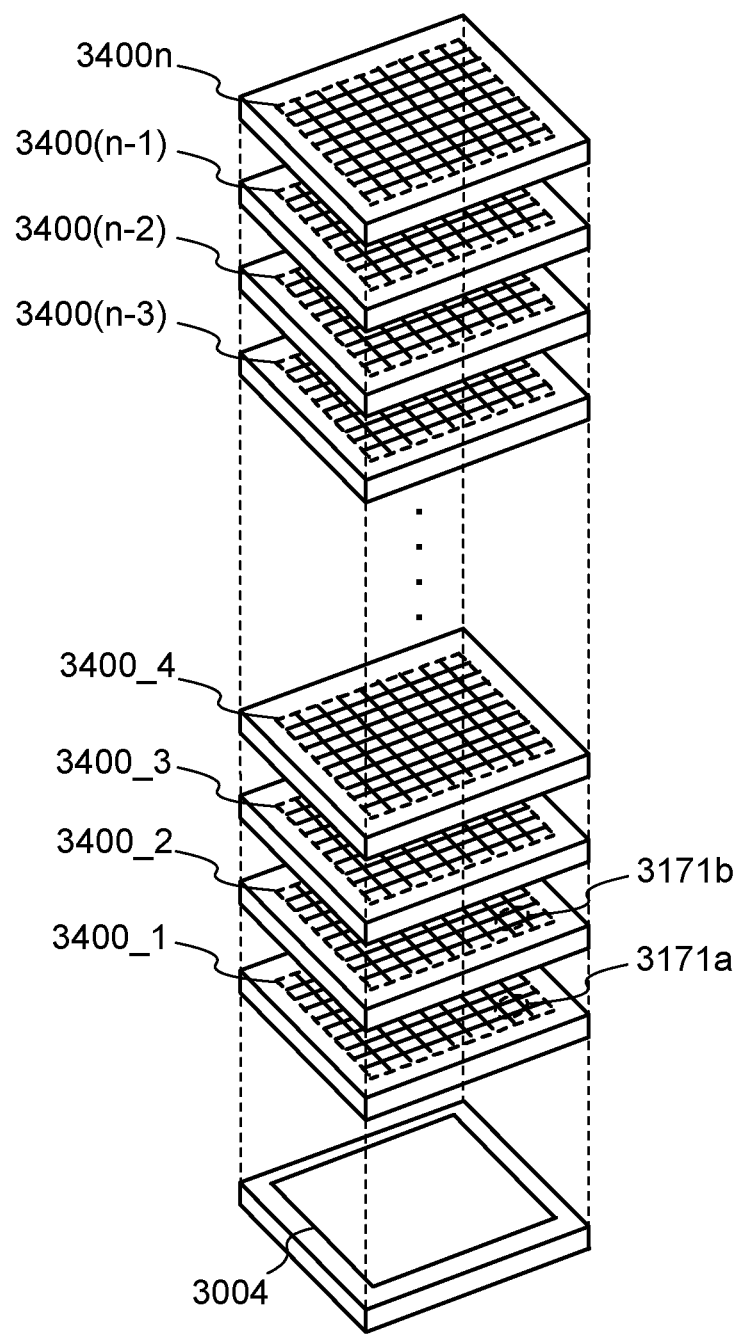
FIG. 12 is a perspective view illustrating one embodiment of a semiconductor device.

FIG. 12 is a perspective view of a memory device. The memory device illustrated in FIG. 12 includes a plurality of layers of memory cell arrays (memory cell arrays 3400_1 to 3400n (n is an integer greater than or equal to 2)) each including a plurality of memory cells as memory circuits in the upper portion, and a logic circuit 3004 in the lower portion which is necessary for operating the memory cell arrays.

Figure 13:
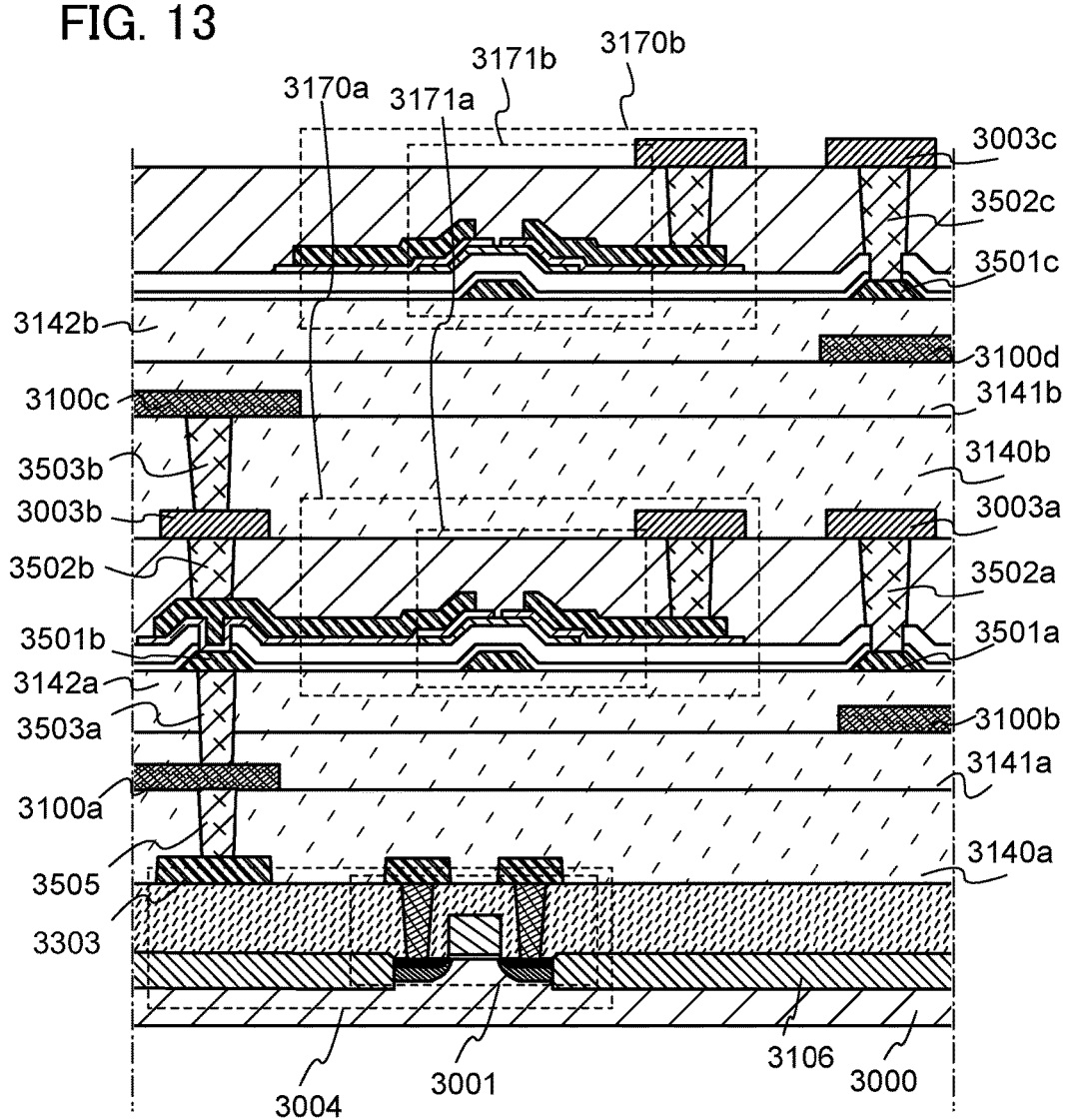
FIG. 13 is a cross-sectional view illustrating one embodiment of a semiconductor device.

FIG. 13 is a partial enlarged view of the memory device illustrated in FIG. 12. FIG. 13 illustrates the logic circuit 3004, the memory cell array 3400_1, and the memory cell array 3400_2, and illustrates a memory cell 3170a and a memory cell 3170b as typical examples among the plurality of memory cells included in the memory cell array 3400_1 and the memory cell array 3400_2. The memory cell 3170a and the memory cell 3170b can have a configuration similar to the circuit configuration described in the above embodiment, for example.

Note that a transistor 3171a included in the memory cell 3170a is illustrated as a typical example. A transistor 3171b included in the memory cell 3170b is illustrated as a typical example. The transistors 3171a and 3171b are transistors in each of which an oxide semiconductor layer is used for a channel formation region. The structure of the transistor in which the oxide semiconductor layer is used for the channel formation region is the same as the structure described in any of the other embodiments, and thus the description of the structure is omitted. In this embodiment, description is made taking as an example the case of using a transistor having a structure similar to that of the transistor 427 of Embodiment 9.

An electrode 3501a which is formed using the same layer as a gate electrode layer of the transistor 3171a is electrically connected to an electrode 3003a via an electrode 3502a. An electrode 3501c which is formed using the same layer as a gate electrode layer of the transistor 3171b is electrically connected to an electrode 3003c via an electrode 3502c.

The logic circuit 3004 includes a transistor 3001 in which a semiconductor material other than an oxide semiconductor is used for a channel formation region. The transistor 3001 can be a transistor obtained in such a manner that an element isolation insulating layer 3106 is provided on a substrate 3000 including a semiconductor material (e.g., silicon) and a region serving as the channel formation region is formed in a region surrounded by the element isolation insulating layer 3106. Note that the transistor 3001 may be a transistor obtained in such a manner that the channel formation region is formed in a semiconductor film such as a silicon film formed on an insulating surface or in a silicon film of an SOI substrate. A known structure can be used as the structure of the transistor 3001 and thus the description is omitted.

A wiring 3100a and a wiring 3100b are formed between layers in which the transistor 3171a is formed and layers in which the transistor 3001 is formed. An insulating film 3140a is provided between the wiring 3100a and the layers in which the transistor 3001 is formed. An insulating film 3141a is provided between the wiring 3100a and the wiring 3100b. An insulating film 3142a is provided between the wiring 3100b and the layers in which the transistor 3171a is formed.

Similarly, a wiring 3100c and a wiring 3100d are formed between the layers in which the transistor 3171b is formed and the layers in which the transistor 3171a is formed. An insulating film 3140b is provided between the wiring 3100c and the layers in which the transistor 3171a is formed. An insulating film 3141b is provided between the wiring 3100c and the wiring 3100d. An insulating film 3142b is provided between the wiring 3100d and the layers in which the transistor 3171b is formed.

The insulating films 3140a, 3141a, 3142a, 3140b, 3141b, and 3142b each function as an interlayer insulating film whose surface can be planarized.

The wirings 3100a, 3100b, 3100c, and 3100d enable electrical connection between the memory cells, electrical connection between the logic circuit 3004 and the memory cell array, and the like.

An electrode 3303 included in the logic circuit 3004 can be electrically connected to a circuit provided in the upper portion.

For example, as illustrated in FIG. 13, the electrode 3303 can be electrically connected to the wiring 3100a via an electrode 3505. The wiring 3100a can be electrically connected to an electrode 3501b which is formed using the same layer as the gate electrode layer of the transistor 3171a via an electrode 3503a. In this manner, the wiring 3100a and the electrode 3303 can be electrically connected to the source or the drain of the transistor 3171a. The electrode 3501b can be electrically connected to an electrode 3003b via the source or the drain of the transistor 3171a and an electrode 3502b. The electrode 3003b can be electrically connected to the wiring 3100c via an electrode 3503b.

FIG. 13 illustrates an example in which the electrode 3303 and the transistor 3171a are electrically connected to each other via the wiring 3100a; however, one embodiment of the disclosed invention is not limited thereto. The electrode 3303 may be electrically connected to the transistor 3171a via the wiring 3100b, via both the wiring 3100a and the wiring 3100b, or via another electrode without using the wiring 3100a nor the wiring 3100b.

FIG. 13 illustrates the structure where two wiring layers, i.e., a wiring layer in which the wiring 3100a is formed and a wiring layer in which the wiring 3100b is formed are provided between the layers in which the transistor 3171a is formed and the layers in which the transistor 3001 is formed; however, the number of wiring layers provided therebetween is not limited to two. One wiring layer or three or more wiring layers may be provided between the layers in which the transistor 3171a is formed and the layers in which the transistor 3001 is formed.

FIG. 13 illustrates the structure where two wiring layers, i.e., a wiring layer in which the wiring 3100c is formed and a wiring layer in which the wiring 3100d is formed are provided between the layers in which the transistor 3171b is formed and the layers in which the transistor 3171a is formed; however, the number of wiring layers provided therebetween is not limited to two. One wiring layer or three or more wiring layers may be provided between the layers in which the transistor 3171b is formed and the layers in which the transistor 3171a is formed.

The configuration, method, and the like described above in this embodiment can be combined as appropriate with any of the configurations, methods, and the like described in the other embodiments.

[Embodiment 12]

Figure 14A:
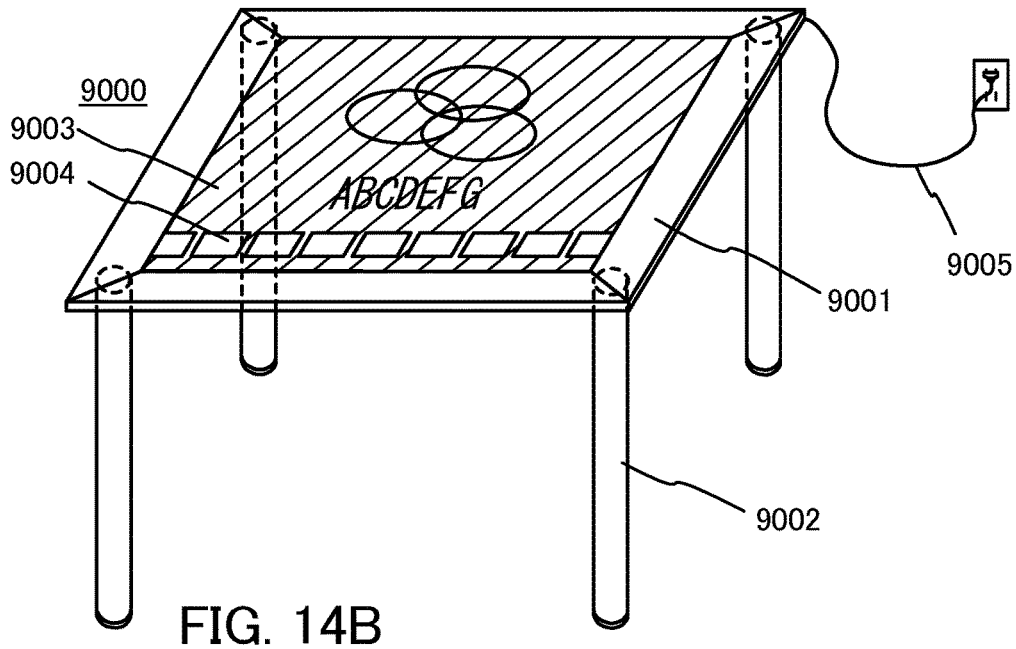
FIGS. 14A to 14C each illustrate an electronic device.
Figure 14B:
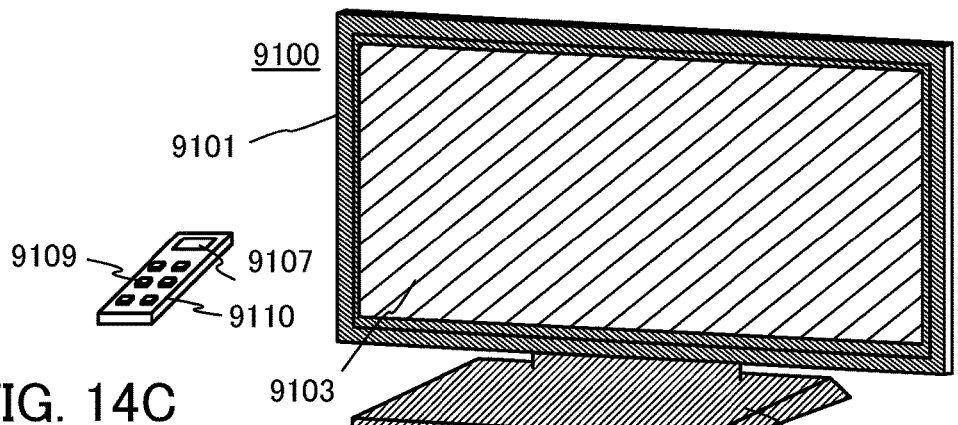
Figure 14C:
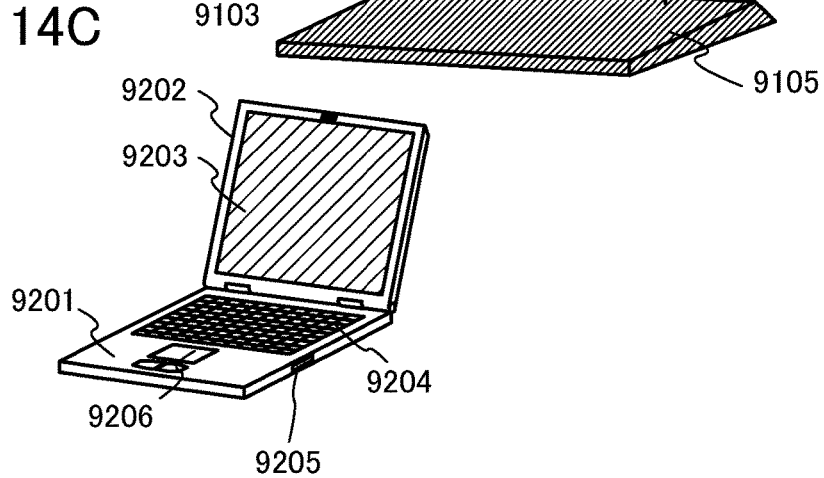

A semiconductor device disclosed in this specification can be applied to a variety of electronic devices (including game machines). Examples of electronic devices include a television device (also referred to as a television or a television receiver), a monitor of a computer or the like, a camera such as a digital camera or a digital video camera, a digital photo frame, a mobile phone, a portable game machine, a portable information terminal, an audio reproducing device, a game machine (such as a pachinko machine or a slot machine), and a game console, and the like. FIGS. 14A to 14C illustrate a specific example of an electronic device.

FIG. 14A illustrates a table 9000 having a display portion. In the table 9000, a display portion 9003 is incorporated in a housing 9001 and an image can be displayed on the display portion 9003. The housing 9001 is supported by four leg portions 9002. Further, a power cord 9005 for supplying power is provided for the housing 9001.

The semiconductor device described in any of Embodiments 1 to 8 can be used for the display portion 9003, whereby the electronic device can be provided with high reliability.

The display portion 9003 has a touch-input function. A user can touch displayed buttons 9004 which are displayed on the display portion 9003 of the table 9000 with his/her finger or the like, to carry out screen operation or input information. Further, when the table may be made to communicate with home appliances or control the home appliances, the table 9000 may function as a control device which controls the home appliances by the screen operation. For example, the semiconductor device having an image sensor can provide the display portion 9003 with a touch input function.

Further, the screen of the display portion 9003 can be placed perpendicular to a floor with a hinge provided for the housing 9001; thus, the table 9000 can also be used as a television device. Although when a television device having a large screen is set in a small room, an open space is reduced accordingly, a display portion incorporated in a table enables a space in the room to be efficiently used.

FIG. 14B illustrates a television set 9100. In the television set 9100, a display portion 9103 is incorporated in a housing 9101 and an image can be displayed on the display portion 9103. The housing 9101 is supported by a stand 9105 in the drawing.

The television set 9100 can be operated with an operation switch provided for the housing 9101 or a separate remote controller 9110. Channels and volume can be controlled with an operation key 9109 provided for the remote controller 9110 so that an image displayed on the display portion 9103 can be controlled. The remote controller 9110 may be provided with a display portion 9107 for displaying data output from the remote controller 9110.

The television set 9100 illustrated in FIG. 14B is provided with a receiver, a modem, and the like. With the receiver, the television set 9100 can receive general TV broadcasts. Further, the television set 9100 can be connected to a communication network with or without wires via the modem, enabling one-way (from sender to receiver) or two-way (between sender and receiver or between receivers) data communication.

The semiconductor device described in any of Embodiments 1 to 8 can be used for the display portions 9103 and 9107, whereby the television set and the remote controller can be provided with high reliability.

FIG. 14C illustrates a computer which includes a main body 9201, a bezel 9202, a display portion 9203, a keyboard 9204, an external connection port 9205, a pointing device 9206, and the like. The computer includes a semiconductor device manufactured according to one embodiment of the present invention for the display portion 9203. The semiconductor device described in the above embodiment can be used, whereby the computer can be provided with high reliability.

Figure 15A:
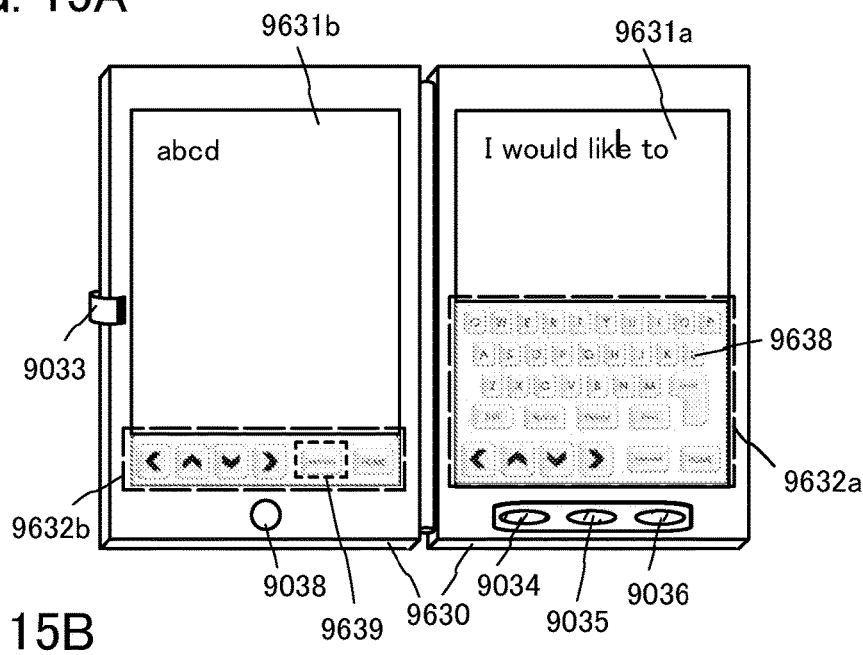
FIGS. 15A to 15C each illustrate an electronic device.
Figure 15B:
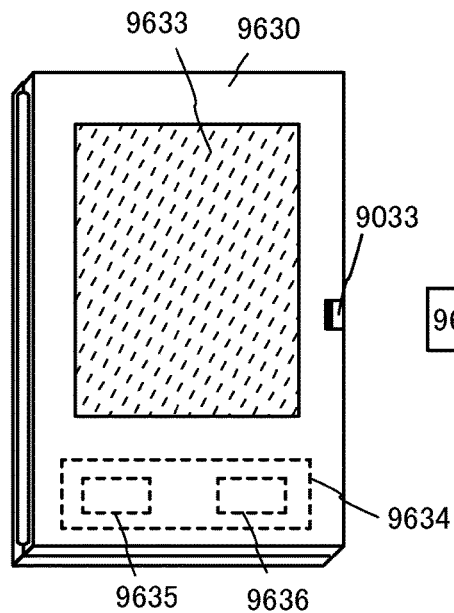

FIGS. 15A and 15B illustrate a tablet terminal that can be folded. FIG. 15A illustrates the tablet terminal which is open. The tablet terminal includes a housing 9630, a display portion 9631a, a display portion 9631b, a switch 9034 for switching display modes, a power switch 9035, a switch 9036 for switching to power-saving mode, a fastener 9033, and an operation switch 9038.

In such a portable device illustrated in FIGS. 15A and 15B, an SRAM or a DRAM is used as a memory element for temporarily storing image data. For example, the semiconductor device described in Embodiment 9, Embodiment 10, or Embodiment 11 can be used as a memory element. The semiconductor device described in the above embodiment employed for the memory element enables writing and reading of data to be performed at high speed, enables data to be retained for a long time, and enables power consumption to be sufficiently reduced.

The semiconductor device described in any of Embodiments 1 to 8 can be used for the display portion 9631a and the display portion 9631b, whereby the tablet terminal can be provided with high reliability.

A touch panel region 9632a can be provided in a part of the display portion 9631a, in which data can be input by touching displayed operation keys 9638. In the drawing, as an example, one half of the area of the display portion 9631a has only a display function and the other half of the area has a touch panel function; however, embodiments of the present invention are not limited to this structure. All the area of the display portion 9631a may have a touch panel function. For example, all the area of the display portion 9631a can display keyboard buttons and serve as a touch panel while the display portion 9631b can be used as a display screen.

Like the display portion 9631a, a touch panel region 9632b can be formed in part of the display portion 9631b. Further, by touching a button 9639 for switching to keyboard display displayed on the touch panel, keyboard buttons can be displayed on the display portion 9631b.

Further, touch input can be performed concurrently on the touch panel regions 9632a and 9632b.

The switch 9034 for switching display modes allows switching between a landscape mode and a portrait mode, color display and black-and-white display, and the like. With the switch 9036 for switching to power-saving mode, the luminance of display can be optimized in accordance with the content of external light at the time when the tablet is in use, which is detected with an optical sensor incorporated in the tablet terminal. The tablet terminal may include another detection device such as a sensor for detecting inclination (e.g., a gyroscope or an acceleration sensor) in addition to the optical sensor.

Although the display portion 9631a and the display portion 9631b have the same display area in FIG. 15A, embodiments of the present invention are not limited to this structure. The display portion 9631a and the display portion 9631b may have different areas or different display quality. For example, one of them may be a display panel that can display higher-definition images than the other.

FIG. 15B illustrates the tablet terminal closed, which includes the housing 9630, a solar cell 9633, a charge/discharge control circuit 9634, a battery 9635, and a DCDC converter 9636. FIG. 15B shows an example in which the charge and discharge control circuit 9634 includes the battery 9635 and the DCDC converter 9636.

Since the tablet terminal can be folded in two, the housing 9630 can be closed when the tablet terminal is not in use. Thus, the display portions 9631a and 9631b can be protected, thereby providing the tablet terminal with high endurance and high reliability for long-term use.

The tablet terminal illustrated in FIGS. 15A and 15B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar battery 9633, which is attached on the surface of the tablet terminal, supplies electric power to a touch panel, a display portion, an image signal processor, and the like. Note that the solar battery 9633 can be provided on one or both surfaces of the housing 9630 and the battery 9635 can be charged efficiently. A lithium ion battery can be used as the battery 9635, leading to an advantage of downsizing or the like.

Figure 15C:
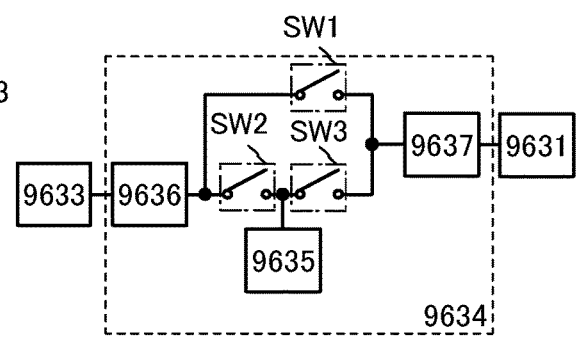

The structure and the operation of the charge/discharge control circuit 9634 illustrated in FIG. 15B are described with reference to a block diagram of FIG. 15C. The solar cell 9633, the battery 9635, the DCDC converter 9636, a converter 9637, switches SW1 to SW3, and the display portion 9631 are illustrated in FIG. 15C, and the battery 9635, the DCDC converter 9636, the converter 9637, and the switches SW1 to SW3 correspond to the charge/discharge control circuit 9634 illustrated in FIG. 15B.

First, an example of operation in the case where power is generated by the solar battery 9633 using external light is described. The voltage of power generated by the solar battery is raised or lowered by the DCDC converter 9636 to a voltage needed for charging the battery 9635. Further, when the display portion 9631 is operated with the power from the solar battery 9633, the switch SW1 is turned on and the voltage of the power is raised or lowered by the converter 9637 to a voltage needed for operating the display portion 9631. When display on the display portion 9631 is not performed, the switch SW1 may be turned off and the switch SW2 may be turned on so that the battery 9635 is charged.

Here, the solar battery 9633 is described as an example of a power generation means; however, there is no particular limitation on a way of charging the battery 9635, and the battery 9635 may be charged with any other power generation means such as a piezoelectric element or a thermoelectric conversion element (Peltier element). For example, the battery 9635 may be charged with a non-contact power transmission module which is capable of charging by transmitting and receiving power by wireless (without contact), or another charging means may be used in combination.

The structures, methods, and the like described in this embodiment can be combined as appropriate with any of the structures, methods, and the like described in the other embodiments.

REFERENCE NUMERALS

400: substrate, 402: gate insulating layer, 403: oxide semiconductor film, 403a: low-resistance region, 403b: low-resistance region, 403c: channel formation region, 405a: source electrode layer, 405b: drain electrode layer, 406: insulating layer, 407: insulating layer, 412a: sidewall insulating layer, 412b: sidewall insulating layer, 413: insulating layer, 414: insulating layer, 415: insulating layer, 420: transistor, 421: transistor, 422: transistor, 423: transistor, 424: transistor, 425: transistor, 426: transistor, 427: transistor, 435a: opening, 435b: opening, 436: base insulating layer, 465a: source wiring layer, 465b: drain wiring layer, 3000: substrate, 3001: transistor, 3003a: electrode, 3003b: electrode, 3003c: electrode, 3004: logic circuit, 3100a: wiring, 3100b: wiring, 3100c: wiring, 3100d: wiring, 3106: element isolation insulating layer, 3140a: insulating film, 3140b: insulating film, 3141a: insulating film, 3141b: insulating film, 3142a: insulating film, 3142b: insulating film, 3170a: memory cell, 3170b: memory cell, 3171a: transistor, 3171b: transistor, 3200: transistor, 3202: transistor, 3204: capacitor, 3208: electrode, 3210a: conductive layer, 3210b:

conductive layer, 3212: electrode, 3214: electrode, 3216: wiring, 3220: insulating layer, 3222: insulating layer, 3224: insulating layer, 3303: electrode, 3400a: memory cell array, 3400b: memory cell array, 3400n: memory cell array, 3501a: electrode, 3501b: electrode, 3501c: electrode, 3502a: electrode, 3502b: electrode, 3502c: electrode, 3503a: electrode, 3503b: electrode, 3505: electrode, 9033: fastener, 9034: switch, 9035: power switch, 9036: switch, 9038: operation switch, 9630: housing, 9631: display portion, 9631a: display portion, 9631b: display portion, 9632a: region, 9632b: region, 9633: solar battery, 9634: charge/discharge control circuit, 9635: battery, 9636: DCDC converter, 9637: converter, 9638: operation key, 9639: button.

This application is based on Japanese Patent Application serial no. 2011-274919 filed with Japan Patent Office on Dec. 15, 2011, the entire contents of which are hereby incorporated by reference.

The invention claimed is:

1. A semiconductor device comprising:
a non-single-crystal oxide semiconductor film as a channel formation region;
a source electrode and a drain electrode;
a gate insulating layer over the non-single-crystal oxide semiconductor film, the source electrode, and the drain electrode; and
a gate electrode layer over the gate insulating layer,
wherein the non-single-crystal oxide semiconductor film comprises at least indium and gallium,
wherein each of the source electrode and the drain electrode consists essentially of any one of molybdenum, titanium, tantalum, tungsten, copper, chromium, neodymium, and scandium,
wherein a concentration of chlorine in the non-single-crystal oxide semiconductor film is lower than or equal to $2 \times 10^{18}$ atoms/cm$^3$,
wherein the non-single-crystal oxide semiconductor film has a density of higher than 6.0 g/cm$^3$, and
wherein a top surface of the non-single-crystal oxide semiconductor film is coplanar with a top surface of the source electrode and a top surface of the drain electrode.

2. The semiconductor device according to claim 1,
wherein the density is measured by X-ray reflectivity or Rutherford backscattering spectrometry.

3. The semiconductor device according to claim 1,
wherein the non-single-crystal oxide semiconductor film comprises a crystal part.

4. The semiconductor device according to claim 3,
wherein, in the crystal part, a c-axis is aligned in a direction parallel to a normal vector of a surface where the non-single-crystal oxide semiconductor film is formed or a normal vector of a surface of the non-single-crystal oxide semiconductor film.

5. The semiconductor device according to claim 1,
wherein the non-single-crystal oxide semiconductor film comprises at least indium, gallium, and zinc.

6. The semiconductor device according to claim 1,
wherein a concentration of copper in the non-single-crystal oxide semiconductor film is lower than or equal to $1 \times 10^{18}$ atoms/cm$^3$.

7. The semiconductor device according to claim 1,
wherein a concentration of aluminum in the non-single-crystal oxide semiconductor film is lower than or equal to $1 \times 10^{18}$ atoms/cm$^3$.

8. The semiconductor device according to claim 1,
wherein the gate insulating layer contains excess oxygen,
wherein a concentration of hydrogen in the gate insulating layer is lower than or equal to $7.2 \times 10^{20}$ atoms/cm$^3$, and
wherein a concentration of hydrogen in the non-single-crystal oxide semiconductor film is lower than or equal to $5 \times 10^{19}$ atoms/cm$^3$.

9. The semiconductor device according to claim 1, further comprising sidewall insulating layers in contact with side surfaces of the gate electrode layer,
wherein the sidewall insulating layers are over and in contact with the gate insulating layer.

10. A semiconductor device comprising:
an oxide semiconductor film comprising:
a first region; and
a pair of second regions, the first region located between the pair of second regions;
a source electrode and a drain electrode;
a gate insulating layer over the oxide semiconductor film, the source electrode, and the drain electrode; and
a gate electrode layer over the gate insulating layer,
wherein the oxide semiconductor film comprises at least indium, gallium, and zinc,
wherein each of the source electrode and the drain electrode consists essentially of any one of molybdenum, titanium, tantalum, tungsten, copper, chromium, neodymium, and scandium,
wherein the first region comprises a non-single-crystal oxide semiconductor film as a channel formation region,
wherein a resistivity of the pair of second regions is lower than a resistivity of the first region,
wherein a concentration of chlorine in the non-single-crystal oxide semiconductor film is lower than or equal to $2 \times 10^{18}$ atoms/cm$^3$,
wherein the non-single-crystal oxide semiconductor film has a density of higher than 6.0 g/cm$^3$, and
wherein a top surface of the non-single-crystal oxide semiconductor film is coplanar with a top surface of the source electrode and a top surface of the drain electrode.

11. The semiconductor device according to claim 10,
wherein the density is measured by X-ray reflectivity or Rutherford backscattering spectrometry.

12. The semiconductor device according to claim 10,
wherein the non-single-crystal oxide semiconductor film comprises a crystal part.

13. The semiconductor device according to claim 12,
wherein, in the crystal part, a c-axis is aligned in a direction parallel to a normal vector of a surface where the non-single-crystal oxide semiconductor film is formed or a normal vector of a surface of the non-single-crystal oxide semiconductor film.

14. The semiconductor device according to claim 10,
wherein the oxide semiconductor film comprises at least indium and gallium.

15. The semiconductor device according to claim 10,
wherein a concentration of copper in the oxide semiconductor film is lower than or equal to $1 \times 10^{18}$ atoms/cm$^3$.

16. The semiconductor device according to claim 10,
wherein a concentration of aluminum in the oxide semiconductor film is lower than or equal to $1 \times 10^{18}$ atoms/cm$^3$.

17. The semiconductor device according to claim 10,
wherein the gate insulating layer contains excess oxygen,
wherein a concentration of hydrogen in the gate insulating layer is lower than or equal to $7.2 \times 10^{20}$ atoms/cm$^3$, and
wherein a concentration of hydrogen in the oxide semiconductor film is lower than or equal to $5 \times 10^{19}$ atoms/cm$^3$.

18. The semiconductor device according to claim 10, further comprising sidewall insulating layers in contact with side surfaces of the gate electrode layer,
   wherein the sidewall insulating layers are over and in contact with the gate insulating layer.

* * * * *